United States Patent
Hsu et al.

(10) Patent No.: US 12,476,203 B2
(45) Date of Patent: Nov. 18, 2025

(54) STIFFENER STRUCTURE WITH BEVELED SIDEWALL FOR FOOTPRINT REDUCTION AND METHODS FOR FORMING THE SAME

(71) Applicant: Taiwan Semiconductor Manufacturing Company Limited, Hsinchu (TW)

(72) Inventors: Chia-Kuei Hsu, Hsinchu (TW); Ming-Chih Yew, Hsinchu (TW); Li-Ling Liao, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 587 days.

(21) Appl. No.: 17/837,160

(22) Filed: Jun. 10, 2022

(65) Prior Publication Data
US 2023/0402404 A1     Dec. 14, 2023

(51) Int. Cl.
| | |
|---|---|
| *H01L 23/00* | (2006.01) |
| *H01L 21/48* | (2006.01) |
| *H01L 21/56* | (2006.01) |
| *H01L 21/683* | (2006.01) |
| *H01L 23/16* | (2006.01) |
| *H01L 23/31* | (2006.01) |
| *H01L 23/498* | (2006.01) |

(Continued)

(52) U.S. Cl.
CPC ...... *H01L 23/562* (2013.01); *H01L 23/49811* (2013.01); *H01L 23/50* (2013.01); *H01L 24/20* (2013.01); *H01L 24/32* (2013.01); *H01L 25/105* (2013.01); *H01L 2224/2101* (2013.01); *H01L 2224/32225* (2013.01); *H01L 2924/35* (2013.01)

(58) Field of Classification Search
CPC ....... H01L 23/562; H01L 23/16; H01L 24/20; H01L 2224/2101; H01L 21/4857; H01L 23/5383; H01L 23/5385; H01L 2221/68327; H01L 21/6835; H01L 23/3135; H01L 2924/161; H01L 2924/1611; H01L 2924/1615; H01L 2924/16196; H01L 2924/171; H01L 2924/1711; H01L 2924/172; H01L 23/36; H01L 23/3675
See application file for complete search history.

(56) References Cited

U.S. PATENT DOCUMENTS 11,521,939 B2 * 12/2022 Chen ............... H01L 23/4334
2018/0261554 A1 * 9/2018 Huang ............... H01L 23/562
(Continued)

*Primary Examiner* — Sonya McCall-Shepard
(74) *Attorney, Agent, or Firm* — The Marbury Law Group, PLLC

(57) ABSTRACT

Devices and method for forming a chip package structure including a package substrate, a fan-out package attached to the package substrate, a first adhesive layer attached to a top surface of the package substrate, a beveled stiffener structure attached to the package substrate and surrounding the fan-out package, the beveled stiffener structure comprising at least one tapered sidewall, in which a first width of a top portion of the beveled stiffener structure along the at least one tapered sidewall is greater than a second width of a bottom portion of the beveled stiffener structure along the at least one tapered sidewall, and in which the bottom portion is in contact with a top surface of the first adhesive layer.

20 Claims, 59 Drawing Sheets

(51) Int. Cl.
*H01L 23/50* (2006.01)
*H01L 23/538* (2006.01)
*H01L 25/10* (2006.01)
*H01L 25/18* (2023.01)

(56) References Cited

U.S. PATENT DOCUMENTS

| | | | |
|---|---|---|---|
| 2019/0115269 A1* | 4/2019 | Pan | H01L 23/04 |
| 2019/0148260 A1* | 5/2019 | Sikka | H01L 23/3675 |
| | | | 257/713 |
| 2023/0046098 A1* | 2/2023 | Kim | H01L 25/16 |

* cited by examiner

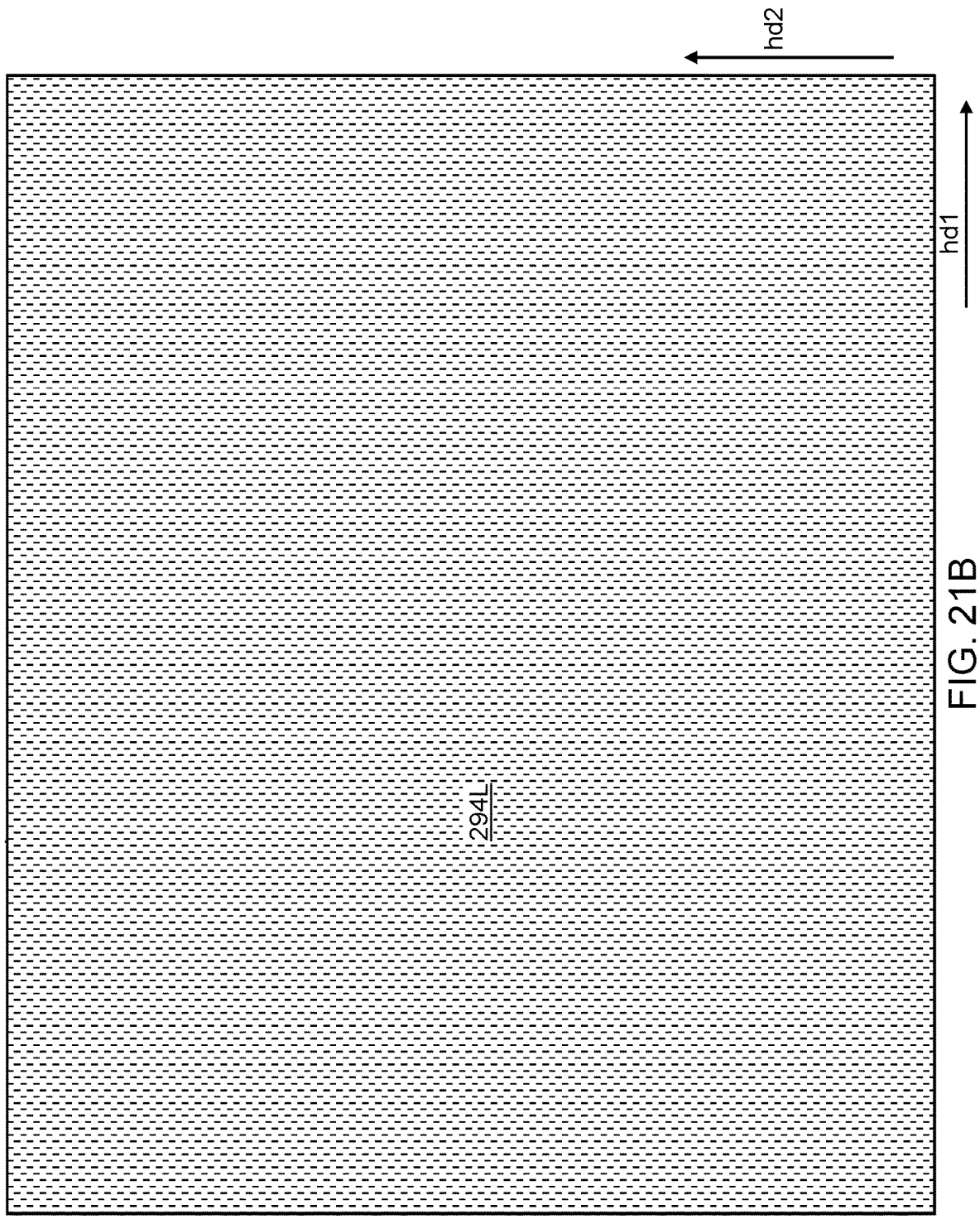

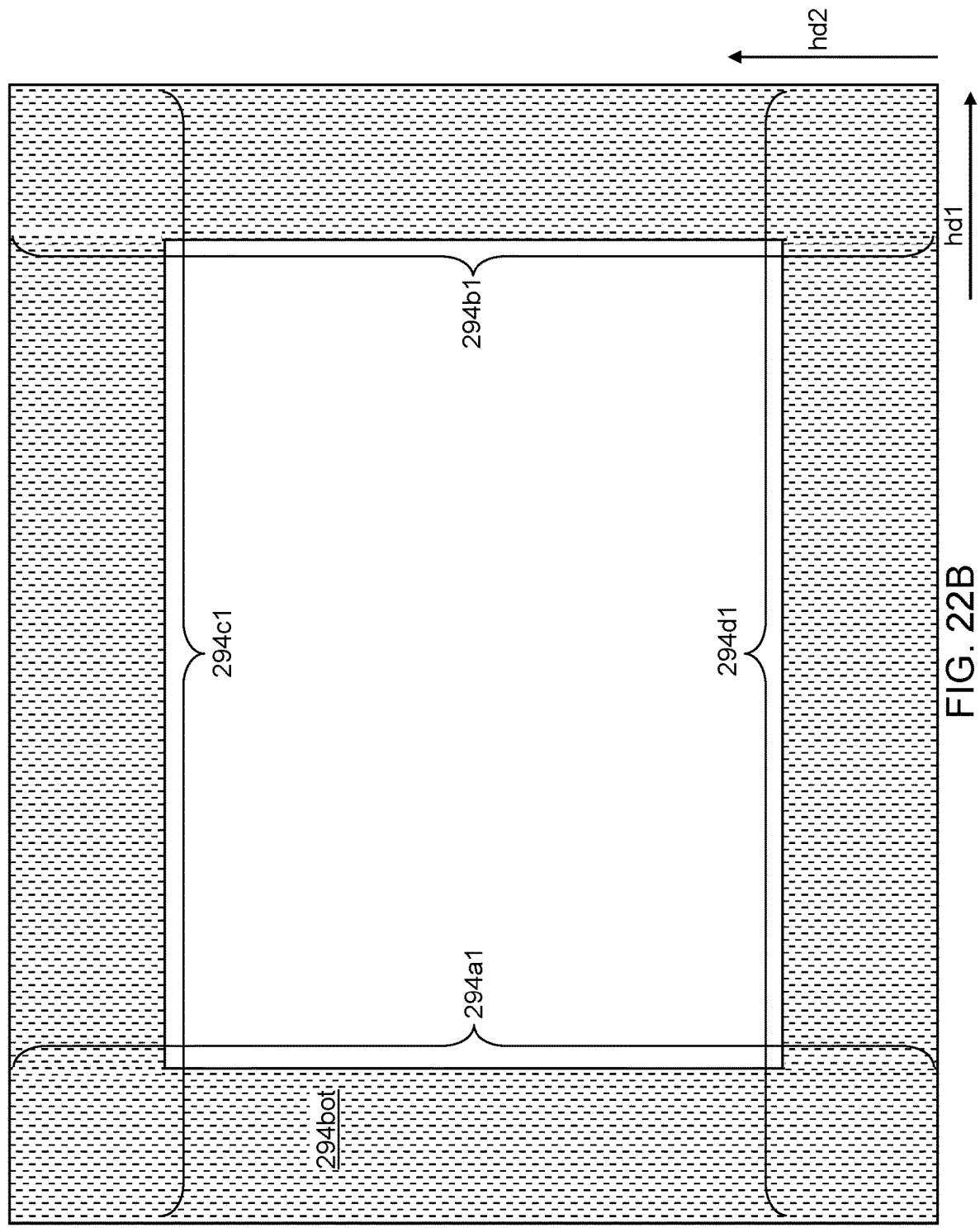

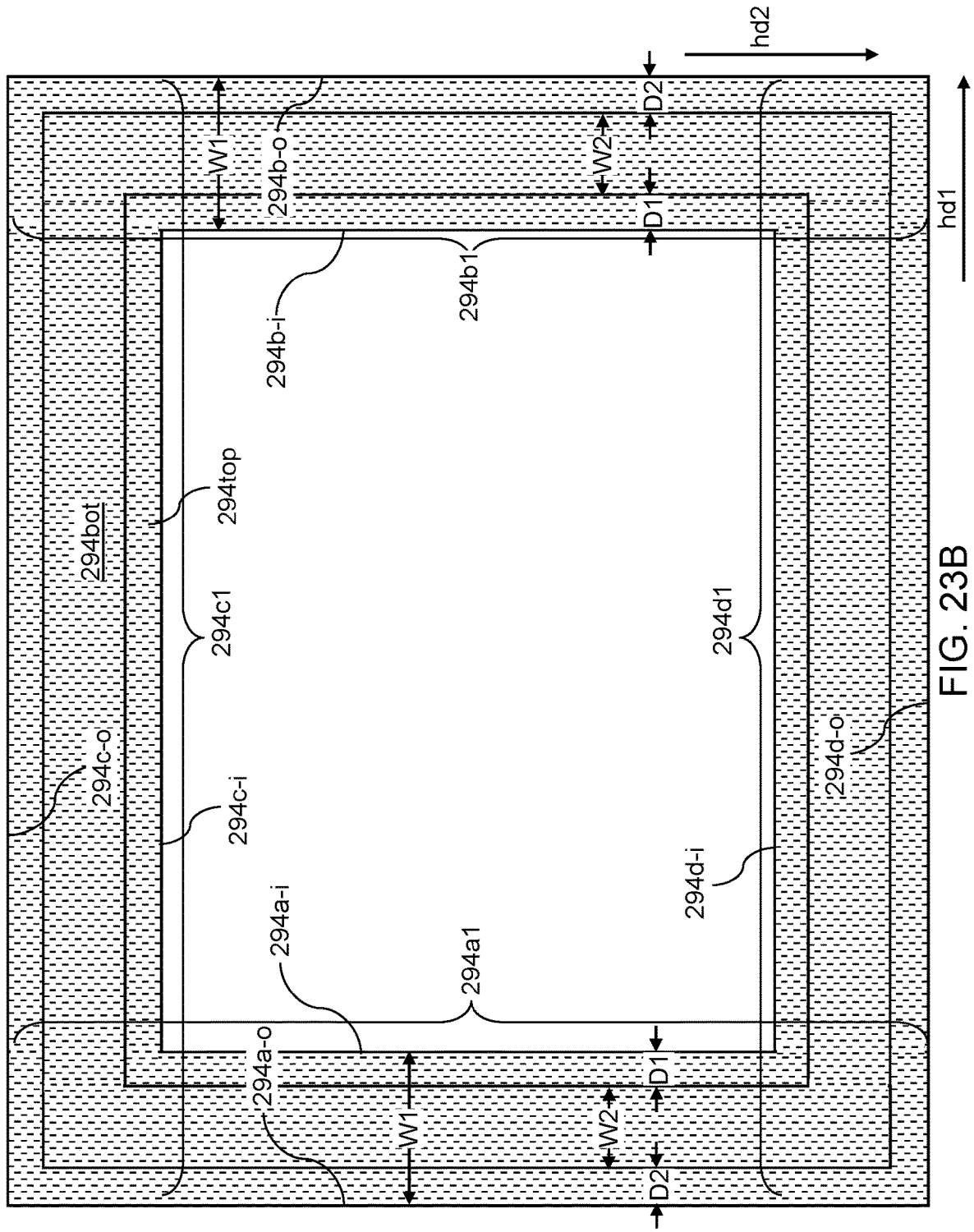

STIFFENER STRUCTURE WITH BEVELED SIDEWALL FOR FOOTPRINT REDUCTION AND METHODS FOR FORMING THE SAME

BACKGROUND

Semiconductor dies within chip package structures are becoming increasingly complex, requiring more power and increased thermal regulation mechanisms to operate efficiently and at higher frequencies. Simultaneously, efforts are made to minimize the footprints of semiconductor dies within semiconductor designs, as with chip package structures and accompanying components, despite the increased complexity of new designs. The increased complexity, power requirements, and thermal regulation mechanisms of semiconductor designs ultimately necessitates large device footprints and leaves little room for tertiary components on a package substrate such as surface mount devices (SMDs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19A is a vertical cross-sectional view and FIG. 19B is a bottom-up view of FIG. 19A.

FIG. 20A is a vertical cross-sectional view and FIG. 20B is a top-down view of FIG. 20A.

FIGS. 21A and 21B are various views of the first alternative structure after attaching the beveled lid-type stiffener structure according to an embodiment of the present disclosure. FIG. 21A is a vertical cross-sectional view and FIG. 21B is a top-down view of FIG. 21A.

FIGS. 22A and 22B are various views of a second alternative structure including a bottom portion of a stiffener structure according to an embodiment of the present disclosure. FIG. 22A is a vertical cross-sectional view and FIG. 22B is a top-down view of FIG. 22A.

FIGS. 23A and 23B are various views of the second alternative structure after beveling the bottom portion of the stiffener structure according to an embodiment of the present disclosure. FIG. 23A is a vertical cross-sectional view and FIG. 23B is a bottom-up view of FIG. 23A.

FIG. 24A is a vertical cross-sectional view and FIG. 24B is a top-down view of FIG. 24A.

FIG. 25A is a vertical cross-sectional view and FIG. 25B is a top-down view of FIG. 25A.

FIG. 30A is a vertical cross-sectional view and FIG. 30B is a top-down view of FIG. 30A.

FIG. 31A is a vertical cross-sectional view and FIG. 31B is a top-down view of FIG. 31A.

FIG. 32A is bottom-up view and FIG. 32B is a vertical cross-sectional view along the horizontal plane A-A' of FIG. 32A.

DETAILED DESCRIPTION

Figure 1A:
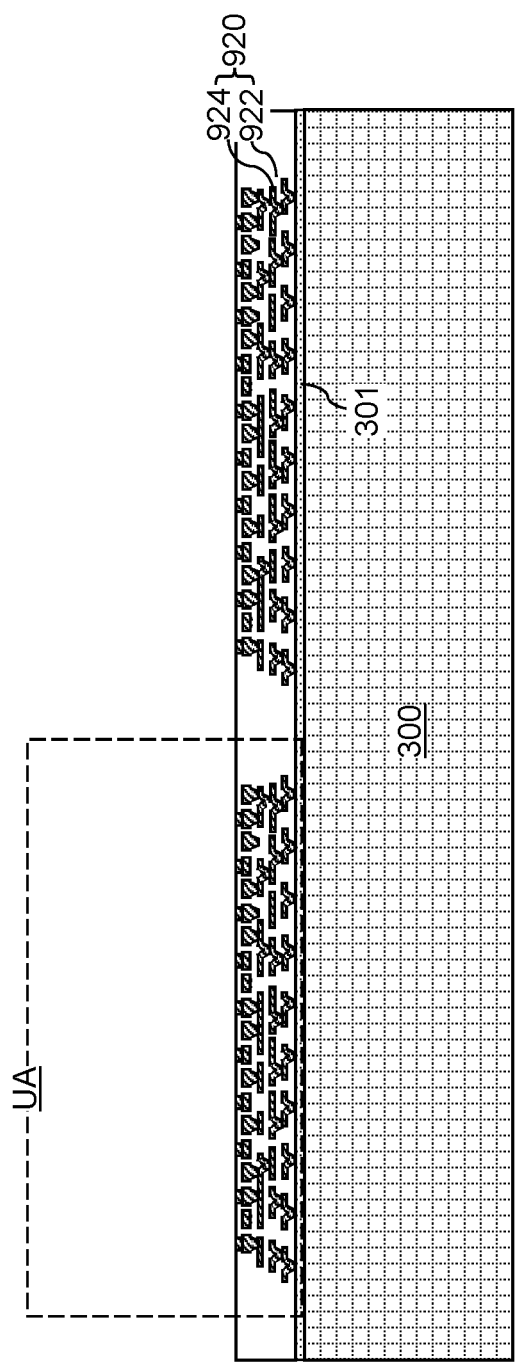
FIG. 1A is a vertical cross-sectional view of a region of an intermediate structure that includes a first carrier substrate and redistribution structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments of the present disclosure are directed to chip package structures, and particularly to beveled stiffener structures within chip package structures. Generally, the various embodiment methods and structures may be used to provide a chip package structure such as a fan-out wafer level package (FOWLP) and fan-out panel level package (FOPLP). While the various embodiments of the present disclosure are described using an FOWLP configuration, implementation of the various embodiment methods and structures in an FOPLP configuration or any other fan-out package configuration are within the contemplated scope of disclosure. The various embodiment chip package structures may have beveled stiffener structures including at least one beveled sidewall. Various embodiments may include at least one tapered inner sidewall, and optionally at least one tapered outer sidewall to reduce the overall footprint of the beveled stiffener structure while retaining the structural integrity of the stiffener structure (i.e., constrain chip package warpage). The beveled stiffener structure may be formed and otherwise shaped to reduce the footprint of a stiffener structure mounted onto a package substrate to provide additional space for other chip package structures uses and components. For example, a beveled stiffener structure may allow for increased surface area for additional surface mount devices (SMDs), such that at least a portion of the SMDs are positioned vertically beneath an overhang of and within a beveled-out portion of the beveled stiffener structure. As another example, the beveled stiffener structure may be formed to be positioned as close to a fan-out package as possible and over an underfill material (e.g., underfill material is beneath an overhang of the beveled stiffener structure), thereby reducing the overall size of the chip package structure on a printed circuit board.

Figure 1B:
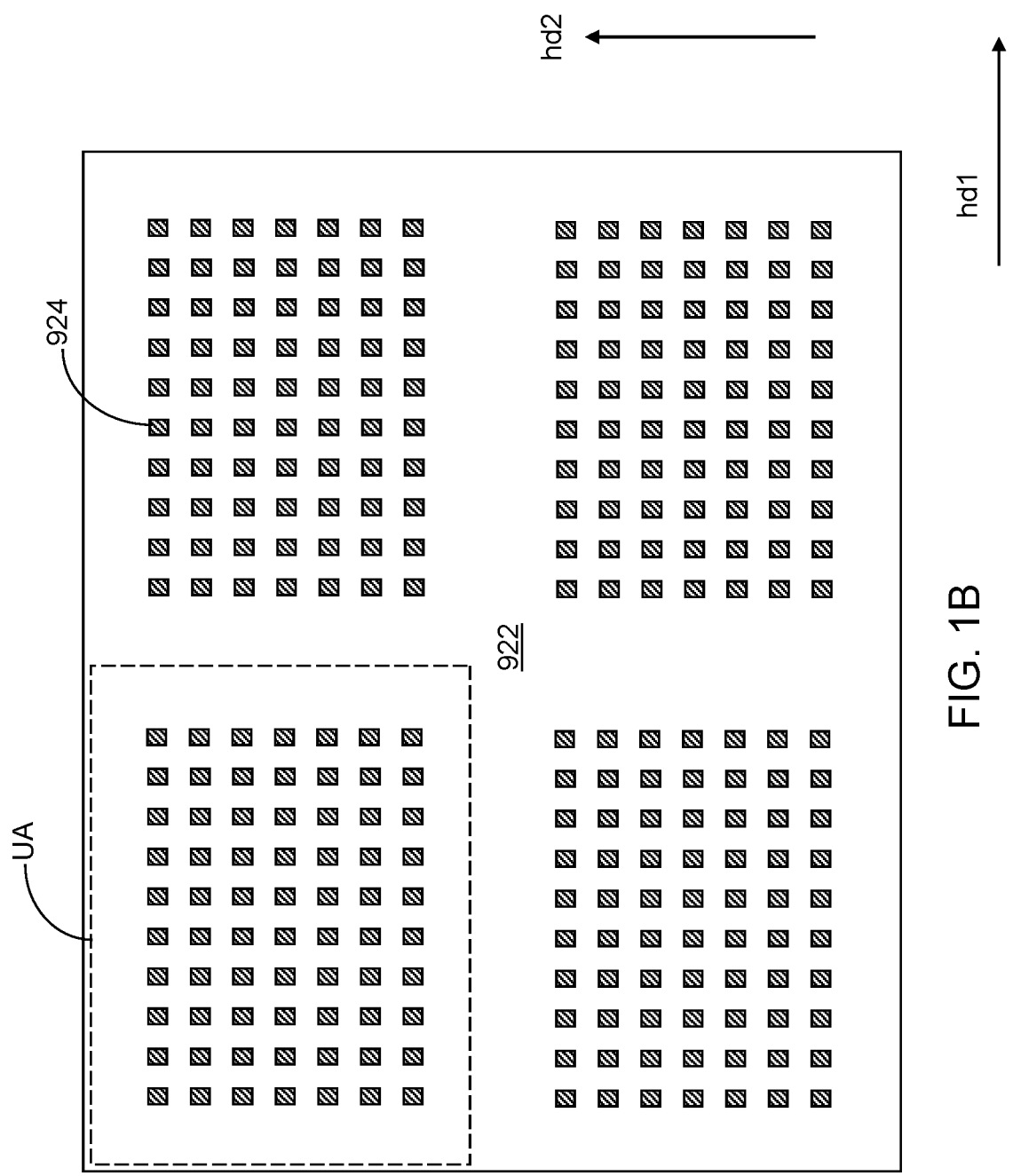
FIG. 1B is a top-down view of the structure of FIG. 1A.

FIG. 1A is a vertical cross-sectional view of a region of a structure that includes a first carrier substrate and redistribution structures according to an embodiment of the present disclosure. FIG. 1B is a top-down view of the structure of FIG. 1A. Referring to FIGS. 1A and 1B, an intermediate structure according to an embodiment of the present disclosure includes a first carrier substrate 300 and redistribution structures 920 formed on a front side surface of the first carrier substrate 300. The first carrier substrate 300 may include an optically transparent substrate such as a glass substrate or a sapphire substrate. The diameter of the first carrier substrate 300 may be in a range from 150 mm to 290 mm, although lesser and greater diameters may be used. In addition, the thickness of the first carrier substrate 300 may be in a range from 500 microns to 2,000 microns, although lesser and greater thicknesses may also be used. Alternatively, the first carrier substrate 300 may be provided in a rectangular panel format.

A first adhesive layer 301 may be applied to the front-side surface of the first carrier substrate 300. In one embodiment, the first adhesive layer 301 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. For example, the LTHC layer may include Light-To-Heat Conversion Release Coating (LTHC) ink™ that is commercially available. Alternatively, the first adhesive layer 301 may include a thermally decomposing adhesive material. For example, the first adhesive layer 301 may include an acrylic pressure-sensitive adhesive that decomposes at an elevated temperature. The debonding temperature of the thermally decomposing adhesive material may be in a range from 150 degrees to 200° C.

Redistribution structures 920 may be formed over the first adhesive layer 301. Specifically, a redistribution structure 920 may be formed within each unit area UA, which is the area of a repetition unit that is repeated in a two-dimensional array over the first carrier substrate 300. Each redistribution structure 920 may include redistribution dielectric layers 922 and redistribution wiring interconnects 924. The redistribution dielectric layers 922 include a respective dielectric polymer material such as polyimide (PI), benzocyclobutene (BCB), or polybenzobisoxazole (PBO). Other suitable materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 400 nm, and the copper seed layer may have a thickness in a range from 100 nm to 500 nm. The metallic fill material for the redistribution wiring interconnects 924 may include copper, nickel, or copper and nickel. Other suitable metallic fill materials are within the contemplated scope of disclosure. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each redistribution structure 920 (i.e., the levels of the redistribution wiring interconnects 924) may be in a range from 1 to 10. A periodic two-dimensional array (such as a rectangular array) of redistribution structures 920 may be formed over the first carrier substrate 300. Each redistribution structure 920 may be formed within a unit area UA, which is a unit of repetition for a two-dimensional array of redistribution structures 920. The layer including all redistribution structures 920 is herein referred to as a redistribution structure layer. The redistribution structure layer includes a two-dimensional array of redistribution structures 920. In one embodiment, the two-dimensional array of redistribution structures 920 may be a rectangular periodic two-dimensional array of redistribution structures 920 having a first periodicity along a first horizontal direction hd1 and having a second periodicity along a second horizontal direction hd2 that is perpendicular to the first horizontal direction hd1. In some embodiments, the redistribution wiring interconnects 924 may include alternately stacked wiring portions and via structures.

Figure 2A:
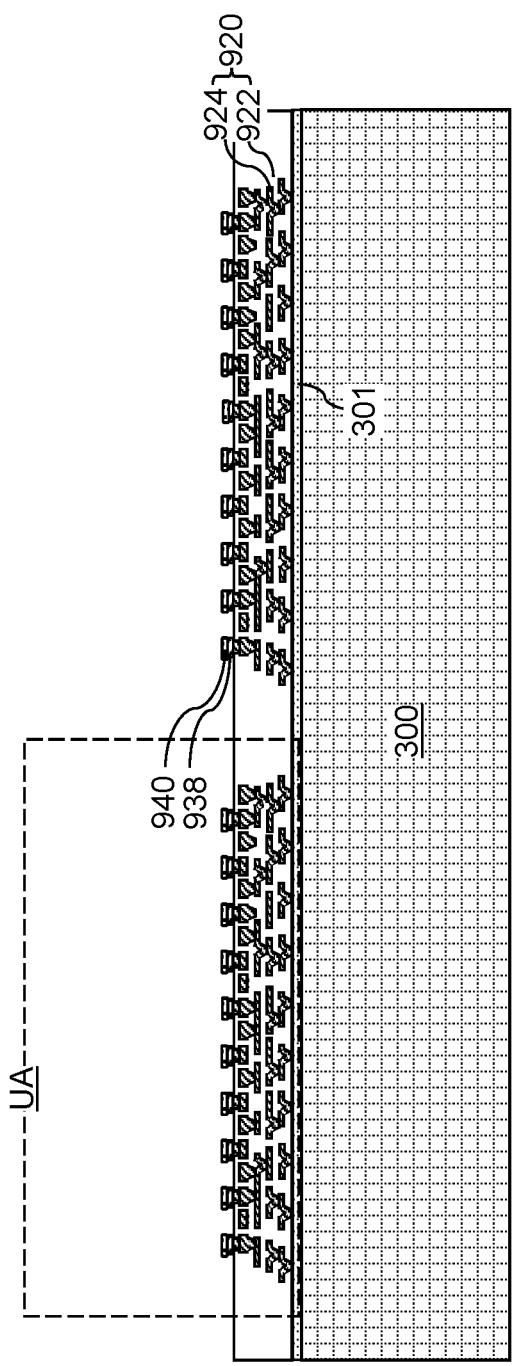
FIG. 2A is vertical cross-sectional view of a region of the intermediate structure after formation of redistribution-side metal pad structures and first solder material portions according to an embodiment of the present disclosure.
Figure 2B:
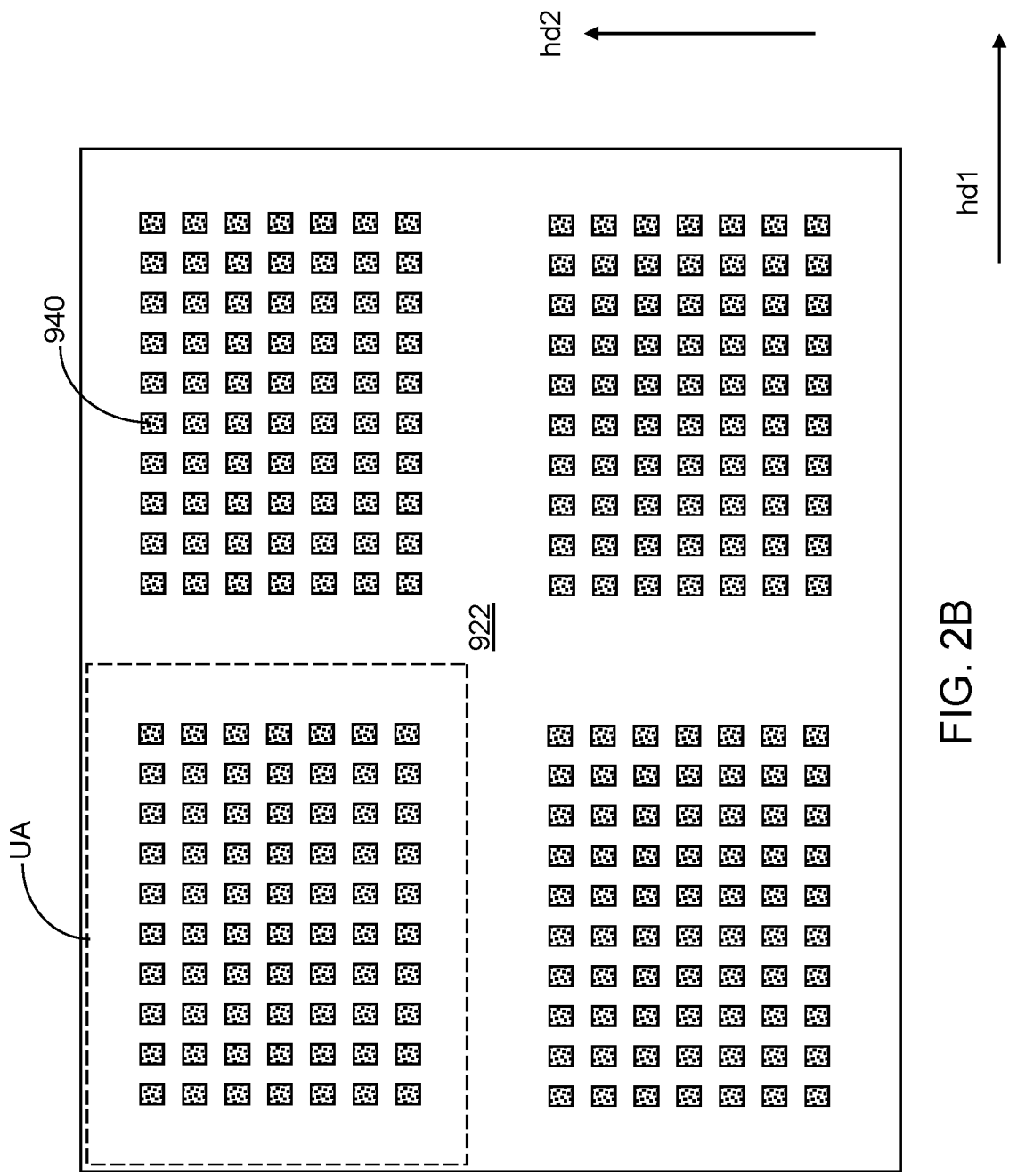
FIG. 2B is a top-down view of the intermediate structure of FIG. 2A.

FIG. 2A is vertical cross-sectional view of a region of the structure after formation of redistribution-side metal pad structures and first solder material portions according to an embodiment of the present disclosure. FIG. 2B is a top-down view of the structure of FIG. 2A. Referring to FIGS. 2A and 2B, at least one metallic material and a first material may be sequentially deposited over the front-side surface of the redistribution structures 920. The at least one metallic material comprises a material that may be used for metallic pads, such as copper. The thickness of the at least one metallic material may be in a range from 5 microns to 60 microns, such as from 10 microns to 30 microns, although lesser and greater thicknesses may also be used. The first material may comprise a first material suitable for C2 bonding, i.e., for microbump bonding. The thickness of the first material may be in a range from 2 microns to 30 microns, such as from 4 microns to 15 microns, although lesser and greater thicknesses may also be used.

The first material and the at least one metallic material may be patterned into discrete arrays of first solder material portions 940 and arrays of metal pad structures, which are herein referred to as arrays of redistribution-side metal pad structures 938. Each array of redistribution-side metal pad structures 938 is formed within a respective unit area UA. Each array of first solder material portions 940 is formed within a respective unit area UA. Each first solder material portion 940 may have a same horizontal cross-sectional shape as an underlying redistribution-side metal pad structures 938.

In one embodiment, the redistribution-side metal pad structures 938 may include, and/or may consist essentially of, copper or a copper-containing alloy. Other suitable materials are within the contemplated scope of disclosure. The thickness of the redistribution-side metal pad structures 938 may be in a range from 5 microns to 60 microns, although lesser or greater thicknesses may also be used. The redistribution-side metal pad structures 938 may have horizontal cross-sectional shapes of rectangles, rounded rectangles, circles, regular polygons, irregular polygons, or any other two-dimensional curvilinear shape having a closed periphery. In one embodiment, redistribution-side metal pad structures 938 may be configured for microbump bonding (i.e., C2 bonding), and may have a thickness in a range from 10 microns to 30 microns, although lesser or greater thicknesses may also be used. In this embodiment, each array of redistribution-side metal pad structures 938, such as copper pillars or under bump metallurgies (UBM), may be portions of an array of microbumps having a lateral dimension in a range from 10 microns to 25 microns, and having a pitch in a range from microns to 50 microns.

Figure 3A:
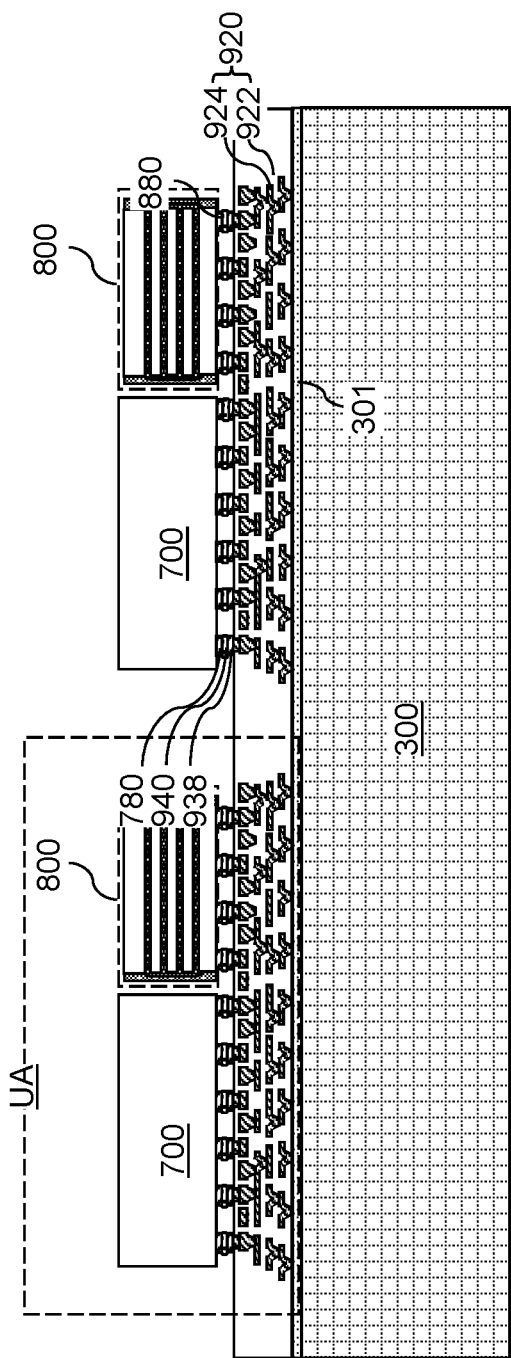
FIG. 3A is a vertical cross-sectional view of a region the intermediate structure after attaching semiconductor dies according to an embodiment of the present disclosure.
Figure 3B:
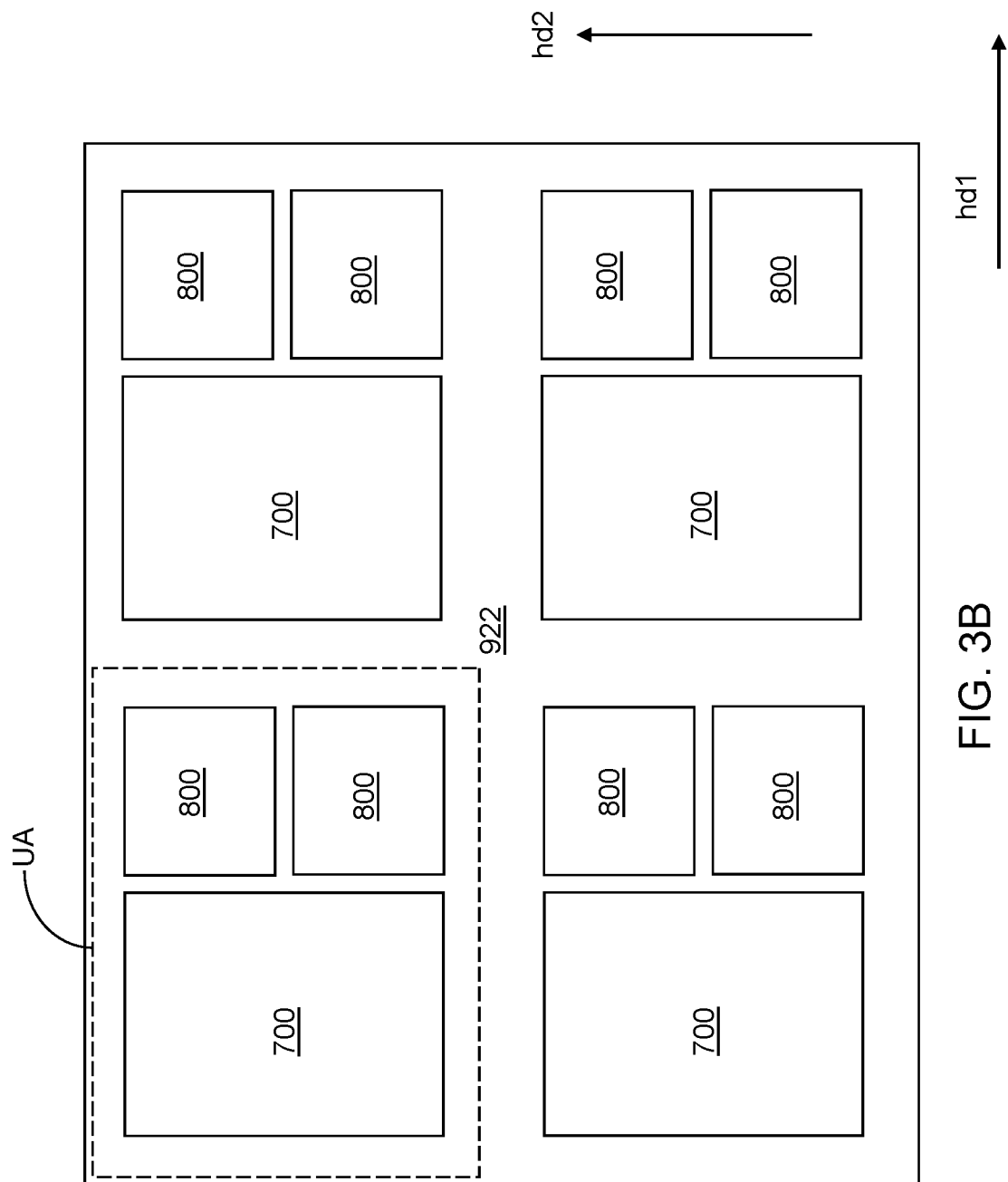
FIG. 3B is a top-down view of the intermediate structure of FIG. 3A.
Figure 3C:
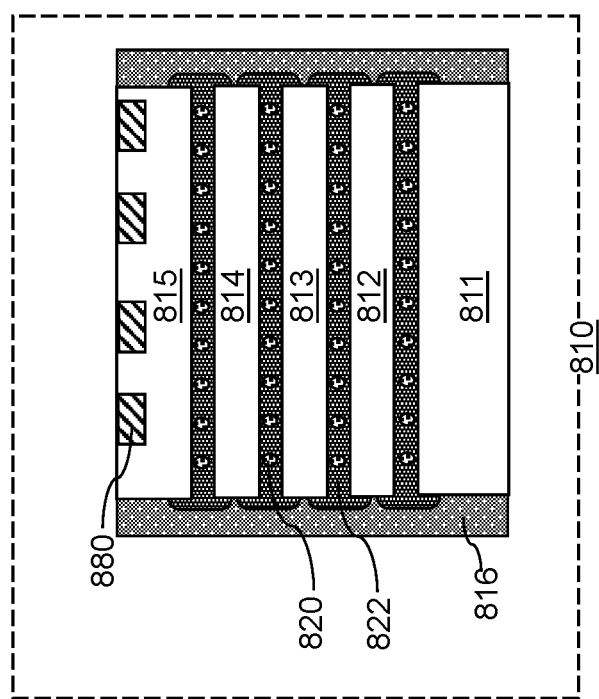
FIG. 3C is a magnified vertical cross-sectional view of a high bandwidth memory die.

FIG. 3A is a vertical cross-sectional view of a region the structure after attaching semiconductor dies according to an embodiment of the present disclosure. FIG. 3B is a top-down view of the structure of FIG. 3A. FIG. 3C is a magnified vertical cross-sectional view of a high bandwidth memory die.

Referring to FIGS. 3A and 3B, a set of at least one semiconductor die (700, 800) may be bonded to each redistribution structure 920. In one embodiment, the redistribution structures 920 may be arranged as a two-dimensional periodic array, and multiple sets of at least one semiconductor die (700, 800) may be bonded to the redistribution structures 920 as a two-dimensional periodic rectangular array of sets of the at least one semiconductor die (700, 800). Each set of at least one semiconductor die (700, 800) includes at least one semiconductor die. Each set of at least one semiconductor die (700, 800) may include any set of at least one semiconductor die known in the art. In one embodiment, each set of at least one semiconductor die (700, 800) may comprise a plurality of semiconductor dies (700, 800). For example, each set of at least one semiconductor die (700, 800) may include at least one system-on-chip (SoC) die 700 and/or at least one memory die 800. Each SoC die 700 may comprise an application processor die, a central processing unit die, or a graphic processing unit die. In one embodiment, the at least one memory die 800 may comprise a high bandwidth memory (HBM) die that includes a vertical stack of static random-access memory dies. In one embodiment, the at least one semiconductor die (700, 800) may include at least one system-on-chip (SoC) die and a high bandwidth memory (HBM) die including a vertical stack of static random-access memory (SRAM) dies that are interconnected to one another through microbumps and are laterally surrounded by an epoxy molding material enclosure frame.

Referring to FIGS. 3A and 3C, each semiconductor die (700, 800) may comprise a respective array of die-side metal pad structures (780, 880). For example, each SoC die 700 may comprise an array of SoC metal pad structures 780, and each memory die 800 may comprise an array of memory-die metal pad structures 880. Each of the semiconductor dies (700, 800) may be positioned in a face-down position such that die-side metal pad structures (780, 880) face the first solder material portions 940. Each set of at least one semiconductor die (700, 800) may be placed within a respective unit area UA. Placement of the semiconductor dies (700, 800) may be performed using a pick and place apparatus so that each of the die-side metal pad structures (780, 880) is placed on a top surface of a respective one of the first solder material portions 940.

Generally, a redistribution structure 920 including redistribution-side metal pad structures 938 thereupon may be provided, and at least one semiconductor die (700, 800) including a respective set of die-side metal pad structures (780, 880) may be provided. The at least one semiconductor die (700, 800) may be bonded to the redistribution structure 920 using first solder material portions 940 that are bonded to a respective redistribution-side metal pad structure 938 and to a respective one of the die-side metal pad structures (780, 880). Generally, a first array of metallic joint structures may be formed. Each metallic joint structure may comprise a first metal pad structure (such as a redistribution-side metal pad structure 938), a second metal pad structure (such as a die-side metal pad structure (780, 880)), and a bump material portion (such as a first solder material portion 940).

Figure 4A:
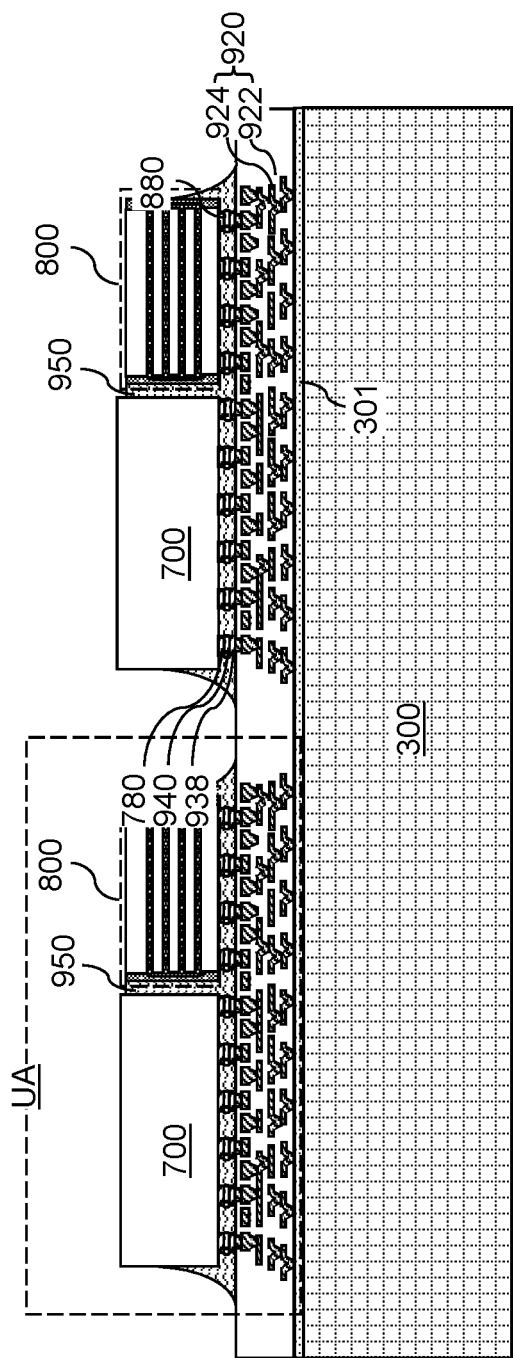
FIG. 4A is a vertical cross-sectional view of a region of the intermediate structure after formation of first underfill material portions according to an embodiment of the present disclosure.
Figure 4B:
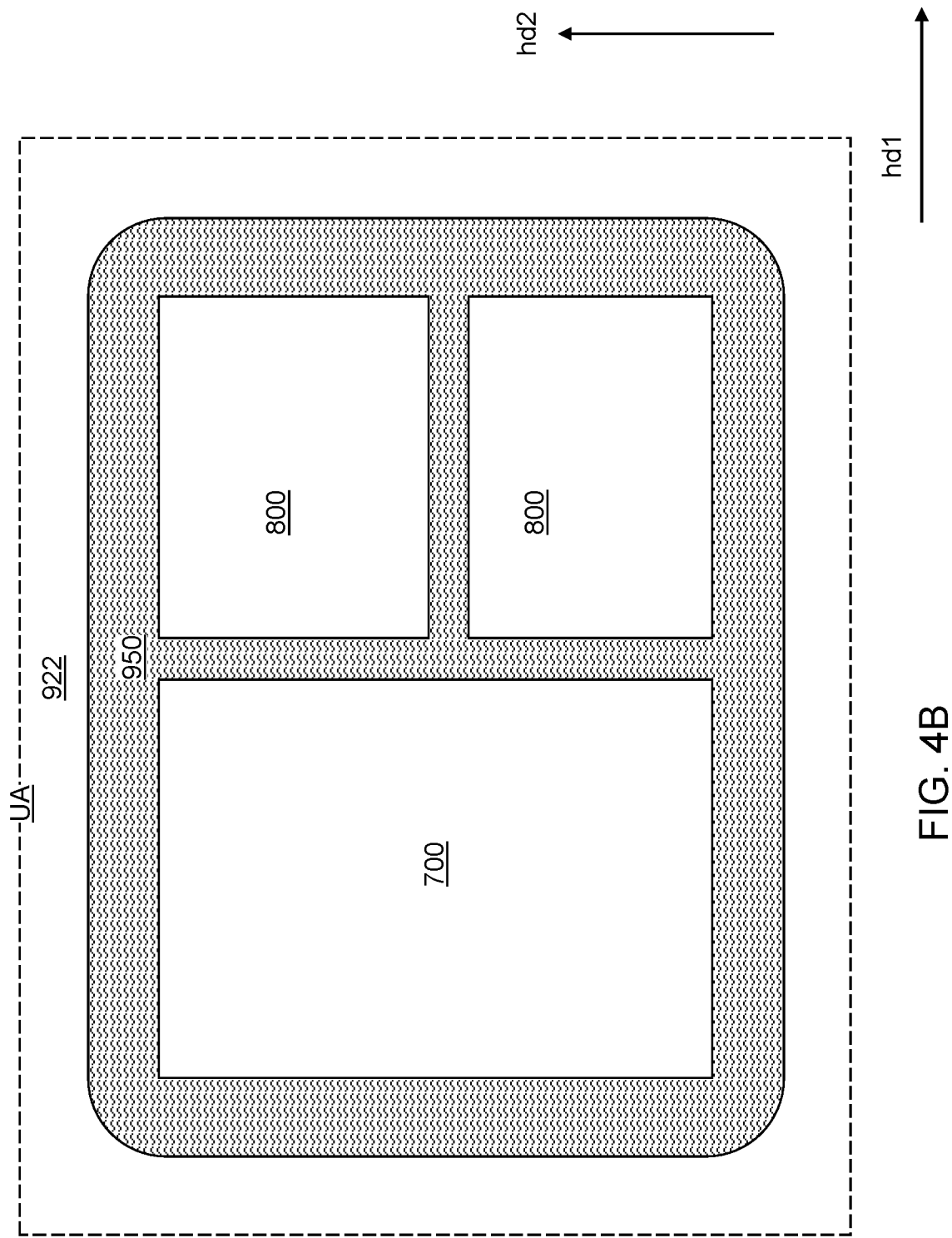
FIG. 4B a top-down view of the intermediate structure of FIG. 4A according to an embodiment of the present disclosure.

Referring to FIG. 3C, a high bandwidth memory (HBM) die 810 is illustrated, which may be used as a memory die 800 within the structures of FIGS. 4A and 4B. The HBM die 810 may include a vertical stack of static random access memory dies (811, 812, 813, 814, 815) that are interconnected to one another through microbumps 820 and are laterally surrounded by an epoxy molding material enclosure frame 816. The gaps between vertically neighboring pairs of the random-access memory dies (811, 812, 813, 814, 815) may be filled with a HBM underfill material portions 822 that laterally surrounds a respective set of microbumps 820. The HBM die 810 may comprise an array of memory-die metal pad structures 880 configured to be bonded to a subset of an array of redistribution-side metal pad structures 938 within a unit area UA. The HBM die 810 may be configured to provide a high bandwidth as defined under JEDEC standards, i.e., standards defined by The JEDEC Solid State Technology Association.

FIG. 4A is a vertical cross-sectional view of a region of the structure after formation of first underfill material portions according to an embodiment of the present disclosure. FIG. 4B a top-down view of the structure of FIG. 4A according to an embodiment of the present disclosure. Referring to FIGS. 4A and 4B, a first underfill material may be applied into each gap between the redistribution structures 920 and sets of at least one semiconductor die (700, 800) that may be bonded to the redistribution structures 920. FIG. 4B a top down view of the structure of FIG. 4A. The first underfill material may comprise any underfill material known in the art. A first underfill material portion 950 may be formed within each unit area UA between a redistribution structure 920 and an overlying set of at least one semiconductor die (700, 800). The first underfill material portions 950 may also be referred to as microbump underfill fillet portions or microbump underfill material portions. The first underfill material portions 950 may be formed by injecting the first underfill material around a respective array of first solder material portions 940 in a respective unit area UA. Any known underfill material application method may be used, which may be, for example, the capillary underfill method, the molded underfill method, or the printed underfill method. In some embodiments, the outer periphery of the first underfill material portion 950 may have rounded corners in a plan view. In some embodiments, the outer periphery of the first underfill material portion 950 may have squared, or perpendicular corners in a plan view.

Within each unit area UA, a first underfill material portion 950 may laterally surround, and contact, each of the first solder material portions 940 within the unit area UA. The first underfill material portion 950 may be formed around, and contact, the first solder material portions 940, the redistribution-side metal pad structures 938, and the die-side metal pad structures (780, 880) in the unit area UA. In some embodiments, the exposed outermost surfaces of the first underfill material portion 950 surrounding sidewalls of the at least one semiconductor (700, 800) may have a curved or concave shape with varying taper angles formed as a result of the deposition process. In other embodiments, the exposed outermost surfaces of the first underfill material portion 950 surrounding sidewalls of the at least one semiconductor (700, 800) may have a straight taper or even a convex shape.

Each redistribution structure 920 in a unit area UA comprises redistribution-side metal pad structures 938. At least one semiconductor die (700, 800) comprising a respective set of die-side metal pad structures (780, 880) is attached to the redistribution-side metal pad structures 938 through a respective set of first solder material portions 940 within each unit area UA. Within each unit area UA, a first underfill material portion 950 laterally surrounds the redistribution-side metal pad structures 938 and the die-side metal pad structures (780, 880) of the at least one semiconductor die (700, 800).

Figure 5A:
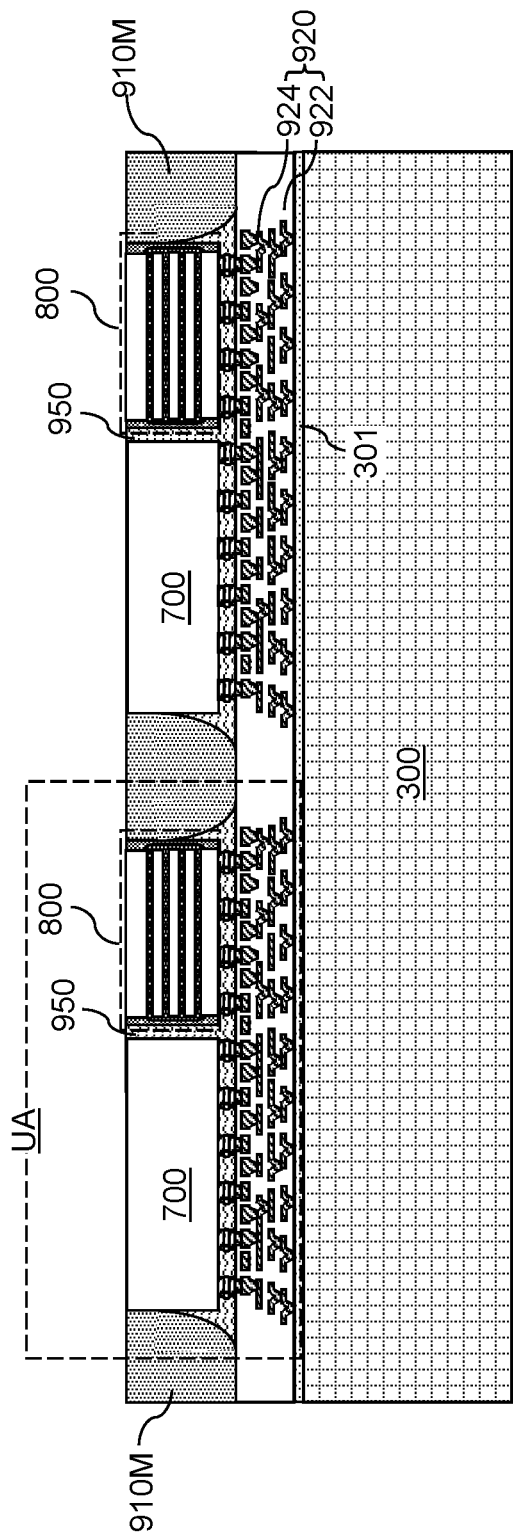
FIG. 5A is a vertical cross-sectional view of a region of the intermediate structure after formation of an epoxy molding compound (EMC) matrix according to an embodiment of the present disclosure.
Figure 5B:
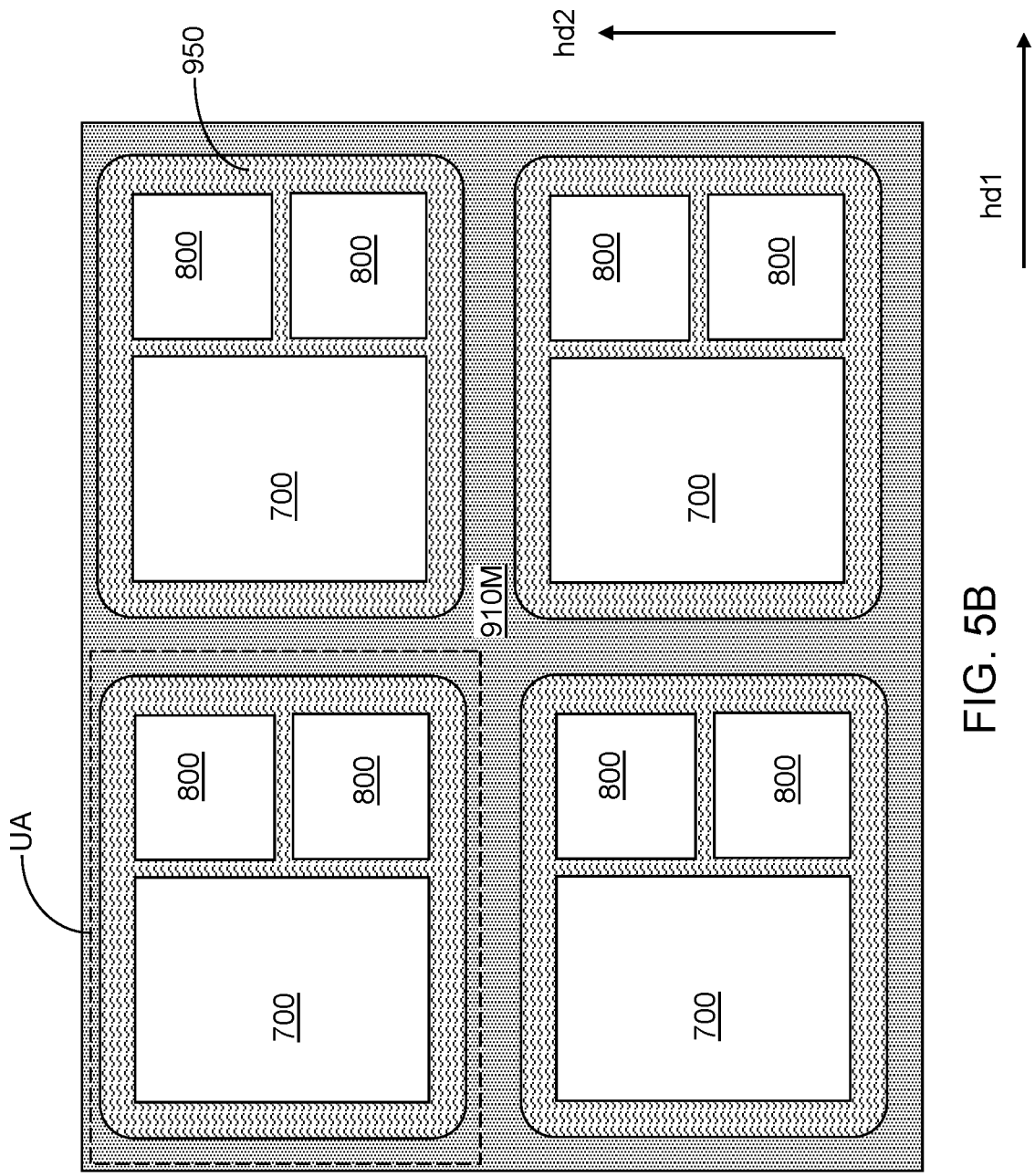
FIG. 5B is a top-down view of the intermediate structure of FIG. 5A according to an embodiment of the present disclosure.

FIG. 5A is a vertical cross-sectional view of a region of the structure after formation of an epoxy molding compound (EMC) matrix according to an embodiment of the present disclosure. FIG. 5B is a top-down view of the structure of FIG. 5A according to an embodiment of the present disclosure. Referring to FIGS. 5A and 5B, an epoxy molding compound (EMC) may be applied to the gaps between contiguous assemblies of a respective set of semiconductor dies (700, 800) and a first underfill material portion 950. The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the first adhesive layer 301 if the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each assembly of a set of semiconductor dies (700, 800) and a first underfill material portion 950. The EMC matrix 910M includes a plurality of epoxy molding compound (EMC) die frames that may be laterally adjoined to one another. Each EMC die frame is a portion of the EMC matrix 910M that is located within a respective unit area UA. Thus, each EMC die frame laterally surrounds and embeds a respective set of semiconductor dies (700, 800) and a respective first underfill material portion 950. Young's modulus of pure epoxy is about 3.35 GPa, and Young's modulus of the EMC may be higher than Young's modulus of pure epoxy by adding additives. Young's modules of EMC may be greater than 3.5 GPa.

Portions of the EMC matrix 910M that overlies the horizontal plane including the top surfaces of the semiconductor dies (700, 800) may be removed by a planarization process. For example, the portions of the EMC matrix 910M that overlies the horizontal plane may be removed using a chemical mechanical planarization. The combination of the remaining portion of the EMC matrix 910M, the semiconductor dies (700, 800), the first underfill material portions 950, and the two-dimensional array of redistribution structures 920 comprises a reconstituted wafer 900W. Each portion of the EMC matrix 910M located within a unit area UA constitutes an EMC die frame.

Figure 6:
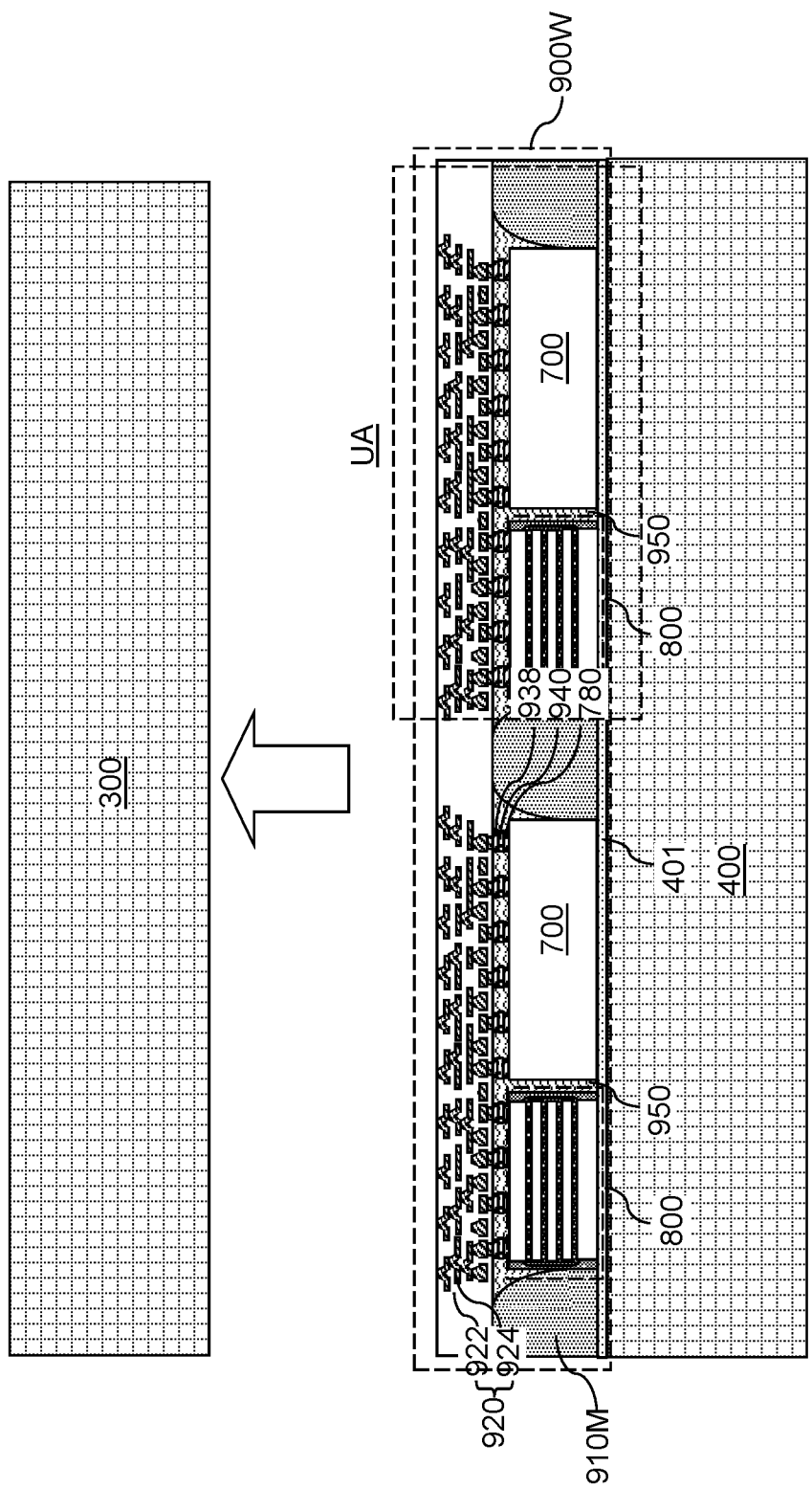
FIG. 6 is a vertical cross-sectional view of a region of an intermediate structure after attaching a second carrier substrate and detaching the first carrier substrate according to an embodiment of the present disclosure.

FIG. 6 is a vertical cross-sectional view of a region of an intermediate structure after attaching a second carrier substrate and detaching the first carrier substrate according to an embodiment of the present disclosure. Referring to FIG. 6, a second adhesive layer 401 may be applied to the physically exposed planar surface of the reconstituted wafer 900W, i.e., the physically exposed surfaces of the EMC matrix 910M, the semiconductor dies (700, 800), and the first underfill material portions 950. In one embodiment, the second adhesive layer 401 may comprise a same material as, or may comprise a different material from, the material of the first adhesive layer 301. If the first adhesive layer 301 comprises a thermally decomposing adhesive material, the second adhesive layer 401 comprises another thermally decomposing adhesive material that decomposes at a higher temperature, or may comprise a light-to-heat conversion material.

A second carrier substrate 400 may be attached to the second adhesive layer 401. The second carrier substrate 400 may be attached to the opposite side of the reconstituted wafer 900W relative to the first carrier substrate 300. Generally, the second carrier substrate 400 may comprise any material that may be used for the first carrier substrate 300. The thickness of the second carrier substrate 400 may be in a range from 500 microns to 2,000 microns, although lesser and greater thicknesses may also be used.

The first adhesive layer 301 may be decomposed by ultraviolet radiation or by a thermal anneal at a debonding temperature. In embodiments in which the first carrier substrate 300 includes an optically transparent material and the first adhesive layer 301 includes an LTHC layer, the first adhesive layer 301 may be decomposed by irradiating ultraviolet light through the transparent carrier substrate. The LTHC layer may be absorb the ultraviolet radiation and generate heat, which decomposes the material of the LTHC layer and cause the transparent first carrier substrate 300 to be detached from the reconstituted wafer 900W. In embodiments in which the first adhesive layer 301 includes a thermally decomposing adhesive material, a thermal anneal process at a debonding temperature may be performed to detach the first carrier substrate 300 from the reconstituted wafer 900W.

Figure 7:
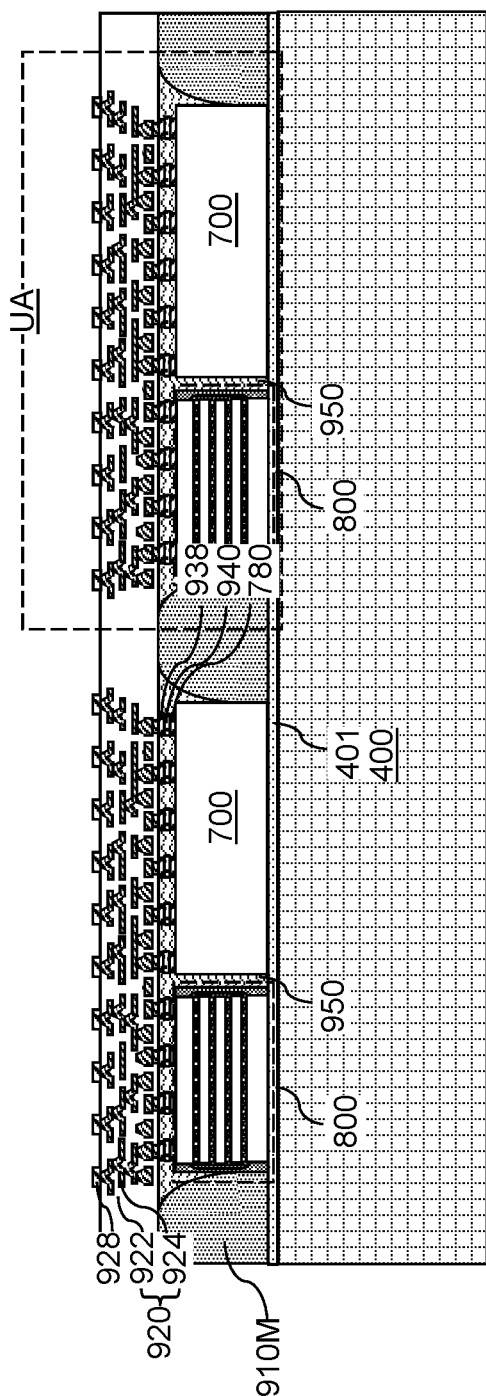
FIG. 7 is a vertical cross-sectional view of a region of the intermediate structure after formation of fan-out bonding pads according to an embodiment of the present disclosure.

FIG. 7 is a vertical cross-sectional view of a region of the intermediate structure after formation of fan-out bonding pads according to an embodiment of the present disclosure. Referring to FIG. 7, fan-out bonding pads 928 may be formed by depositing and patterning at least one metallic material that may function as bonding pads. The metallic fill material for the fan-out bonding pads 928 may include copper. Other suitable materials are within the contemplated scope of disclosure. The thickness of the fan-out bonding pads 928 may be in a range from 5 microns to 100 microns, although lesser or greater thicknesses may also be used. The fan-out bonding pads 928 may have horizontal cross-sectional shapes of rectangles, rounded rectangles, or circles. Other suitable shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of micropads (such as copper pillars or UBMs) having a lateral dimension in a range from 10 microns to 25 microns, and having a pitch in a range from 20 microns to 50 microns.

The fan-out bonding pads 928 may be formed on the opposite side of the redistribution structure 920 from the EMC matrix 910M and the two-dimensional array of sets of semiconductor dies (700, 800) relative to the redistribution structure layer. The redistribution structure layer includes a two-dimensional array of redistribution structures 920. Each redistribution structure 920 may be located within a respective unit area UA. Each redistribution structure 920 may comprise redistribution dielectric layers 922, redistribution wiring interconnects 924 embedded in the redistribution dielectric layers 922, and fan-out bonding pads 928. The fan-out bonding pads 928 may be located on an opposite side of the redistribution structure 920 from the redistribution-side metal pad structures 938 relative to the redistribution dielectric layers 922.

Figure 8:
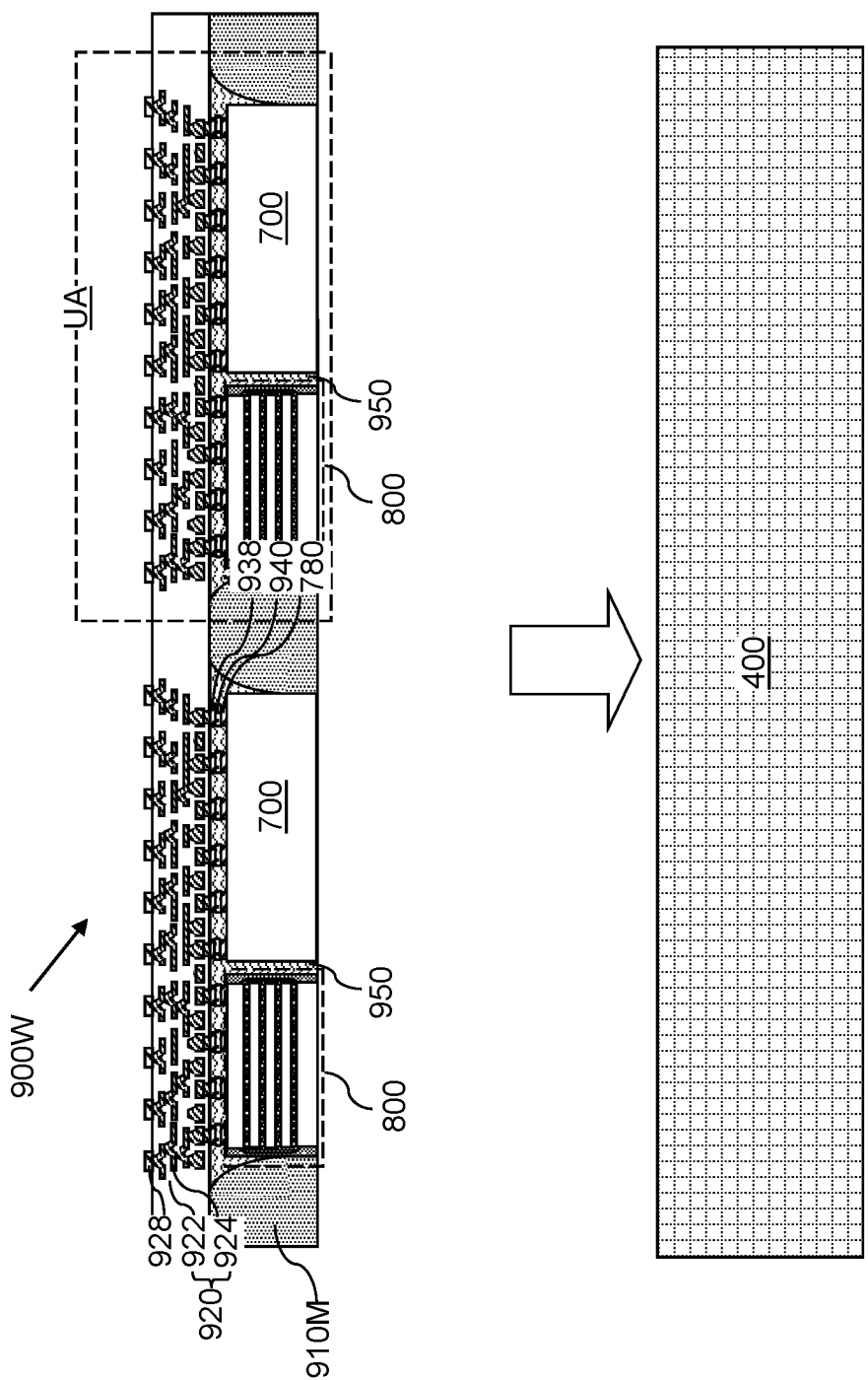
FIG. 8 is a vertical cross-sectional view of a region of the intermediate structure after detaching the second carrier substrate according to an embodiment of the present disclosure.

FIG. 8 is a vertical cross-sectional view of a region of the intermediate structure after detaching the second carrier substrate according to an embodiment of the present disclosure. Referring to FIG. 8, the second adhesive layer 401 may be decomposed by ultraviolet radiation or by a thermal anneal at a debonding temperature. In embodiments in which the second carrier substrate 400 includes an optically transparent material and the second adhesive layer 401 includes an LTHC layer, the second adhesive layer 401 may be decomposed by irradiating ultraviolet light through the transparent carrier substrate. In embodiments in which the second adhesive layer 401 includes a thermally decomposing adhesive material, a thermal anneal process at a debonding temperature may be performed to detach the second carrier substrate 400 from the reconstituted wafer 900W.

Figure 9:
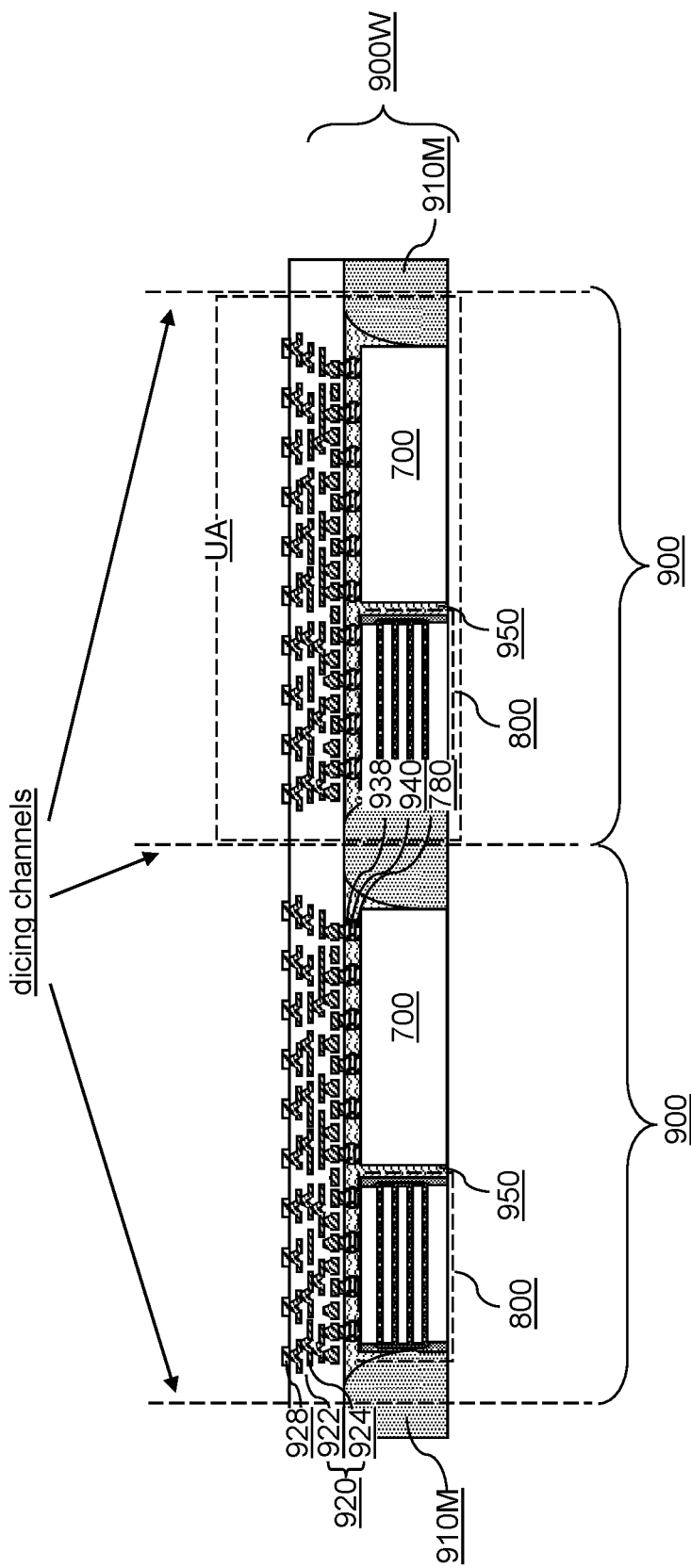
FIG. 9 is a vertical cross-sectional view of a region of the intermediate structure during dicing of a redistribution substrate and the EMC matrix according to an embodiment of the present disclosure.

FIG. 9 is a vertical cross-sectional view of a region of the intermediate structure during dicing of a redistribution substrate and the EMC matrix according to an embodiment of the present disclosure. Referring to FIG. 9, the reconstituted wafer 900W including the fan-out bonding pads 928 may be subsequently diced along dicing channels by performing a dicing process. The dicing channels correspond to the boundaries between neighboring pairs of die areas DA. Each diced unit from the reconstituted wafer 900W comprises a fan-out package 900. In other words, each diced portion of the assembly of the two-dimensional array of sets of semiconductor dies (700, 800), the two-dimensional array of first underfill material portions 950, the EMC matrix 910M, and the two-dimensional array of redistribution structures 920 constitutes a fan-out package 900. Each diced portion of the EMC matrix 910M constitutes a molding compound die frame 910. Each diced portion of the redistribution structure layer (which includes the two-dimensional array of redistribution structures 920) constitutes a redistribution structure 920.

Figure 10A:
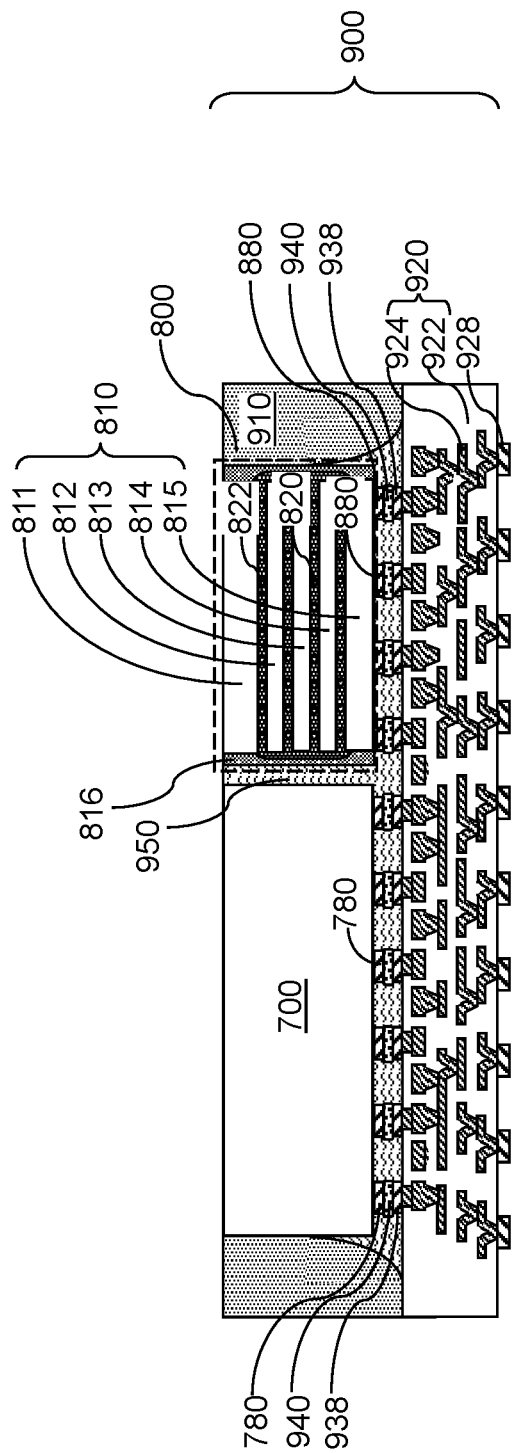
FIG. 10A is a vertical cross-sectional view of an intermediate structure according to an embodiment of the present disclosure.
Figure 10B:
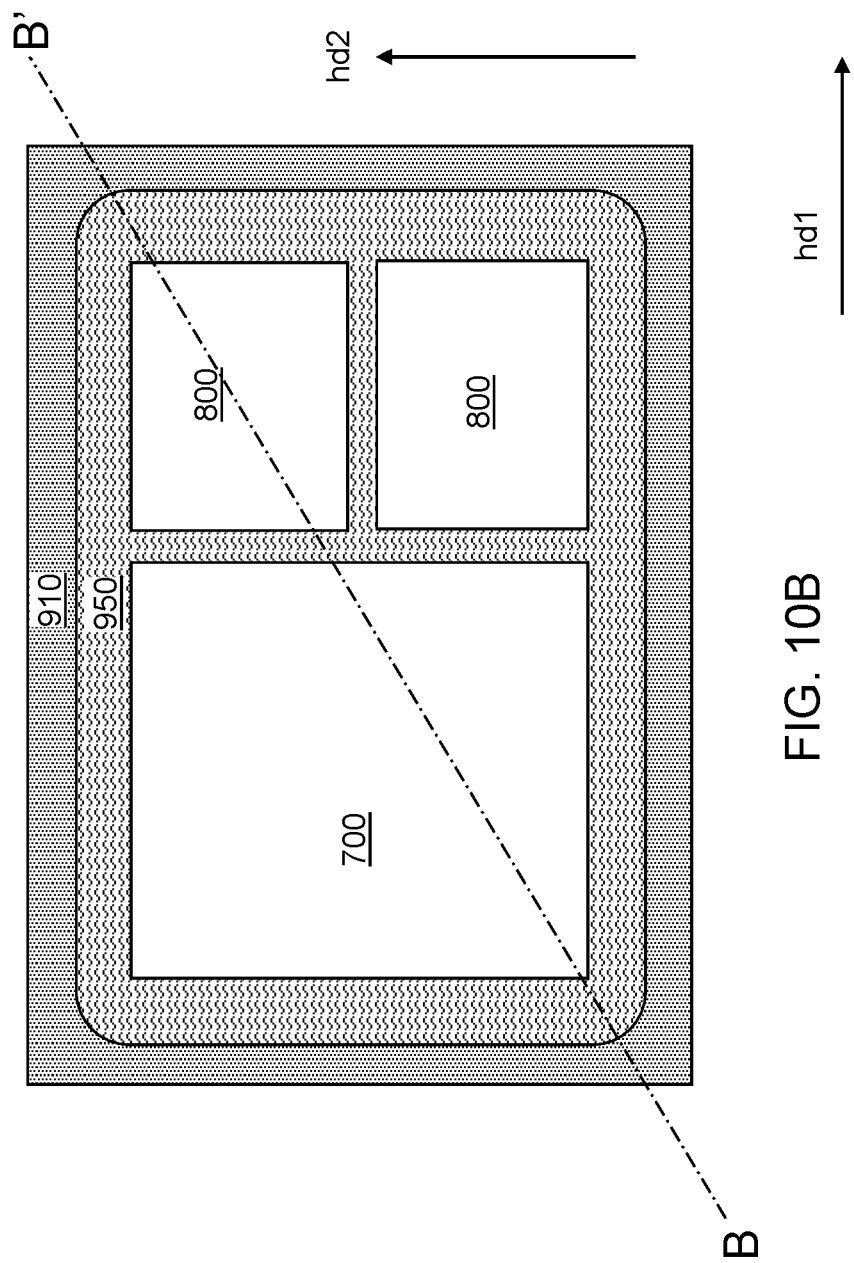
FIG. 10B is a top-down view of the intermediate structure along the horizontal plane B-B' of FIG. 10A according to an embodiment of the present disclosure.

FIG. 10A is a vertical cross-sectional view of an intermediate structure according to an embodiment of the present disclosure. FIG. 10B is a top-down view of the intermediate structure of FIG. 10A according to an embodiment of the present disclosure. The vertical cross section shown in FIG. 10A is along line BB' in FIG. 10B. Referring to FIGS. 10A and 10B, a fan-out package 900 obtained by dicing the structure at the processing steps of FIG. 9 is illustrated. The fan-out package 900 comprises a redistribution structure 920 including redistribution-side metal pad structures 938, at least one semiconductor die (700, 800) comprising a respective set of die-side metal pad structures (780, 880) that is attached to the redistribution-side metal pad structures 938 through a respective set of first solder material portions 940, a first underfill material portion 950 laterally surrounding the redistribution-side metal pad structures 938 and the die-side metal pad structures (780, 880) of the at least one semiconductor die (700, 800).

The fan-out package 900 may also comprise a molding compound die frame 910 laterally surrounding the at least one semiconductor die (700, 800) and comprising a molding compound material. In one embodiment, the molding compound die frame 910 comprises sidewalls that are vertically coincident with sidewalls of the redistribution structure 920, i.e., located within same vertical planes as the sidewalls of the redistribution structure 920. Generally, the molding compound die frame 910 may be formed around the at least one semiconductor die (700, 800) after formation of the first underfill material portion 950 within each fan-out package 900. The molding compound material contacts a peripheral portion of a planar surface of the redistribution structure 920.

Figure 11:
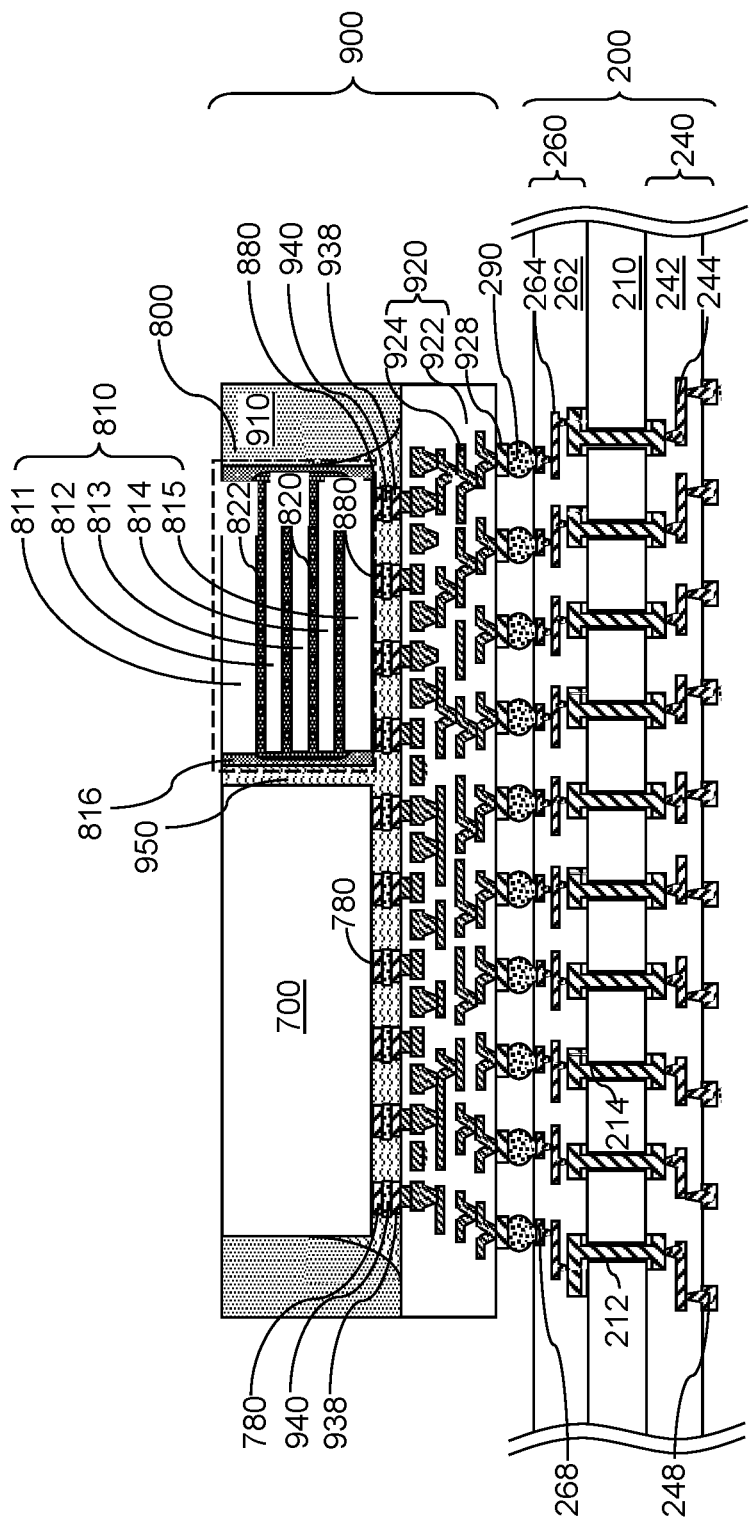
FIG. 11 is a vertical cross-sectional view of an intermediate structure after attaching the fan-out package to a package substrate according to an embodiment of the present disclosure.

FIG. 11 is a vertical cross-sectional view of an intermediate structure after attaching the fan-out package 900 to a package substrate according to an embodiment of the present disclosure. Referring to FIG. 11, second solder material portions 290 may be attached to the fan-out bonding pads 928. A package substrate 200 may be bonded to the fan-out package 900 through the second solder material portions 290. The package substrate 200 may be a cored package substrate including a core substrate 210, or a coreless package substrate that does not include a package core. Alternatively, the package substrate 200 may include a system-on-integrated package substrate (SoIS) including redistribution layers and/or dielectric interlayers, at least one embedded interposer (such as a silicon interposer). Such a system-integrated package substrate may include layer-to-layer interconnections using bonding material portions, underfill material portions (such as molded underfill material portions), and/or an optional adhesion film (not shown). While the present disclosure is described using an substrate package, it is understood that the scope of the present disclosure is not limited by any particular type of substrate package and may include an SoIS. Other substrate packages are within the contemplated scope of disclosure. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC 240 may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the package substrate 200 includes a chip-side surface laminar circuit 260 comprising chip-side wiring interconnects 264 connected to an array of chip-side bonding pads 268 that may be bonded to the array of second solder material portions 290, and a board-side surface laminar circuit 240 including board-side wiring interconnects 244 connected to an array of board-side bonding pads 248. The array of board-side bonding pads 248 may be configured to allow bonding through solder balls. The array of chip-side bonding pads 268 may be configured to allow bonding through C4 solder balls. Generally, any type of package substrate 200 may be used. While the present disclosure is described using an embodiment in which the package substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

The second solder material portions 290 attached to the fan-out bonding pads 928 of the fan-out package 900 may be disposed on the array of the chip-side bonding pads 268 of the package substrate 200. A reflow process may be performed to reflow the second solder material portions 290, thereby inducing bonding between the fan-out package 900 and the package substrate 200. In one embodiment, the second solder material portions 290 may include C4 solder balls, and the fan-out package 900 may be attached to the package substrate 200 using an array of C4 solder balls. Generally, a second array of metallic joint structures may be formed. Each metallic joint structure may comprise a first metal pad structure (such as a chip-side bonding pad 268), a second metal pad structure (such as a fan-out bonding pad 928), and a bump material portion (such as a second solder material portion 290).

Figure 12A:
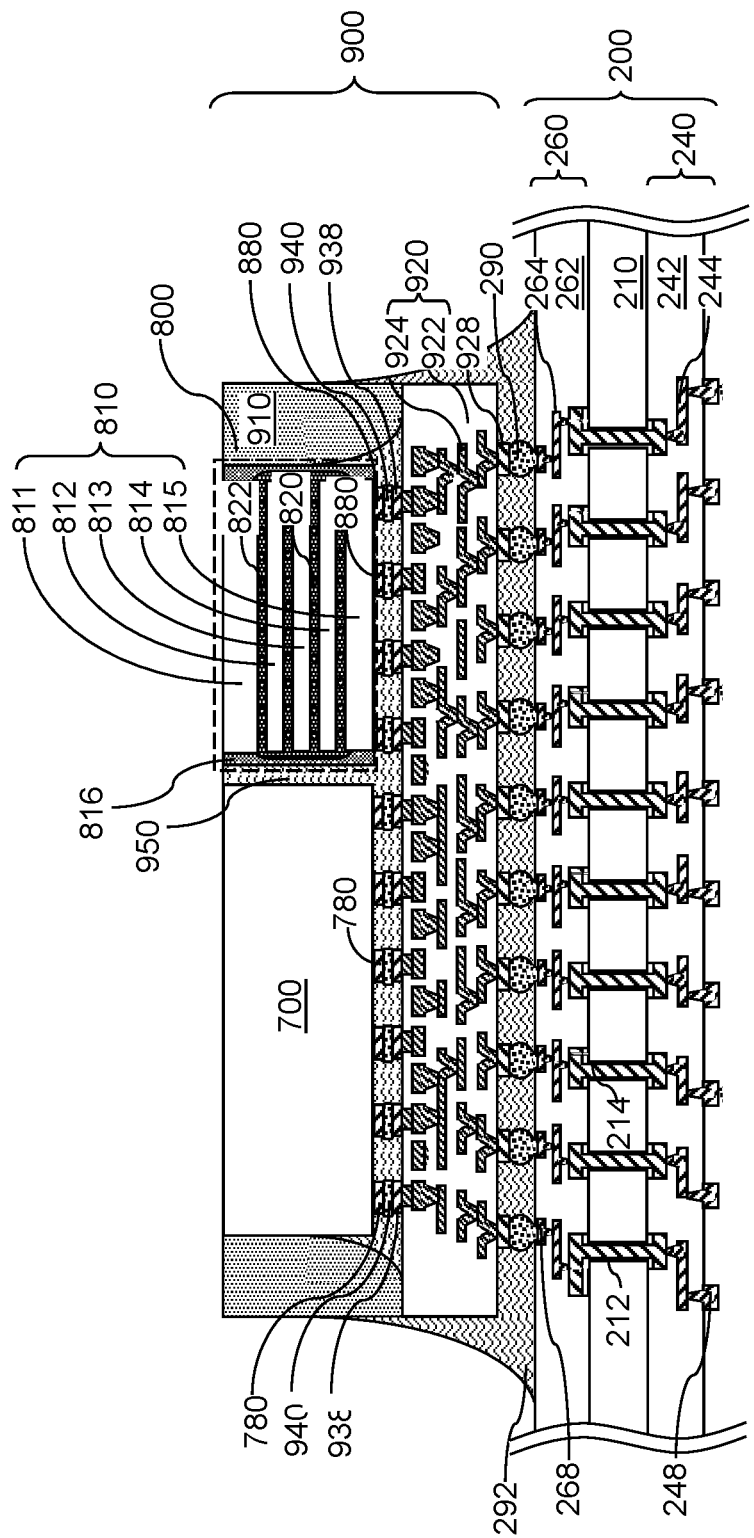
FIG. 12A is a vertical cross-sectional view of the intermediate structure after formation of a second underfill material portion according to an embodiment of the present disclosure.
Figure 12B:
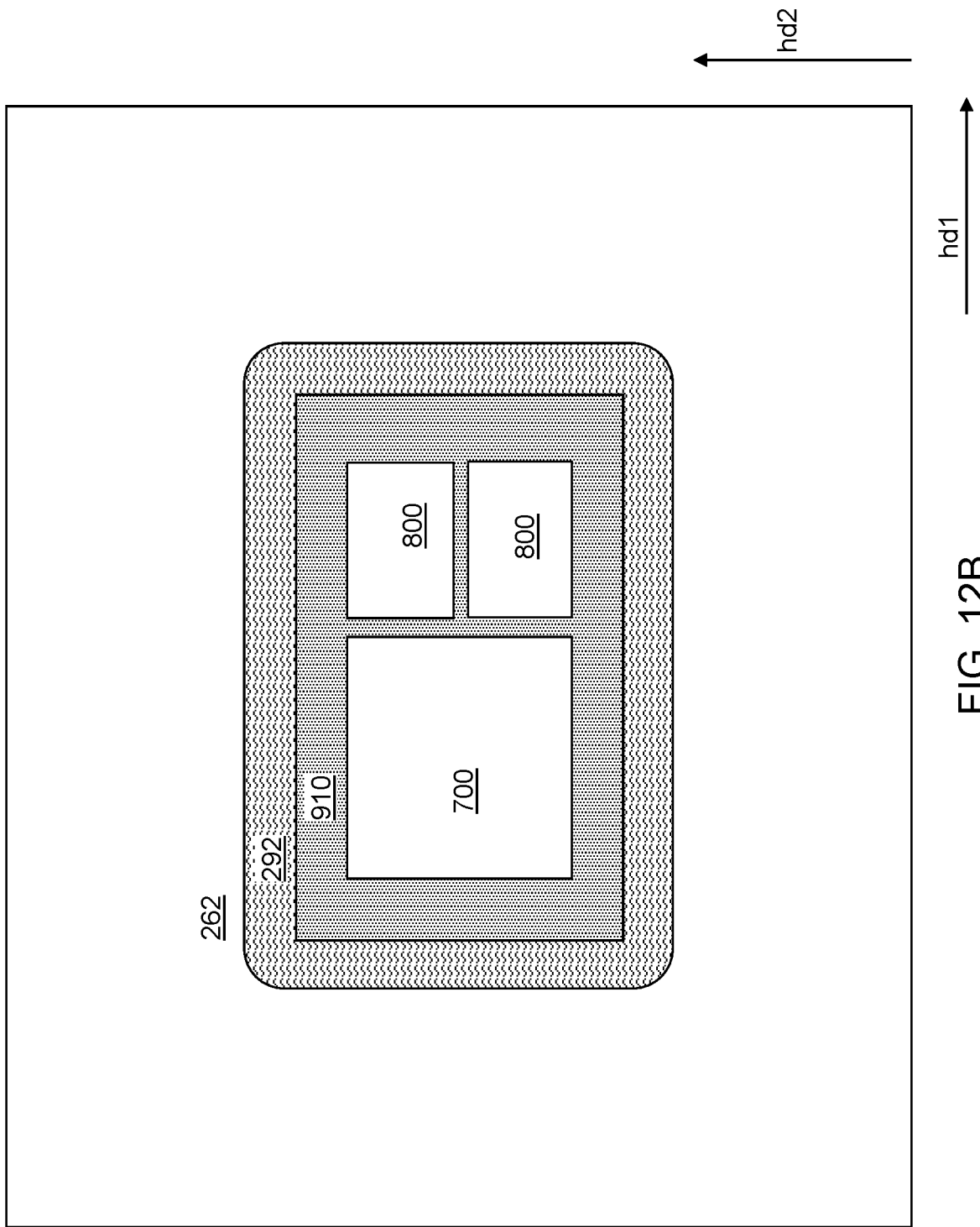
FIG. 12B is a top-down view of the structure of FIG. 12A according to an embodiment of the present disclosure.

FIG. 12A is a vertical cross-sectional view of the intermediate structure after formation of a second underfill material portion according to an embodiment of the present disclosure. FIG. 12B is a top-down view of the structure of FIG. 12A according to an embodiment of the present disclosure. Referring to FIG. 12, a second underfill material portion 292 may be formed around the second solder material portions 290 by applying and shaping a second underfill material. The second underfill material portion 292 may be formed around the second solder material portions 290 by applying and shaping the second underfill material. The second underfill material portion 292 may be formed by injecting the second underfill material around the array of second solder material portions 290 after the second solder material portions 290 are reflowed. Any known underfill material application method may be used, which may be, for example, the capillary underfill method, the molded underfill method, or the printed underfill method.

The second underfill material portion 292 may be formed between the redistribution structure 920 and the package substrate 200. According to an aspect of the present disclosure, the second underfill material portion 292 may be formed directly on each sidewall of the molding compound die frame 910.

The second underfill material portion 292 may contact each of the second solder material portions 290 (which may be C4 solder balls or C2 solder caps), and may contact vertical sidewalls of the fan-out package 900. The second underfill material portion may be formed between the redistribution structure 920 and the package substrate 200. The second underfill material portion may laterally surround, and contact, the array of second solder material portions 290 and the fan-out package 900.

In one embodiment, the second underfill material portion 292 may include tapered sidewalls that extend continuously from a respective sidewall of the molding compound die frame 910 to a planar surface (such as the top surface) of the package substrate 200. The taper angle of the tapered sidewalls may be in a range from 10 degrees to 80 degrees, such as from 30 degrees to 60 degrees, although lesser and greater taper angles may also be used. The taper angle may, or may not, be uniform. For example, exposed outermost surfaces of the second underfill material portion 292 surrounding vertical sidewalls of the fan-out package 900 may have a curved or concave shape with varying taper angles formed as a result of the deposition process. In one embodiment, the tapered sidewalls may have a same taper angle (as measured from a vertical direction) throughout.

Figure 13A:
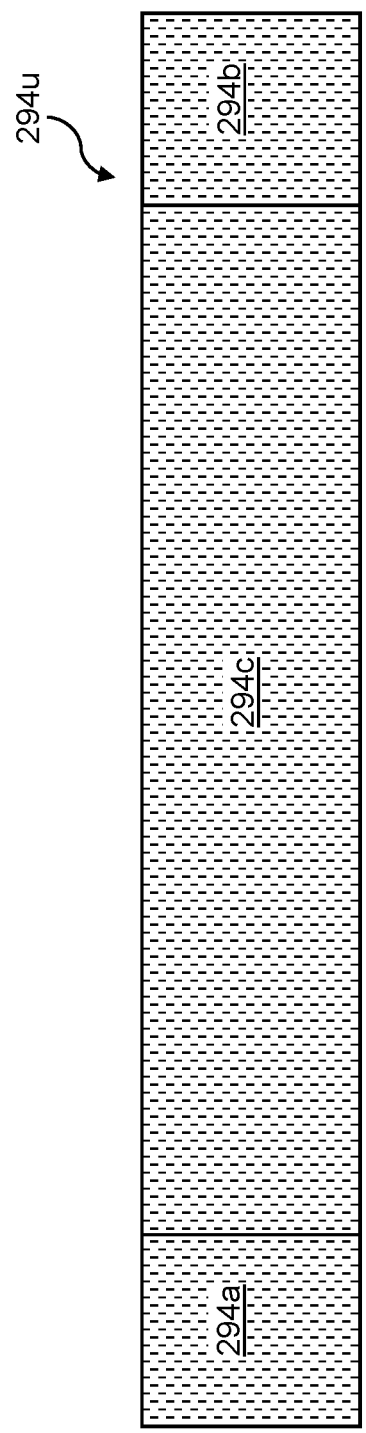
FIG. 13A is a vertical cross-sectional view of a stiffener structure according to an embodiment of the present disclosure.
Figure 13B:
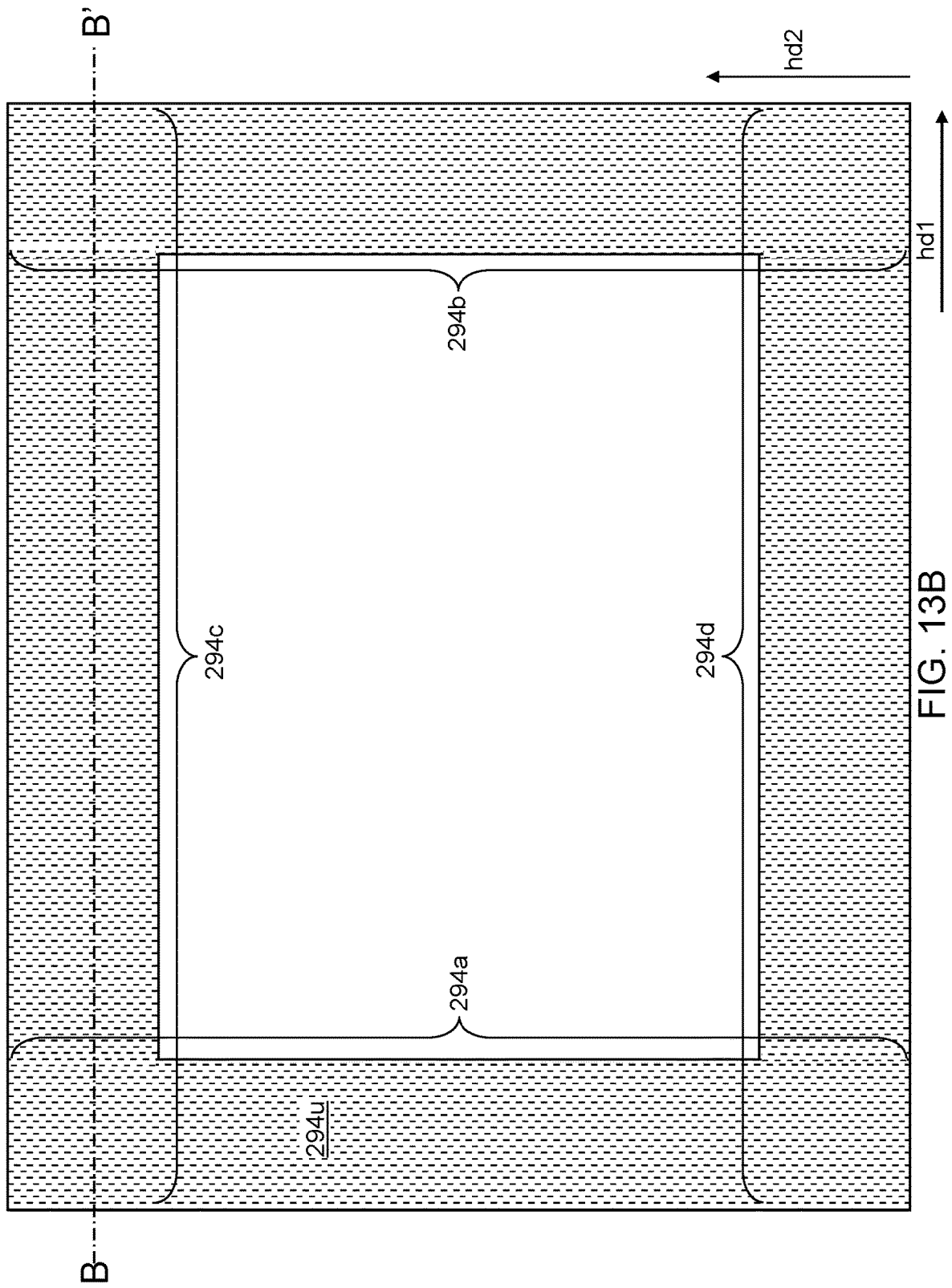
FIG. 13B is a top-down view of the stiffener structure of FIG. 13A according to an embodiment of the present disclosure.

FIG. 13A is a vertical cross-sectional view of an stiffener structure according to an embodiment of the present disclosure. FIG. 13B is a top-down view of the stiffener structure of FIG. 13A according to an embodiment of the present disclosure. The vertical cross sectional view in FIG. 13A is along line BB' in FIG. 13B. Referring to FIGS. 13A and 13B, an unbeveled stiffener structure 294u is illustrated. The unbeveled stiffener structure 294u may be formed to have a first wall portion 294a, a second wall portion 294b, a third wall portion 294c, and a fourth wall portion 294d. The unbeveled stiffener structure 294u may be formed using a molding process. In some embodiments, the unbeveled stiffener structure 294u may be formed as a single piece without a hollowed-out center, and a beveling or drilling tool may be used to hollow out a middle area to form the first wall portion 294a, second wall portion 294b, third wall portion 294c, and fourth wall portion 294d. In some embodiments, the unbeveled stiffener structure 294u may be formed through a molding process to have a hollowed-out middle area. The unbeveled stiffener structure 294u may be formed using one or more materials. For example, the unbeveled stiffener structure 294u may be formed using copper with nickel coating or aluminum alloys, metals such as copper, brass, stainless steel, and aluminum, copper tungsten, ceramic materials, materials containing silicon, composite alloys, polymers, and plastics.

The first wall portion 294a may extend in a second horizontal direction hd2 to connect to ends of the third wall portion 294c and the fourth wall portion 294d. The second wall portion 294b may extend in the second horizontal direction hd2 to connect to ends of the third wall portion 294c and the fourth wall portion 294d. The third wall portion 294c may extend in a first horizontal direction hd1 to connect to ends of the first wall portion 294a and the second wall portion 294b. The fourth wall portion 294d may extend in the first horizontal direction hd1 to connect to ends of the first wall portion 294a and the second wall portion 294b.

Figure 14A:
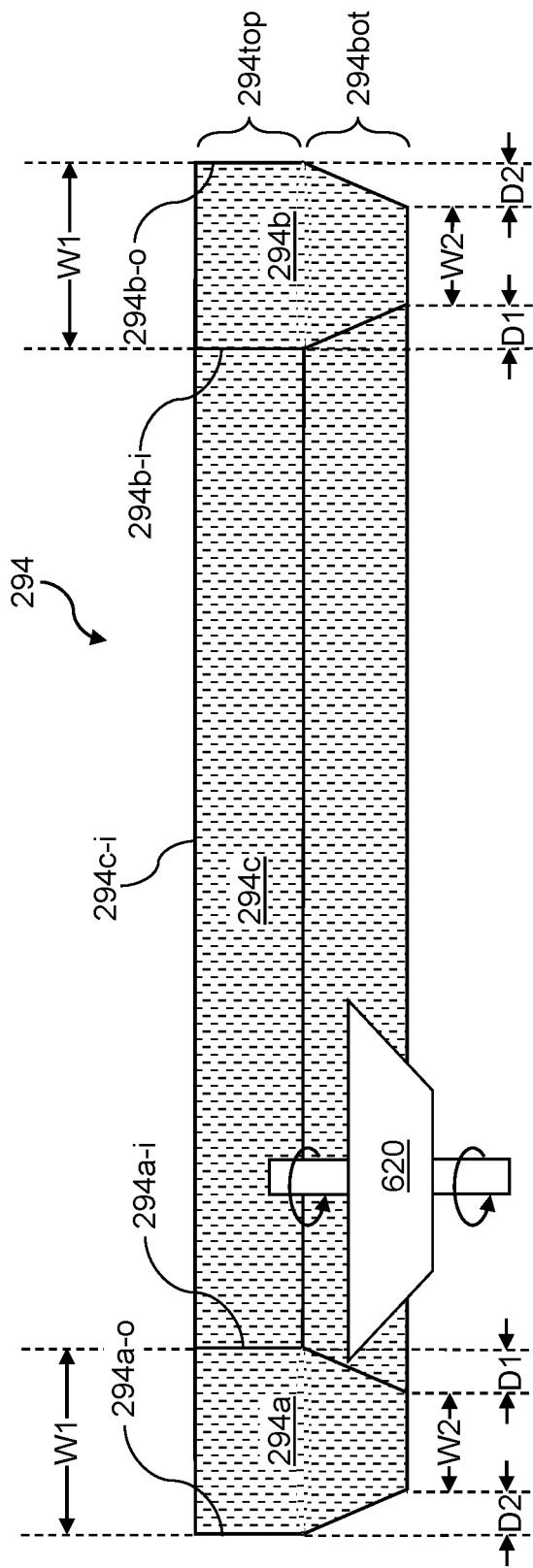
FIG. 14A is a vertical cross-sectional view of the stiffener structure after beveling the stiffener structure according to an embodiment of the present disclosure.
Figure 14B:
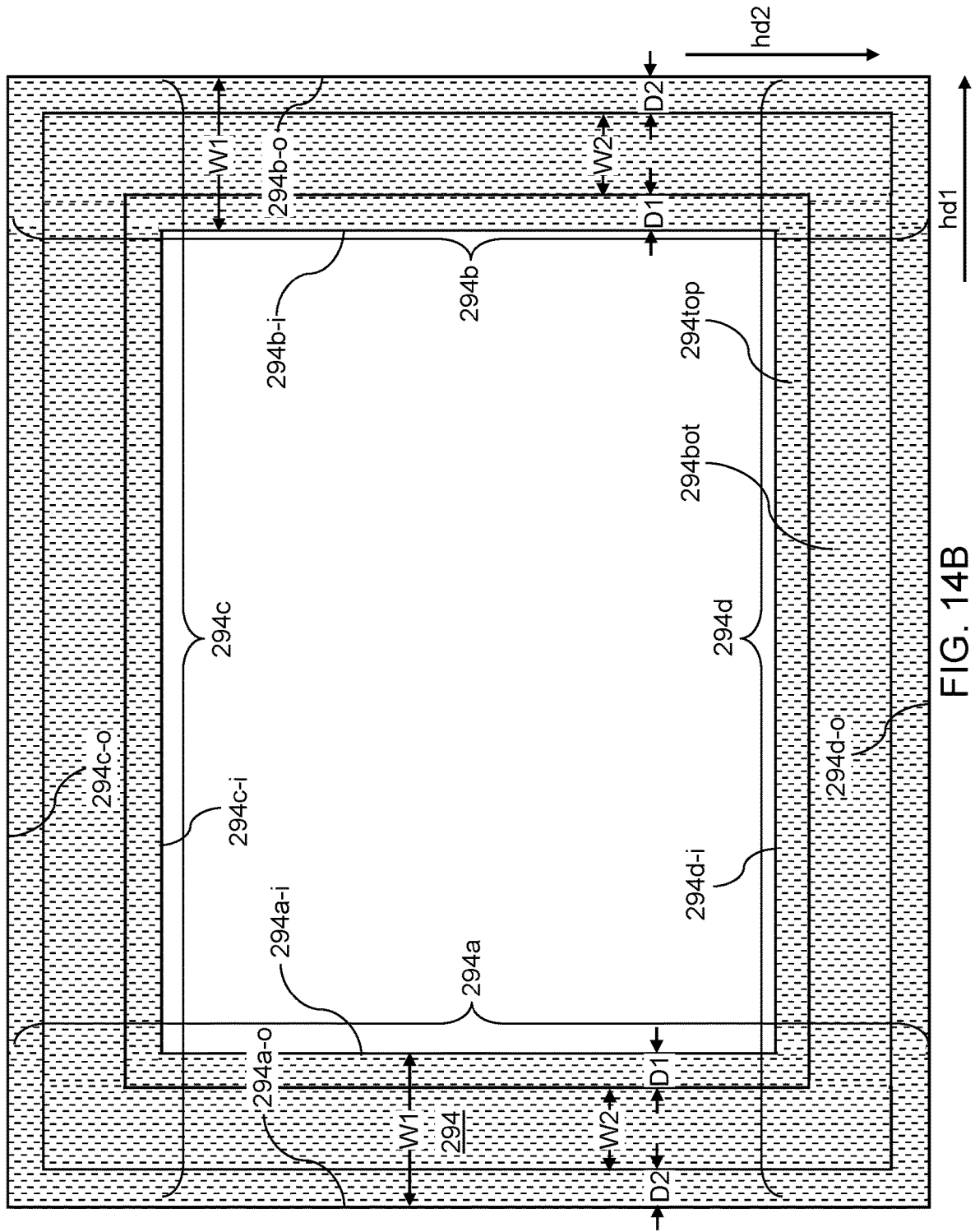
FIG. 14B is a bottom-up view of the beveled stiffener structure of FIG. 14A according to an embodiment of the present disclosure.

FIG. 14A is a vertical cross-sectional view of the stiffener structure of FIGS. 13A and 13B after beveling the stiffener structure according to an embodiment of the present disclosure. FIG. 14B is a bottom-up view of the beveled stiffener structure of FIG. 14A according to an embodiment of the present disclosure. Referring to FIGS. 14A and 14B, a beveled stiffener structure 294 is illustrated. Portions of the first wall portion 294a, second wall portion 294b, third wall portion 294c, and fourth wall portion 294d may be cut, drilled, beveled, or milled using a milling apparatus 620 to form at least one tapered sidewall.

The milling apparatus 620 may be used to form at least one tapered sidewall on at least one of the inner sidewalls and outer sidewalls of the first wall portion 294a, second wall portion 294b, third wall portion 294c, and fourth wall portion 294d of the beveled stiffener structure 294. For illustrative purposes, the beveled stiffener structure 294 includes beveled inner and outer sidewalls along each wall portion 294a-294d. However, fewer sidewalls may be beveled depending on the application.

In some embodiments, the beveled stiffener structure 294 may include a bottom portion 294bot and a top portion 294top. The bottom portion 294bot may include the portion of the beveled stiffener structure 294 that is beveled using the milling apparatus 620. The bottom portion 294bot may include tapered inner and outer sidewalls. The top portion 294top may include the portion of the beveled stiffener structure 294 that was not beveled. As illustrated, the bottom portion 294bot is a beveled portion having a height that is equal to the height of the top portion 294top. However, in some embodiments, the heights of the bottom portion 294bot and the top portion 294top may be different, such that at least one tapered sidewall on the bottom portion 294bot may have a vertical height that less than or greater than the vertical non-tapered sidewall of the top portion 294top.

The beveled stiffener structure 294 may include a first inner sidewall 294a-i and a first outer sidewall 294a-o of the first wall portion 294a, a second inner sidewall 294b-i and a second outer sidewall 294b-o of the second wall portion 294b, a third inner sidewall 294c-i and a third outer sidewall 294c-o of the third wall portion 294c, and a fourth inner sidewall 294d-i and a fourth outer sidewall 294d-o of the fourth wall portion 294d. The first inner sidewall 294a-i, second inner sidewall 294b-i, third inner sidewall 294c-i, and fourth inner sidewall 294d-i may be collectively referred to as the inner sidewalls 294a-i-294d-i, and may form an inner rectangularly-shaped ring of the beveled stiffener structure 294. The first outer sidewall 294a-o, second outer sidewall 294b-o, third outer sidewall 294c-o, and fourth outer sidewall 294d-o may be collectively referred to as the outer sidewalls 294a-o-294d-o, and may form an outer rectangularly-shaped ring of the beveled stiffener structure 294 that surrounds the inner sidewalls 294a-i-294d-i.

The inner sidewalls 294a-i-294d-i may each include a tapered sidewall within the bottom portion 294bot and a vertically-extending sidewall within the top portion 294top, in which each vertically-extending sidewall is connected to each tapered sidewall to form each of the inner sidewalls 294a-i-294d-i. The outer sidewalls 294a-o-294d-o may each include a tapered sidewall within the bottom portion 294bot and a vertically-extending sidewall within the top portion 294top, in which each vertically-extending sidewall is connected to each tapered sidewall to form each of the outer sidewalls 294a-o-294d-o.

The tapered sidewalls may have a taper angle with respect to a horizontal plane (e.g., bottom surface of the bottom portion 294bot) that may be in a range from 1 degree to 89 degrees, such as from 30 degrees to 60 degrees, although lesser and greater taper angles may also be used. The taper angle may, or may not, be uniform across each and all tapered sidewalls. The taper angles of the inner sidewalls 294a-i-294d-i and the outer sidewalls 294a-o-294d-o may be equivalent as illustrated. However, in some embodiments, the taper angles of the inner sidewalls 294a-i-294d-i may be different than the taper angles of the outer sidewalls 294a-o-294d-o. In some embodiments, the taper angles of one or more of the inner sidewalls 294a-i-294d-i may be different from each other. In some embodiments, the taper angles of the outer sidewalls 294a-o-294d-o may be different from each other.

A top portion of the top portion 294top (i.e., top surface of the top portion 294top) along the wall portions 294a-294d may have a first width W1. A bottom portion of the bottom portion 294bot (i.e., bottom surface of the bottom portion 294bot) along the wall portions 294a-294d may have a second width W2. The first width W1 may be greater than the second width W2. The first width W1 may also be referred to as the horizontal distance between an inner sidewall and an outer sidewall within the top portion 294top. For example, the first wall portion 294a and the second wall portion 294b may have a first width W1 in a first horizontal direction hd1, and the third wall portion 294c and the fourth wall portion 294d may have a first width W1 in a second horizontal direction hd2. As illustrated, the widths of each wall portion 294a-294d are equivalent, However, in some embodiments, the widths of each wall portion 294a-294d may vary. The second width W2 may also be referred to as the horizontal distance between an inner sidewall and an outer sidewall at a bottom portion of the bottom portion 294bot. For example, the first wall portion 294a and the second wall portion 294b may have a second width W2 in a first horizontal direction hd1, and the third wall portion 294c and the fourth wall portion 294d may have a second width W2 in a second horizontal direction hd2. As illustrated, the widths of each wall portion 294a-294d are equivalent. However, in some embodiments in which the heights and the taper angles of each sidewall vary, the widths of each wall portion 294a-294d may each also vary.

In some embodiments, the first width W1 may be in a range of 2 to 25 millimeters, such as 5 to 15 millimeters, although lesser or greater widths may be used. In some embodiments, the second width W2 may be in a range of 2 to 25 millimeters, such as 5 to 15 millimeters, although lesser or greater widths may be used.

The second width W2 may be vertically offset from the first width W1 by a first distance D1 and a second distance D2, in which the first distance D1 is a horizontal distance between a bottom edge of an inner sidewall (e.g., inner sidewalls 294a-i-294d-i) and a top edge of the same inner sidewall, and in which the second distance D2 is a horizontal distance between a bottom edge of an outer sidewall (e.g., outer sidewalls 294a-o-294d-o) and a top edge of the same outer sidewall. In other words, the first distance D1 is equivalent to the maximum horizontal distance beveled out at an inner sidewall (e.g., inner sidewalls 294a-i-294d-i), the second distance D2 is equivalent to the maximum horizontal distance beveled out at an inner sidewall (e.g., inner sidewalls 294a-i-294d-i), and the first width W1 is equivalent to the combined horizontal distances of the second width W2, the first distance D1, and the second distance D2. For example, a top edge of the first inner sidewall 294a-i may be offset from a bottom edge of the first inner sidewall 294a-i by the first distance D1, and a top edge of the first outer sidewall 294*a-o* may be offset from a bottom edge of the first outer sidewall 294*a-o* by the second distance D2. The first distance D1 may be the same or different from the second distance D2.

In some embodiments, the first horizontal distance D1 may be in a range greater than 0 millimeters and less than or equal to 10 millimeters, such as 2 to 8 millimeters, and the second horizontal distance D1 may be in a range of 0 to 10 millimeters, such as 2 to 8 millimeters, although lesser or greater distances may also be used. For example, embodiments described hereinafter may have the second distance D1 equal to 0, and therefore the outer sidewalls 294*a-o*-294*d-o* would have no tapered portion, and the outer sidewalls 294*a-o*-294*d-o* would therefore be a singular continuous vertical planar line extending through both the top portion 294*top* and the bottom portion 294*bot*.

Figure 15A:
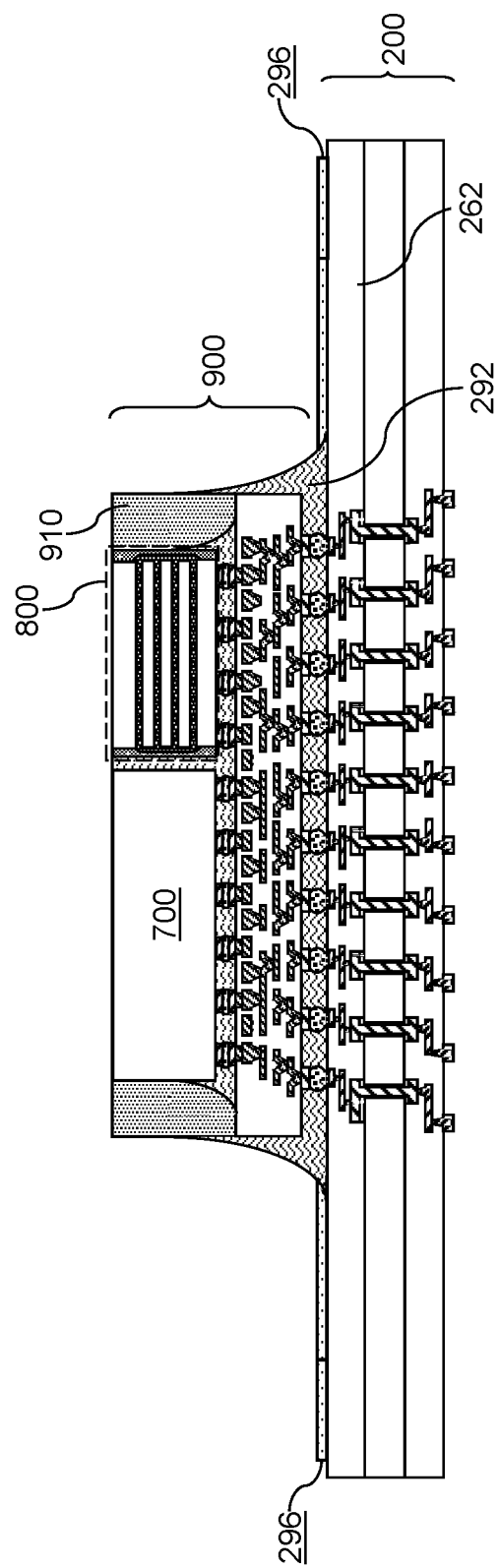
FIG. 15A is a vertical cross-sectional view of the intermediate structure after formation of an adhesive layer according to an embodiment of the present disclosure.
Figure 15B:
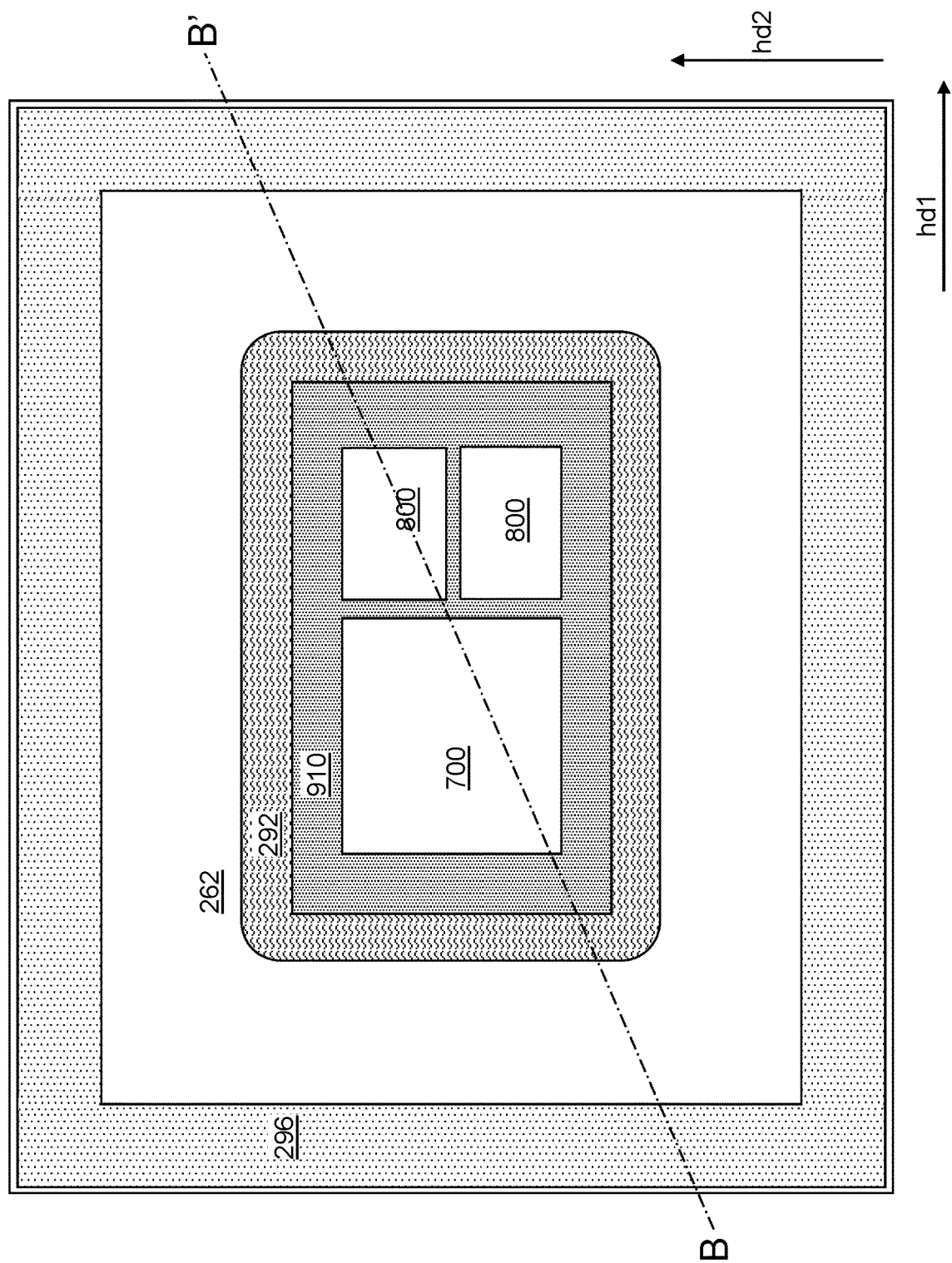
FIG. 15B is a top-down view of the structure of FIG. 15A according to an embodiment of the present disclosure.

FIG. 15A is a vertical cross-sectional view of the intermediate structure after formation of an adhesive layer according to an embodiment of the present disclosure. FIG. 15B is a top-down view of the structure of FIG. 15A according to an embodiment of the present disclosure. The vertical cross sectional view in FIG. 15A is along line BB' in FIG. 15B. Referring to FIGS. 15A and 15B, an adhesive layer 296 may be formed on a top surface of the package substrate 200 (e.g., on a top surface of the chip-side insulating layers 262). The adhesive layer 296 may be placed, deposited, or otherwise formed as a ring structure surrounding the fan-out package 900. In some embodiments, the adhesive layer 296 may include silicon-based materials. The adhesive layer 296 may be formed to attach the beveled stiffener structure 294 to the package substrate.

Figure 16:
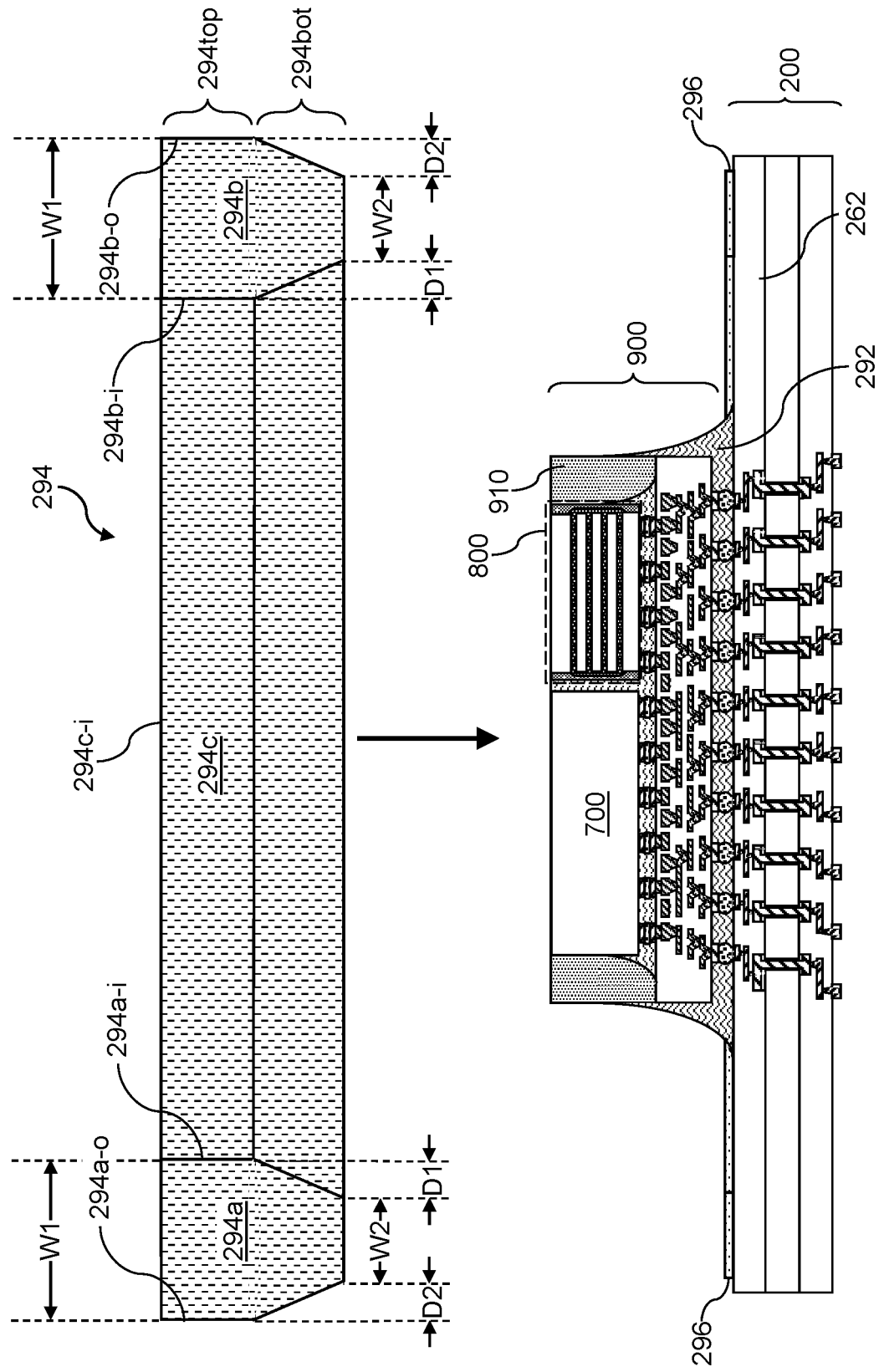
FIG. 16 is a vertical cross-sectional view of the intermediate structure during the process of attaching the beveled stiffener structure according to an embodiment of the present disclosure.

FIG. 16 is a vertical cross-sectional view of the intermediate structure during the process of attaching the beveled stiffener structure according to an embodiment of the present disclosure. Referring to FIG. 16, the process of aligning and attaching a bottom surface of the beveled stiffener structure 294 with a top surface of the adhesive layer 296 is illustrated. In some embodiments, a width of the adhesive layer 296 along the wall portions 294*a*-294*d* may be equivalent to the second width W2. In some embodiments, a width of the adhesive layer 296 along the wall portions 294*a*-294*d* may be less than or greater than the second width W2.

Figure 17A:
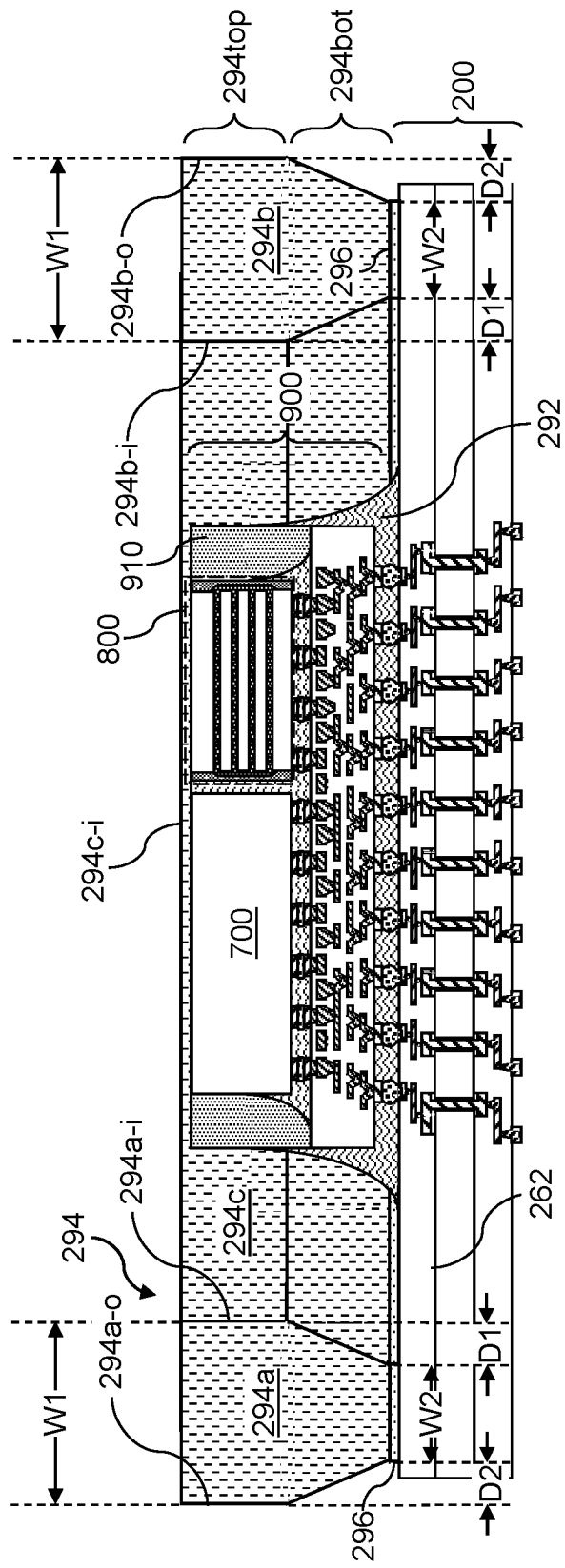
FIG. 17A is a vertical cross-sectional view of the intermediate structure after attaching the beveled stiffener structure according to an embodiment of the present disclosure.
Figure 17B:
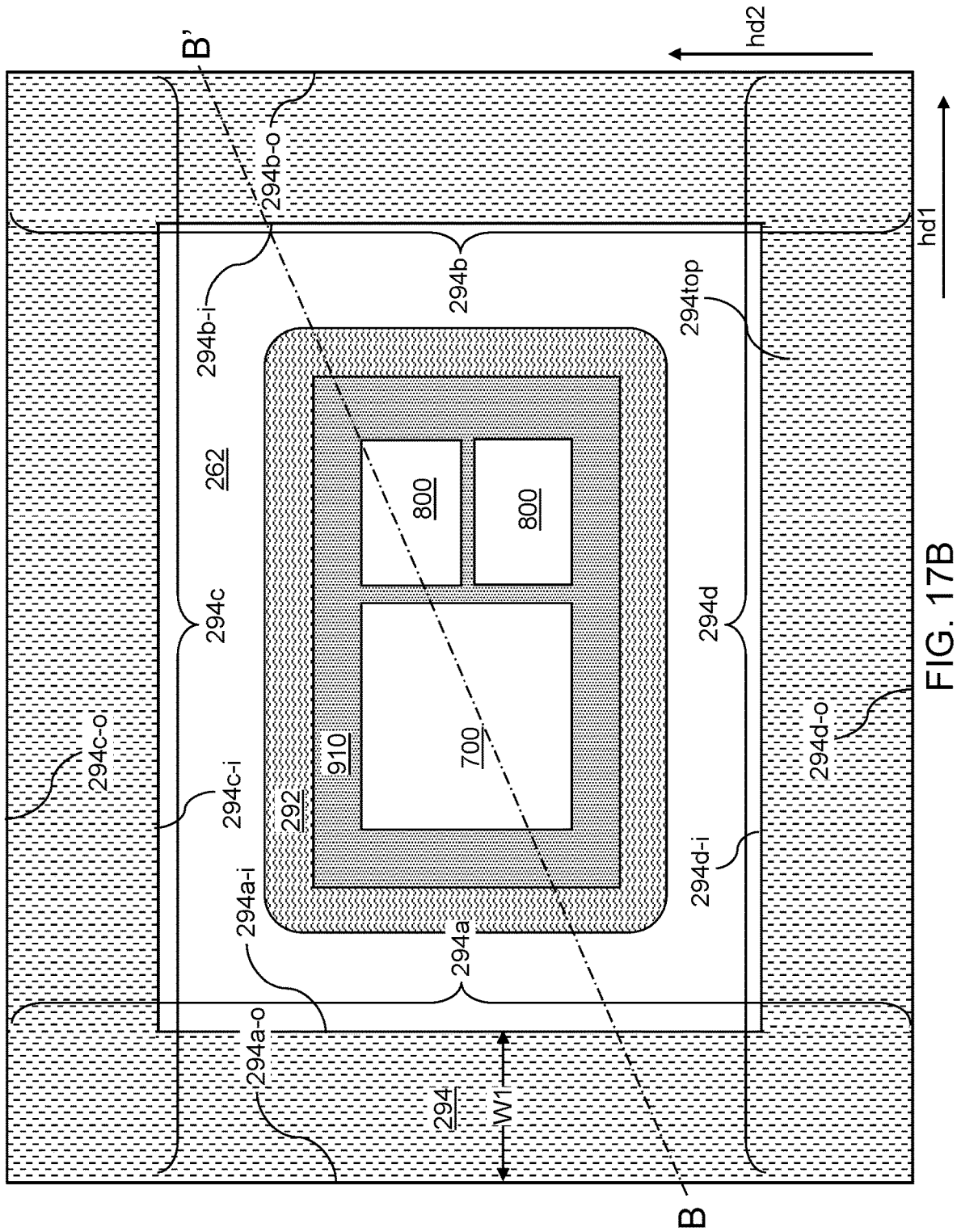
FIG. 17B is a top-down view of the structure of FIG. 17A according to an embodiment of the present disclosure.

FIG. 17A is a vertical cross-sectional view of the intermediate structure after attaching the beveled stiffener structure according to an embodiment of the present disclosure. FIG. 17B is a top-down view of the structure of FIG. 17A according to an embodiment of the present disclosure. The vertical cross sectional view in FIG. 17A is along line BB' in FIG. 17B. Referring to FIGS. 17A and 17B, the beveled stiffener structure 294 is attached to the package substrate via the adhesive layer 296. The bottom portion 294*bot* may be affixed or otherwise attached to a top surface of the adhesive later 296. The beveled stiffener structure 294 may be attached to the assembly of the fan-out package 900 and the package substrate 200 to reduce deformation of the assembly during subsequent processing steps and/or during usage of the assembly.

The beveled stiffener structure 294, a component of the chip package structure including the fan-out package 900 and the package substrate 200, may include at least one tapered sidewall.

The beveled stiffener structure 294 may include at least one innermost tapered sidewall proximate to at least one respective outermost sidewall of the fan-out package 900, in which the innermost tapered sidewall is tapered outward from the fan-out package in a direction towards the package substrate. For example, a first innermost tapered sidewall (e.g., first inner sidewall 294*a-i* within bottom portion 294bot), may be proximate to a first outermost sidewall of the fan-out package 900, in which the first innermost tapered sidewall is tapered outward from the fan-out package 900 in a direction towards the package substrate 200. As another example, a second innermost tapered sidewall (e.g., second inner sidewall 294*b-i* within bottom portion 294bot), may be proximate to a second outermost sidewall of the fan-out package 900, in which the second innermost tapered sidewall is tapered outward from the fan-out package 900 in a direction towards the package substrate 200, and in which the second innermost tapered sidewall is a distal sidewall from the first innermost tapered sidewall such that the fan-out package 900 is positioned between the first innermost tapered sidewall and the second innermost tapered sidewall. As a further example, a third innermost tapered sidewall (e.g., third inner sidewall 294*c-i* within bottom portion 294bot), may be proximate to a third outermost sidewall of the fan-out package 900, in which the third innermost tapered sidewall is tapered outward from the fan-out package 900 in a direction towards the package substrate 200. As another further example, a fourth innermost tapered sidewall (e.g., fourth inner sidewall 294*d-i* within bottom portion 294bot), may be proximate to a fourth outermost sidewall of the fan-out package 900, in which the fourth innermost tapered sidewall is tapered outward from the fan-out package 900 in a direction towards the package substrate 200, and in which the fourth innermost tapered sidewall is a distal sidewall from the third innermost tapered sidewall such that the fan-out package 900 is positioned between the third innermost tapered sidewall and the fourth innermost tapered sidewall.

The beveled stiffener structure 294 may include at least one outermost tapered sidewall proximate to at least one respective innermost tapered sidewall (i.e., on an opposite side of a respective inner sidewall along the wall portions 294*a*-294*d*), in which the outermost tapered sidewall is tapered inwards towards the fan-out package 900 in a direction towards the package substrate 200. For example, a first outermost tapered sidewall (e.g., first outer sidewall 294*a-o* within bottom portion 294*bot*), may be proximate to a first innermost tapered sidewall (e.g., first inner sidewall 294*a-i* within bottom portion 294*bot*), in which the first outermost tapered sidewall is tapered inwards towards the fan-out package 900 in a direction towards the package substrate 200. As another example, a second outermost tapered sidewall (e.g., second outer sidewall 294*b-o* within bottom portion 294*bot*), may be proximate to a second innermost tapered sidewall (e.g., second inner sidewall 294*b-i* within bottom portion 294*bot*), in which the second outermost tapered sidewall is tapered inwards towards the fan-out package 900 in a direction towards the package substrate 200, and in which the second outermost tapered sidewall is a distal sidewall from the first outermost tapered sidewall such that the fan-out package 900 is positioned between the first outermost tapered sidewall and the second outermost tapered sidewall. As a further example, a third outermost tapered sidewall (e.g., third outer sidewall 294*c-o* within bottom portion 294*bot*), may be proximate to a third innermost tapered sidewall (e.g., third inner sidewall 294*c-i* within bottom portion 294*bot*), in which the third outermost tapered sidewall is tapered inwards towards the fan-out package 900 in a direction towards the package substrate 200. As another further example, a fourth outermost tapered sidewall (e.g., fourth outer sidewall 294*d-o* within bottom portion 294*bot*), may be proximate to a fourth innermost tapered sidewall (e.g., fourth inner sidewall 294*d-i* within bottom portion 294*bot*), in which the fourth outermost tapered sidewall is tapered inwards towards the fan-out package 900 in a direction towards the package substrate 200, and in which the fourth outermost tapered sidewall is a distal sidewall from the third outermost tapered sidewall such that the fan-out package 900 is positioned between the third outermost tapered sidewall and the fourth outermost tapered sidewall.

Figure 18:
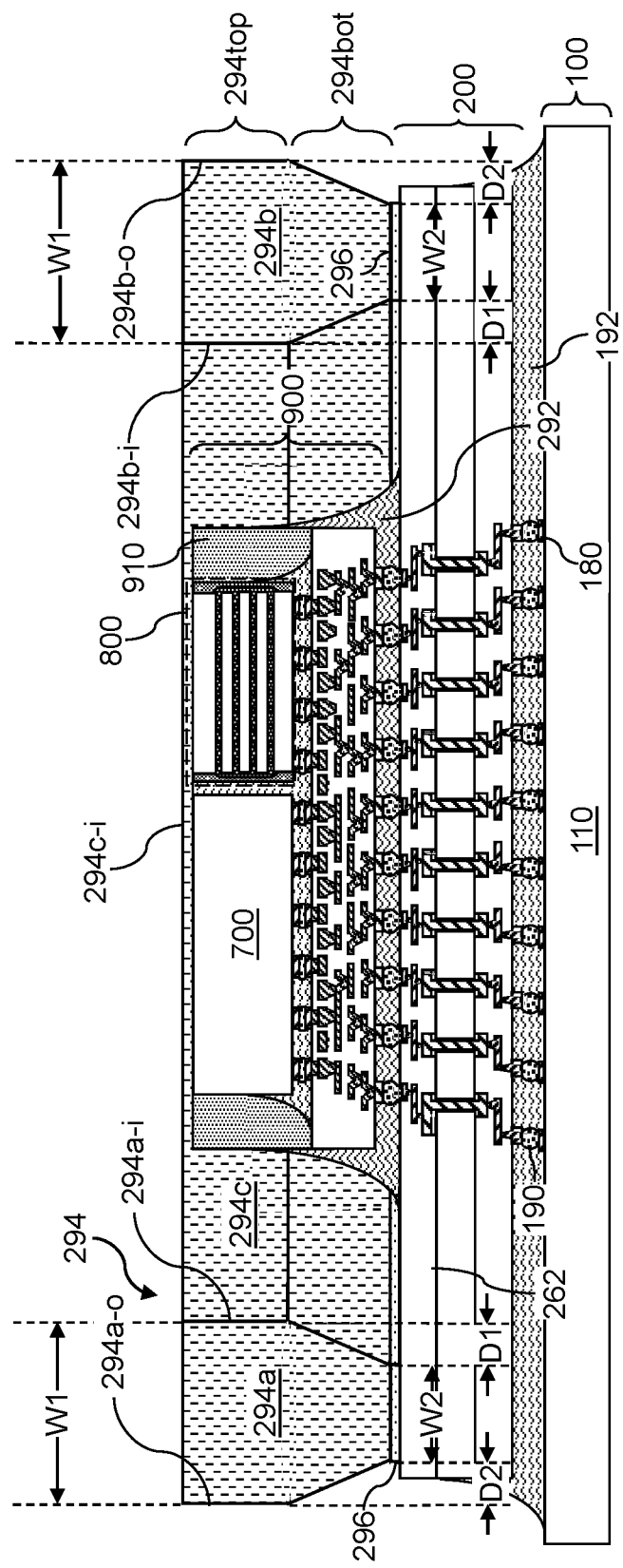
FIG. 18 is a vertical cross-sectional view of the structure after the package substrate is attached to a printed circuit board (PCB) according to an embodiment of the present disclosure.

FIG. 18 is a vertical cross-sectional view of the structure after the package substrate is attached to a printed circuit board (PCB) according to an embodiment of the present disclosure. Referring to FIG. 18, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. Exposed outermost surfaces of the underfill material portion 192 surrounding vertical sidewalls of the package substrate 200 may have a curved or concave shape with varying taper angles formed as a result of the deposition process. The package substrate 200 is attached to the PCB 100 through the array of solder joints 190.

By creating a chip package structure including a beveled stiffener structure 294, embodiments allow for the reduction of a stiffener footprint on top of the package substrate 200 while retaining the structural integrity and support benefits of a stiffener structure or stiffener ring. The beveled stiffener structure 294, through implementation of inner and/or outer tapered sidewalls, frees up additional space above the package substrate 200 while retaining the benefits of a conventional stiffener structure including constraining package warpage. By freeing up additional space above the package substrate 200, a stiffener structure may be reduced in size and may be placed closer to a fan-out package, and/or may allow for additional components (e.g., SMDs) to be mounted on a top surface of the package substrate 200.

Figure 19A:
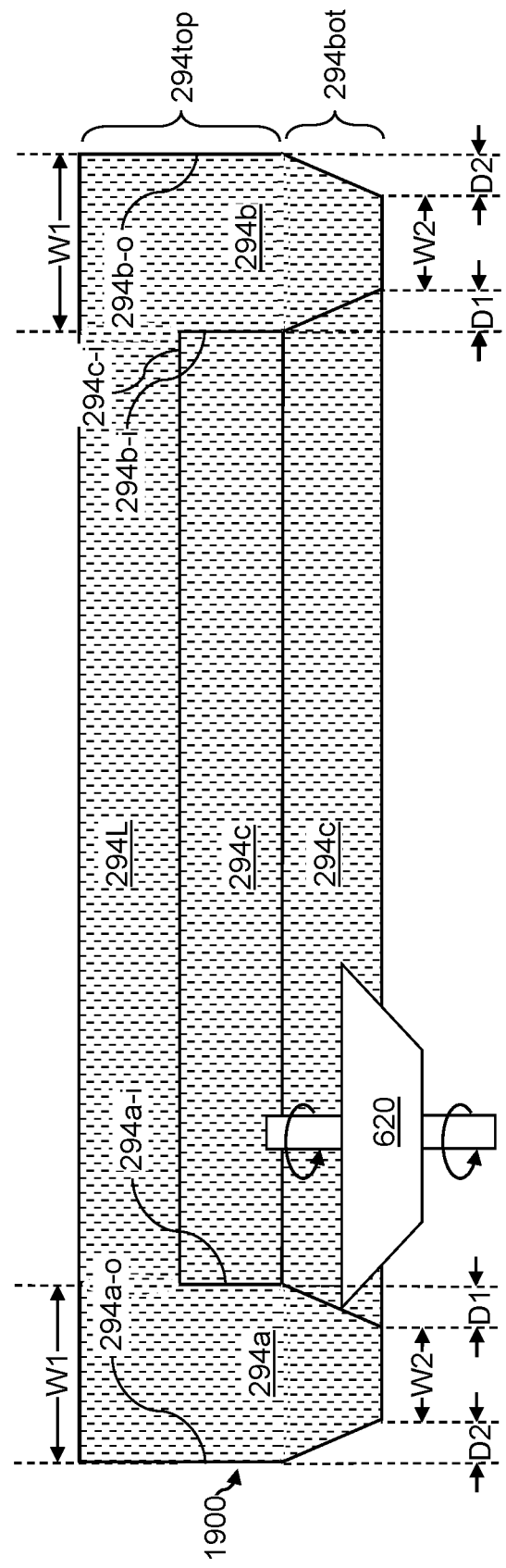
FIGS. 19A and 19B are various views of a first alternative structure after beveling a lid-type stiffener structure according to an embodiment of the present disclosure.
Figure 19B:
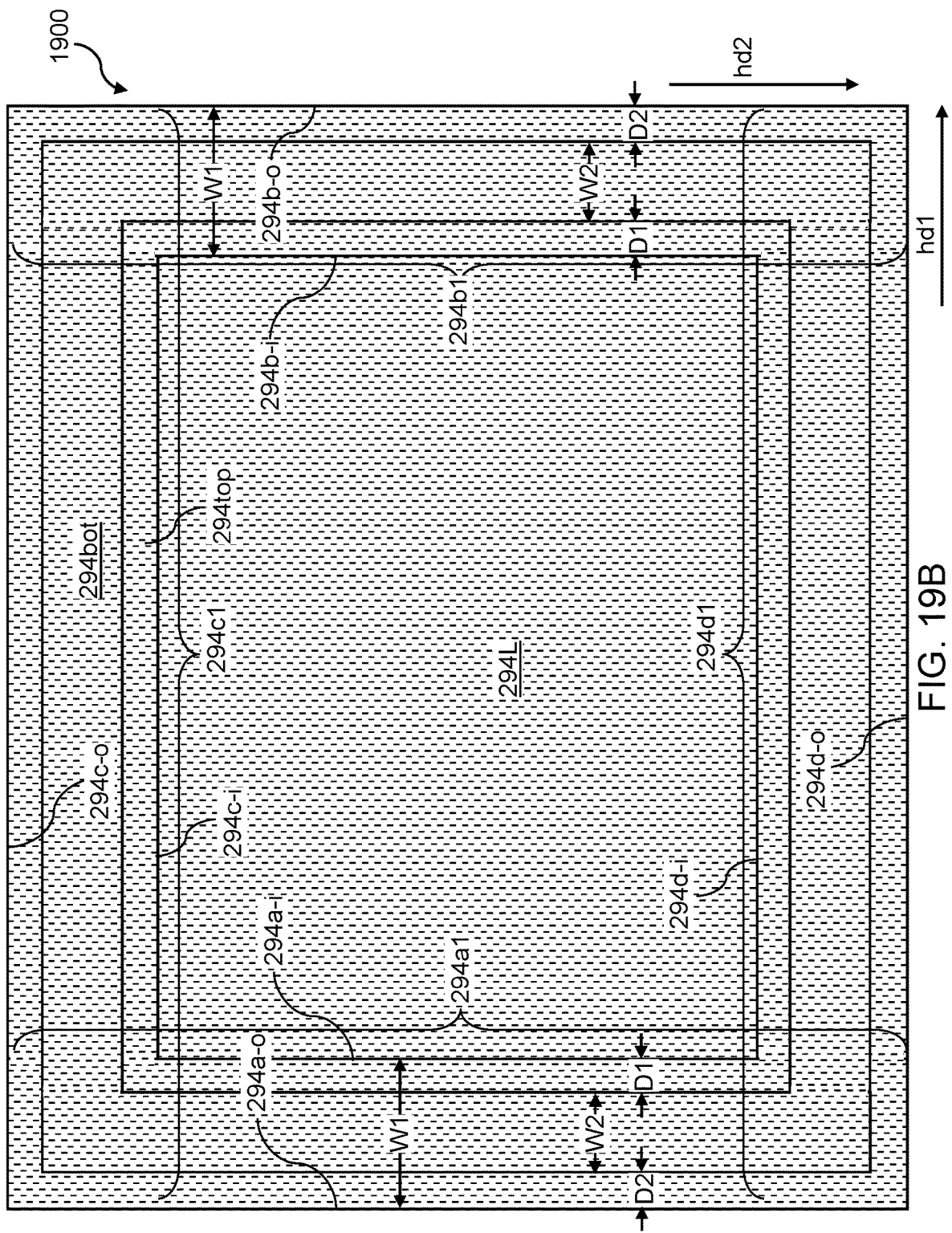

FIGS. 19A and 19B are various views of a first alternative structure after beveling a lid-type stiffener structure according to an embodiment of the present disclosure. FIG. 19A is a vertical cross-sectional view and FIG. 19B is a bottom-up view of FIG. 19A. Referring to FIGS. 19A and 19B, a beveled lid-type stiffener structure 1900 may be formed in a similar manner as the beveled stiffener structure 294 as described with reference to FIGS. 14A and 14B. The beveled lid-type stiffener structure 1900 may include a lid portion 294L covering the beveled-out middle area. The lid portion 294L may be included as part of the top portion 294*top*, and may connect the first wall portion 294*a*, the second wall portion 294*b*, the third wall portion 294*c*, and the fourth wall portion 294*d*.

Figure 20A:
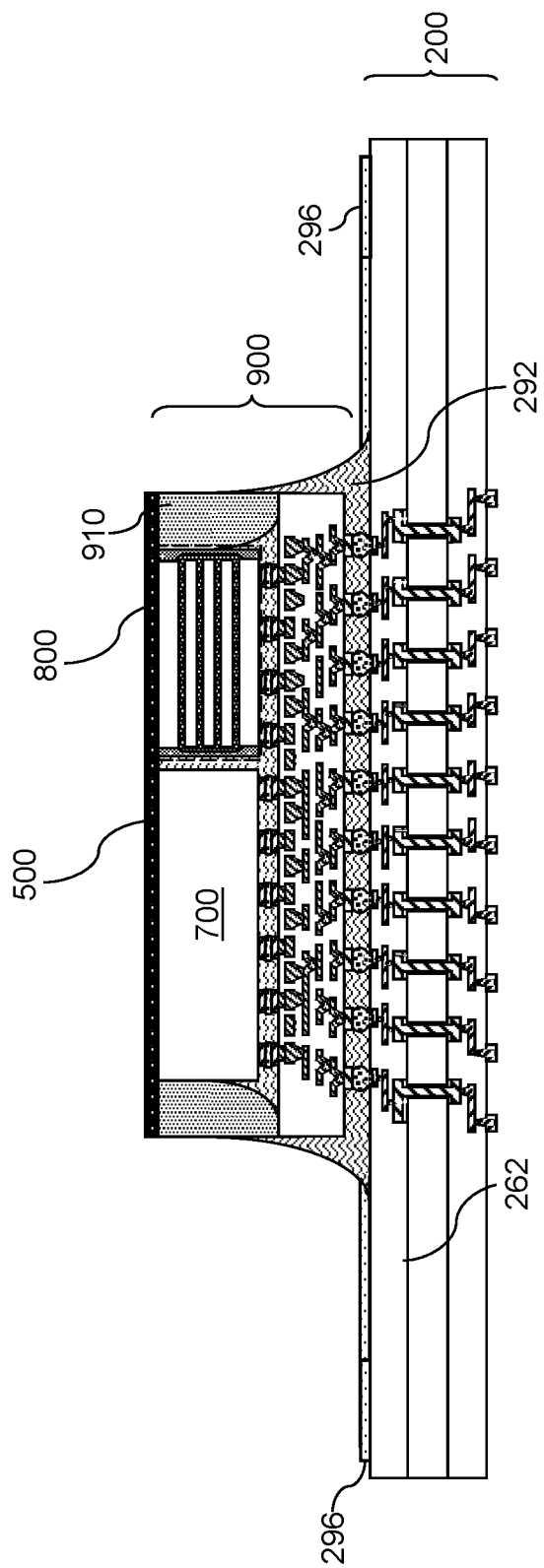
FIGS. 20A and 20B are various views of a first alternative structure after formation of a thermal interface material and an adhesive layer according to an embodiment of the present disclosure.
Figure 20B:
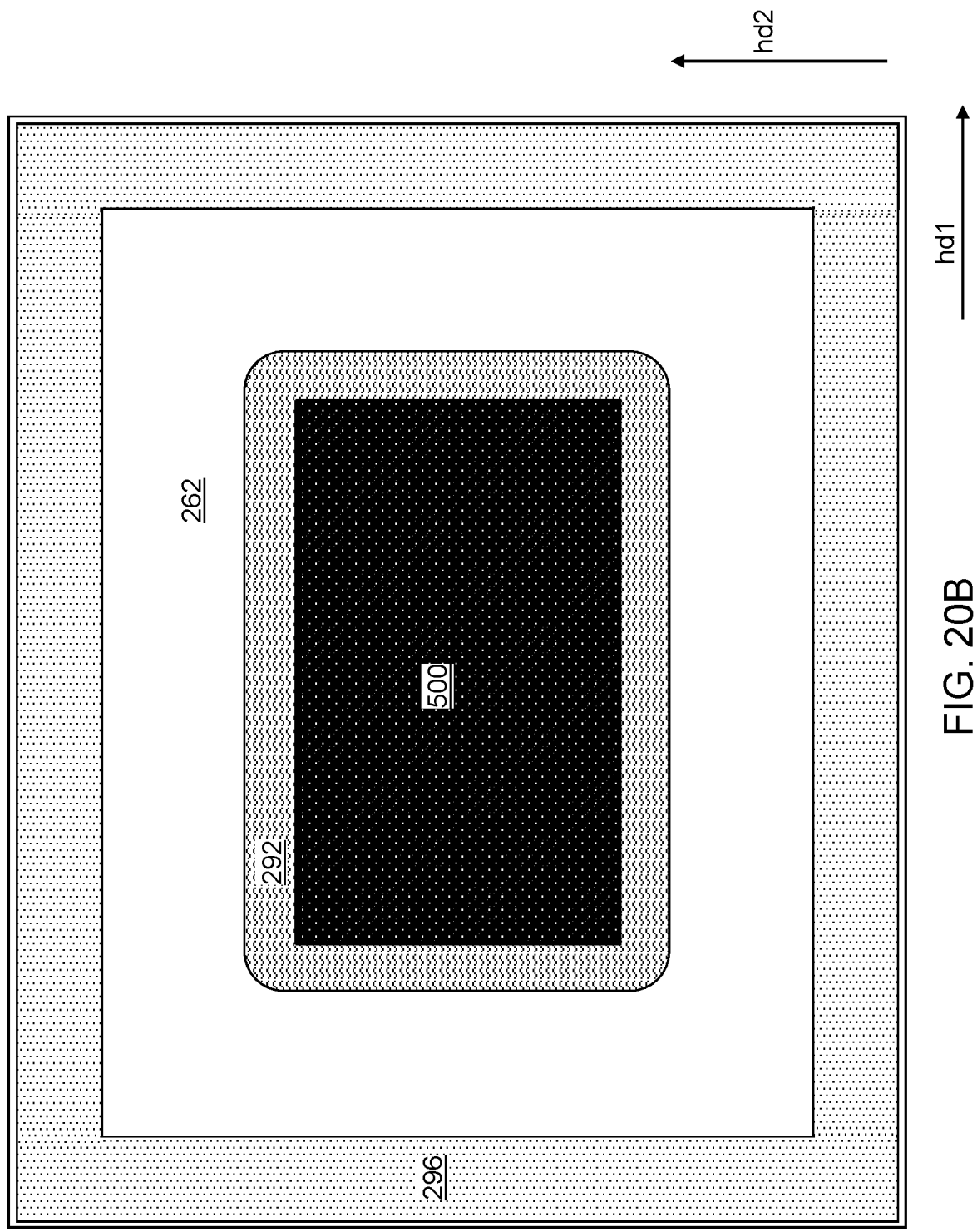

FIGS. 20A and 20B are various views of a first alternative structure after formation of a thermal interface material (TIM) and an adhesive layer according to an embodiment of the present disclosure. FIG. 20A is a vertical cross-sectional view and FIG. 20B is a top-down view of FIG. 20A. The adhesive layer 296 may be formed in a similar manner as described with reference to FIGS. 15A and 15B. A TIM 500 may be deposited or otherwise formed on a top surface of the fan-out package 900, including top surfaces of the semiconductor dies (700, 800), the second underfill material portion 292, and the molding compound die frame 910. The TIM 500 may be formed using one or more high thermal conductivity materials, such as polymers including silicon, carbon, and oxygen. In some embodiments, the TIM 500 may include materials such as aluminum oxide ($Al_2O_3$) or zinc oxide ($ZnO_2$) mixed with silicone ($[R_2SiO]n$) and other applicable materials. In some embodiments, the thickness of the TIM 500 may be in a range from 10 μm to 300 μm, although lesser or greater thicknesses may be used.

Figure 21A:
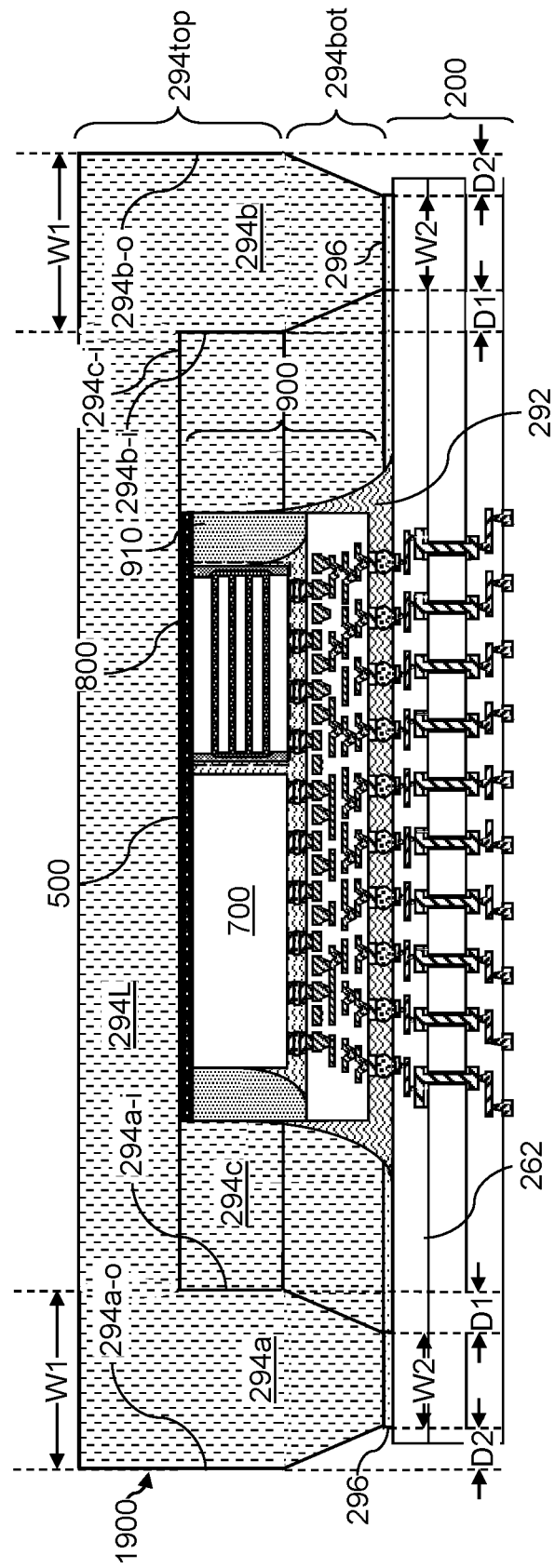

FIGS. 21A and 21B are various views of the first alternative structure after attaching the beveled lid-type stiffener structure according to an embodiment of the present disclosure. FIG. 21A is a vertical cross-sectional view and FIG. 21B is a top-down view of FIG. 21A. The beveled lid-type stiffener structure 1900 may be attached to the package substrate 200 and the fan-out package 900 via the adhesive layer 296 and the TIM 500. A bottom surface of the beveled lid-type stiffener structure 1900 (i.e., bottom surface of the bottom portion 294bot) may be affixed or otherwise attached to a top surface of the adhesive layer 296 in a similar manner as described with reference to FIGS. 16-17B. A bottom surface of the lid portion 294L of the beveled lid-type stiffener structure 1900 may be attached to and in contact with a top surface of the TIM 500, such that heat may be transferred from the semiconductor dies (700, 800) to the lid portion 294L via the TIM 500.

Figure 22A:
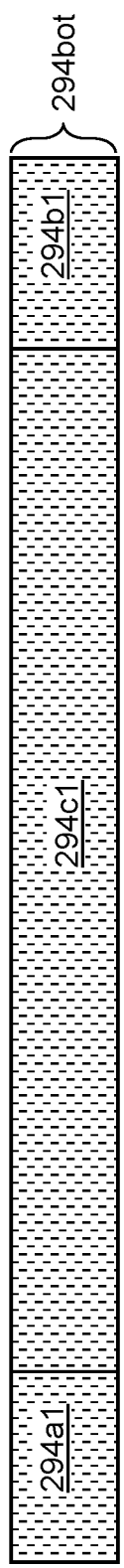

FIGS. 22A and 22B are various views of a second alternative structure including a bottom portion of a composite stiffener structure according to an embodiment of the present disclosure. FIG. 22A is a vertical cross-sectional view and FIG. 22B is a top-down view of FIG. 22A. The vertical cross sectional view in FIG. 22A is along line BB' in FIG. 22B. As compared to the embodiment described with reference to FIGS. 1A-18 which involved forming the beveled stiffener structure 294 from a single frame or mold, the second alternate structure includes forming a beveled composite stiffener structure 2500 including a bottom portion 294*bot* that is affixed to a top portion 294*top* with an intermediary adhesive layer. Referring to FIGS. 22A and 22B, an unbeveled bottom portion 294*bot* of the composite stiffener structure is illustrated.

Figure 23A:
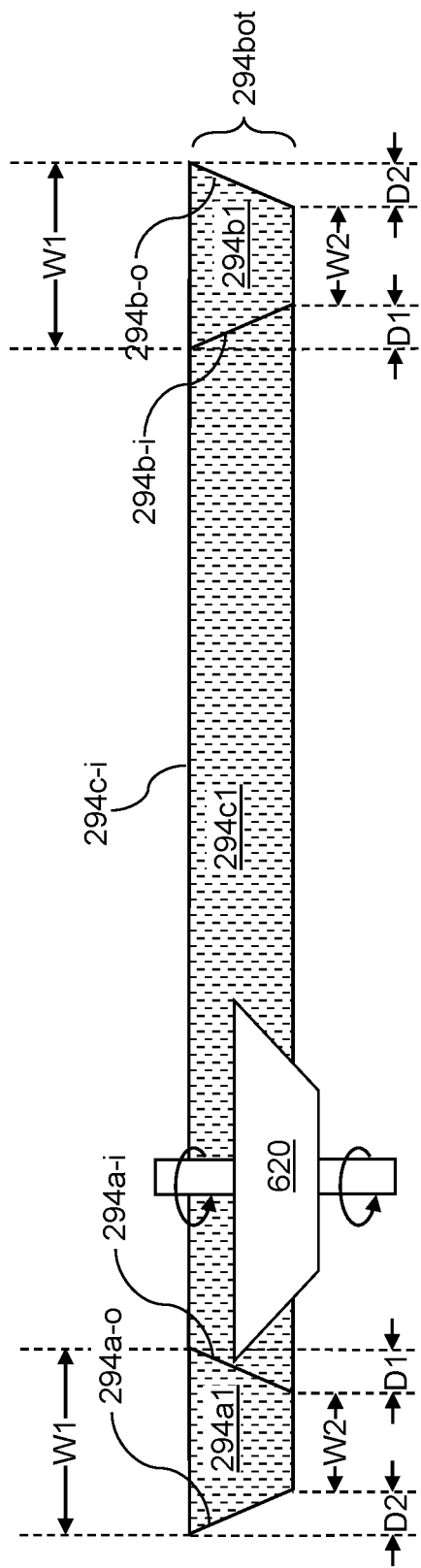

FIGS. 23A and 23B are various views of the second alternative structure after beveling the bottom portion of the composite stiffener structure according to an embodiment of the present disclosure. FIG. 23A is a vertical cross-sectional view and FIG. 23B is a bottom-up view of FIG. 23A. Referring to FIGS. 23A and 23B, the bottom portion 294*bot* may be beveled in a similar manner as described with reference to FIGS. 14A and 14B.

Figure 24A:
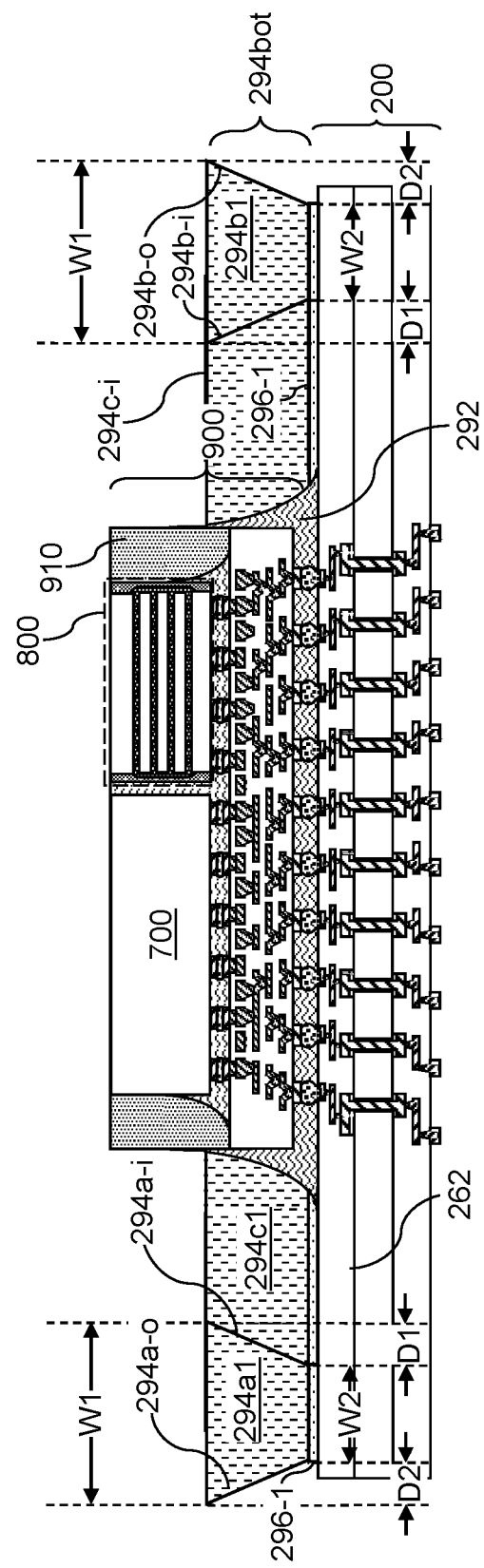
FIGS. 24A and 24B are various views of the second alternative structure after attaching the beveled bottom portion of the stiffener structure according to an embodiment of the present disclosure.
Figure 24B:
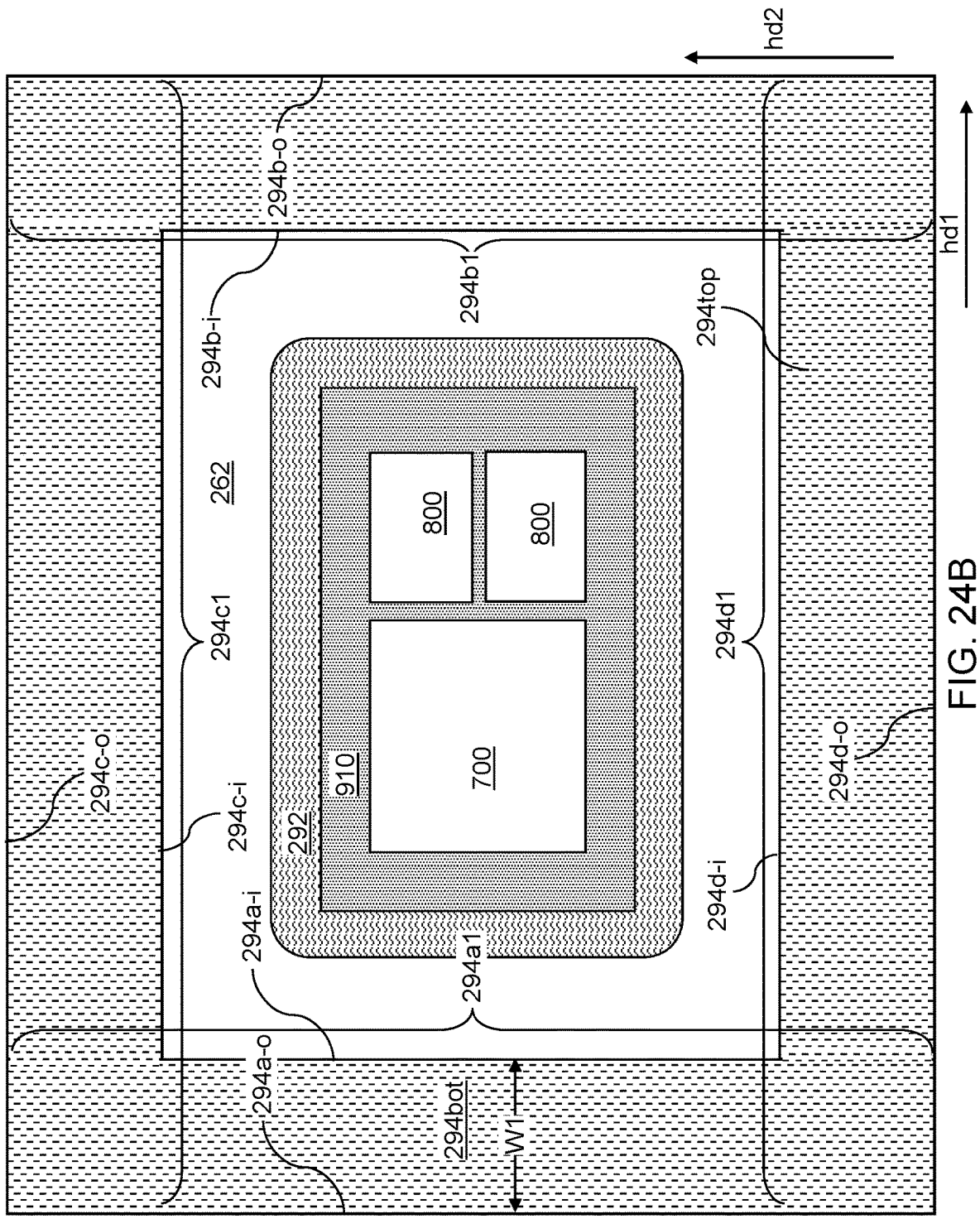

FIGS. 24A and 24B are various views of the second alternative structure after attaching the beveled bottom portion of the stiffener structure according to an embodiment of the present disclosure. FIG. 24A is a vertical cross-sectional view and FIG. 24B is a top-down view of FIG. 24A. Referring to FIGS. 24A and 24B, a bottom surface of the bottom portion 294*bot* may be attached to a top surface of a first adhesive layer 296-1 in a similar manner as described with reference to FIGS. 16-17B.

Figure 25A:
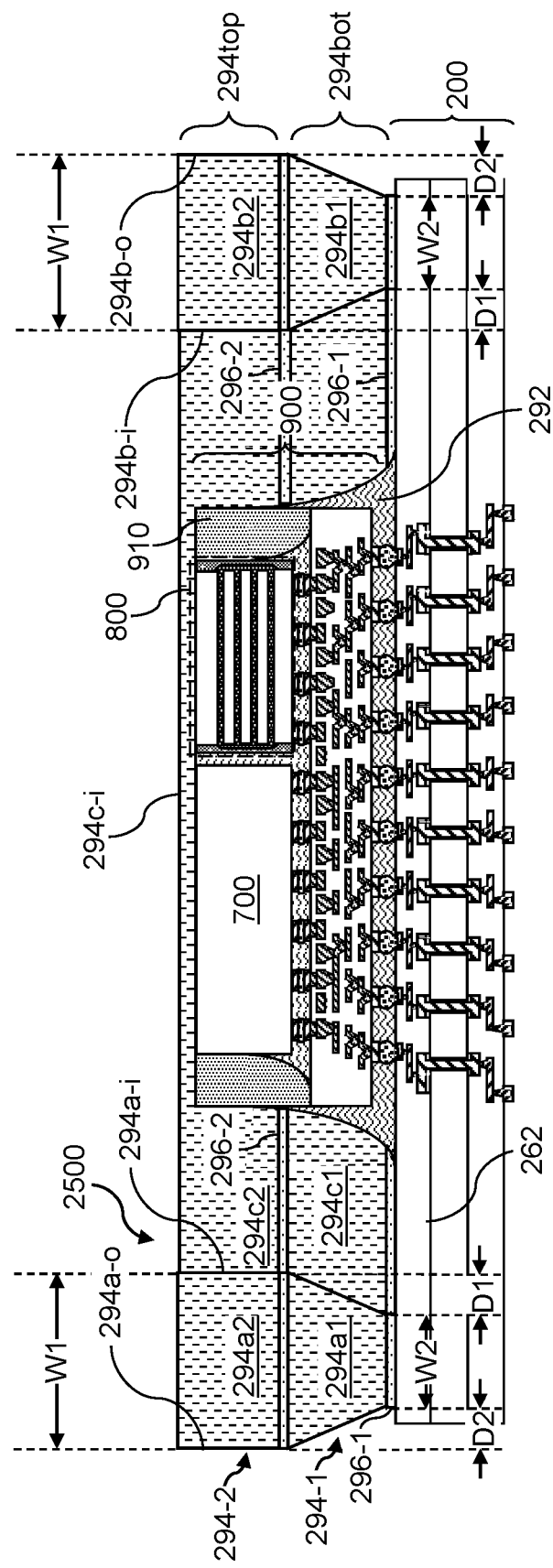
FIGS. 25A and 25B are various views of the second alternative structure after attaching a top portion of the stiffener structure according to an embodiment of the present disclosure.
Figure 25B:
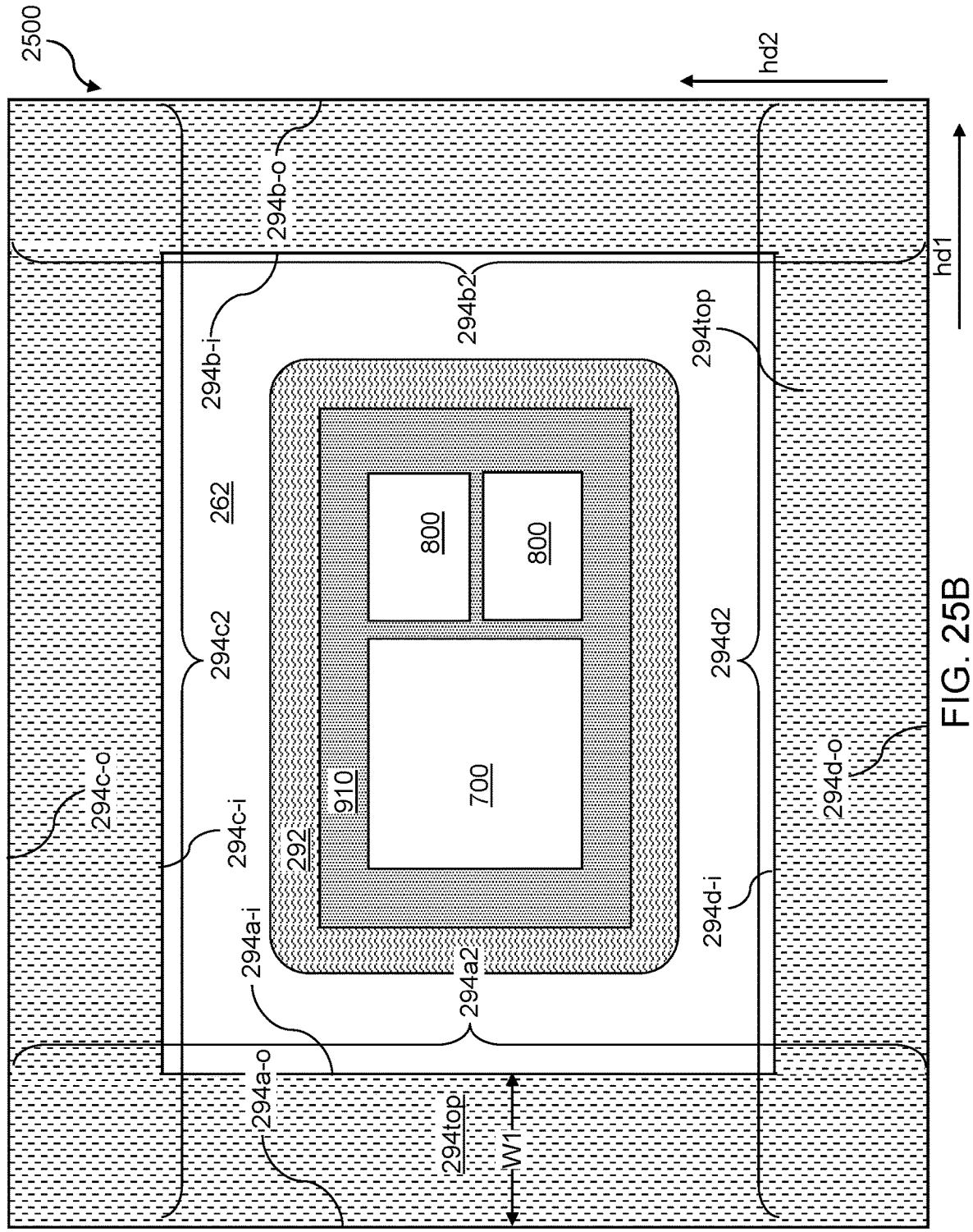

FIGS. 25A and 25B are various views of the second alternative structure after attaching a top portion of the stiffener structure according to an embodiment of the present disclosure. FIG. 25A is a vertical cross-sectional view and FIG. 25B is a top-down view of FIG. 25A. Referring to FIGS. 25A and 25B, a second adhesive layer 296-2 is deposited or otherwise formed on a top surface of the bottom portion 294. A bottom surface of a top portion 294*top* may be attached to a top surface of the second adhesive layer to form a beveled composite stiffener structure 2500. The beveled composite stiffener structure 2500 may include the bottom portion 294*bot*, the second adhesive layer 296-2, and the top portion 294*top*.

The beveled composite stiffener structure 2500 may include a first wall portion, a second wall portion, a third wall portion, and a fourth wall portion, in which the first wall portion includes a first bottom wall portion 294*a*1 and a first top wall portion 294*a*2, the second wall portion includes a second bottom wall portion 294*b*1 and a second top wall portion 294*b*2, the third wall portion includes a third bottom wall portion 294*c*1 and a third top wall portion 294*c*2, and the fourth wall portion includes a fourth bottom wall portion 294*d*1 and a fourth top wall portion (not shown). The bottom portion 294*bot* of the beveled composite stiffener structure 2500 may include the first bottom wall portion 294*a*1, the second bottom wall portion 294*b*1, the third bottom wall portion 294*c*1, and the fourth bottom wall portion 294*d*1. The top portion 294*top* may include the first top wall portion 294*a*2, the second top wall portion 294*b*2, the third top wall portion 294*c*2, and the fourth top wall portion 294*d*2.

Figure 26:
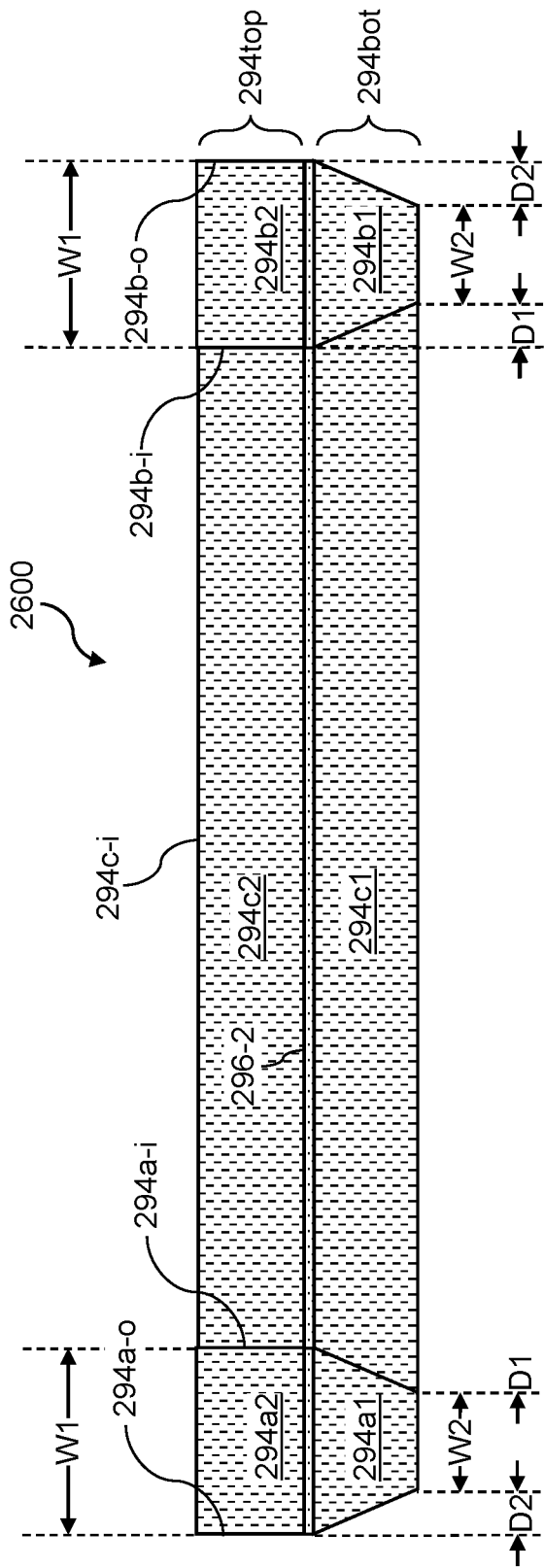
FIG. 26 is a vertical cross-sectional view of a third alternative structure including a beveled composite stiffener structure according to an embodiment of the present disclosure.

FIG. 26 is a vertical cross-sectional view of a third alternative structure including a beveled composite stiffener structure according to an embodiment of the present disclosure. Referring to FIG. 26, a beveled composite stiffener structure 2600 is illustrated. As compared to the second alternative structure as described with reference to FIGS. 22A-25B in which a bottom portion 294*bot* is beveled and attached to the package substrate before attaching the top portion 294*top*, the third alternative structure includes forming the beveled composite stiffener structure 2600 prior to attaching to an adhesive layer (e.g., first adhesive layer 296-1) on the package substrate 200. For example, the bottom portion 294*bot* may be beveled to form at least one tapered sidewall, the second adhesive layer 296-2 may be formed on a top surface of the bottom portion 294*bot*, and a bottom surface of the top portion 294*top* may be attached to a top surface of the second adhesive layer 296-1 to form the beveled composite stiffener structure 2600. The beveled composite stiffener structure 2600 may then be attached to the package substrate 200 via a first adhesive layer 296-1.

Figure 27:
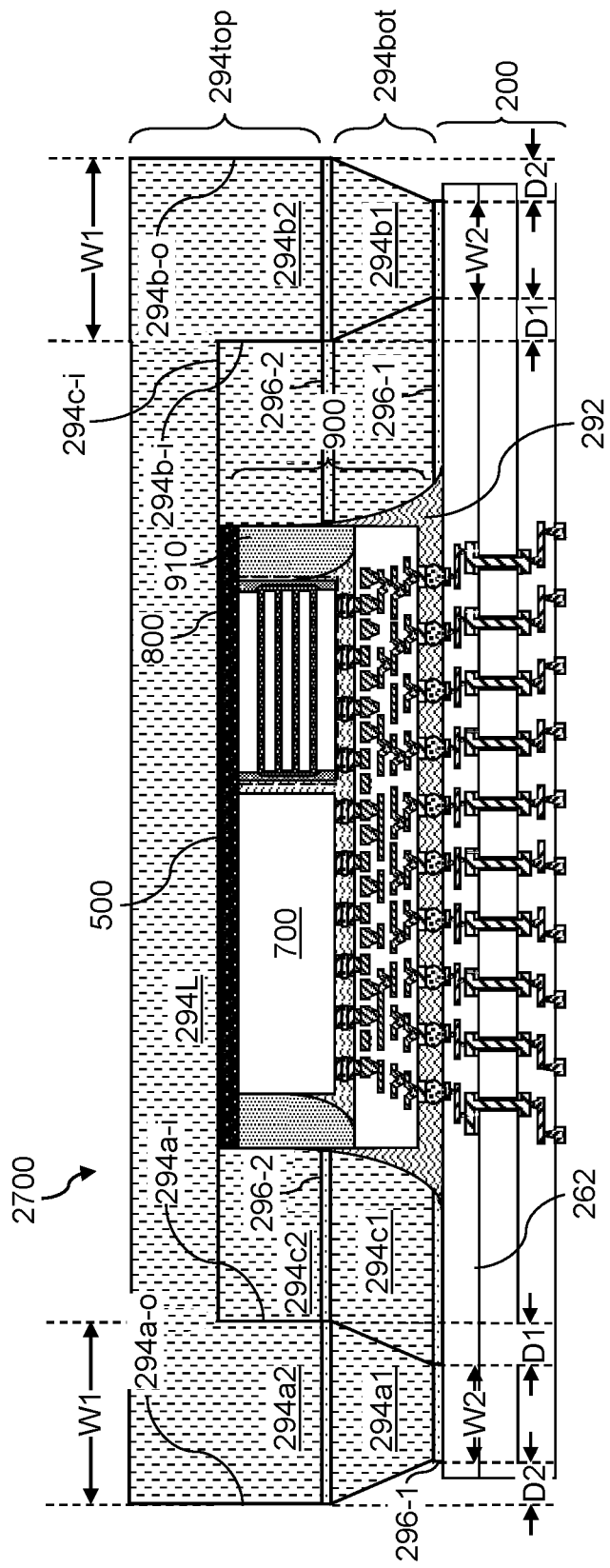
FIG. 27 is a vertical cross-sectional view of a fourth alternative structure including a beveled composite lid-type stiffener structure, thermal interface material, and lid according to an embodiment of the present disclosure.

FIG. 27 is a vertical cross-sectional view of a fourth alternative structure including a beveled composite lid-type stiffener structure, thermal interface material, and lid according to an embodiment of the present disclosure. Referring to FIG. 27, a composite lid-type beveled stiffener structure 2700 is illustrated. The composite lid-type beveled stiffener structure 2700 may be formed in similar manners as the first, second, and third alternative structures as described with reference to FIGS. 19A-26. For example, the bottom portion 294*bot* of the composite lid-type beveled stiffener structure 2700 may be beveled to form at least one tapered sidewall, the second adhesive layer 296-2 may be formed on a top surface of the bottom portion 294*bot*, a bottom surface of the top portion 294*top* may be attached to a top surface of the second adhesive layer 296-1 to form the composite lid-type beveled stiffener structure 2700, and the composite lid-type beveled stiffener structure 2700 may be attached to the package substrate 200 via the first adhesive layer 296-1 and to a top surface of the fan-out package 900 via the TIM 500. Alternatively, the bottom portion 294*bot* of the composite lid-type beveled stiffener structure 2700 may be beveled to form at least one tapered sidewall, the bottom portion 294*bot* may be attached to the package substrate 200 via the first adhesive layer 296-1, the second adhesive layer 296-2 may be formed on a top surface of the bottom portion 294*bot*, and a bottom surface of the top portion 294*top* may be attached to a top surface of the second adhesive layer 296-1 to form the composite lid-type beveled stiffener structure 2700 in which a bottom surface of the lid portion 294L of the composite lid-type beveled stiffener structure 2700 is attached to a top surface of the TIM 500. In a further embodiment (not shown), a composite lid-type beveled stiffener structure may be provided as a three-piece assembly. In the further embodiment, a lid portion may be affixed over the beveled composite stiffener structure 2500 in FIGS. 25A and 25B such that a three-piece composite beveled stiffener structure assembly may be provided.

Figure 28:
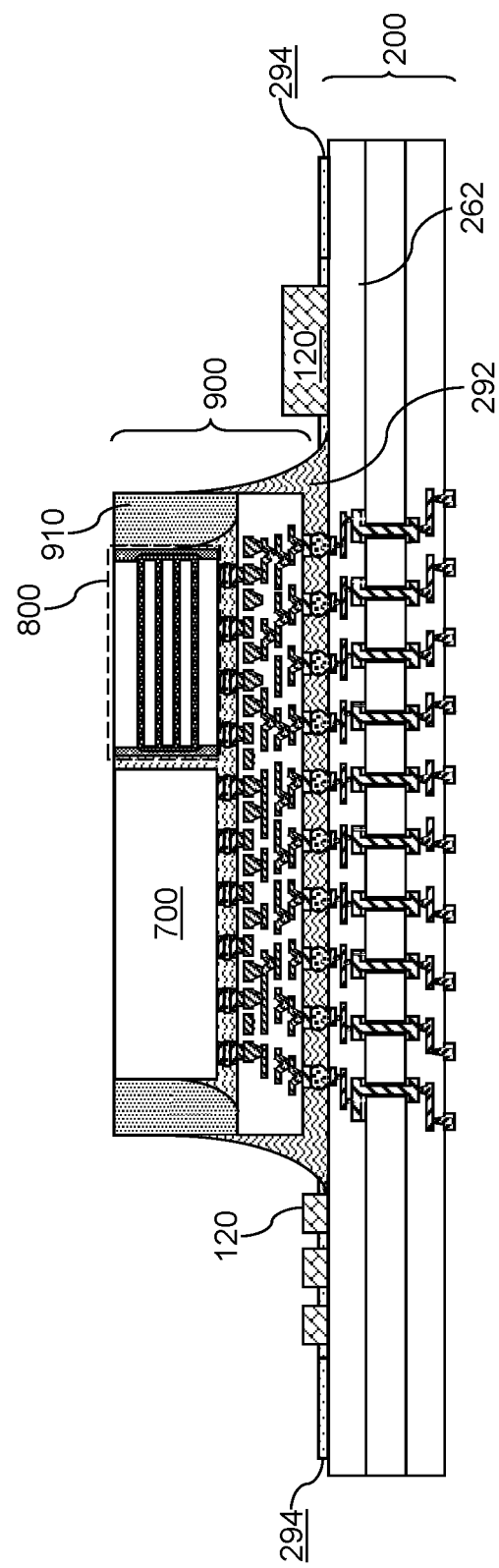
FIG. 28 is a vertical cross-sectional view of a fifth alternative structure after attaching surface mount devices according to an embodiment of the present disclosure.

FIG. 28 is a vertical cross-sectional view of an intermediate structure after attaching surface mount devices according to an embodiment of the present disclosure. Referring to FIG. 28, SMDs 120 may be mounted on a top surface of the package substrate 200.

Figure 29:
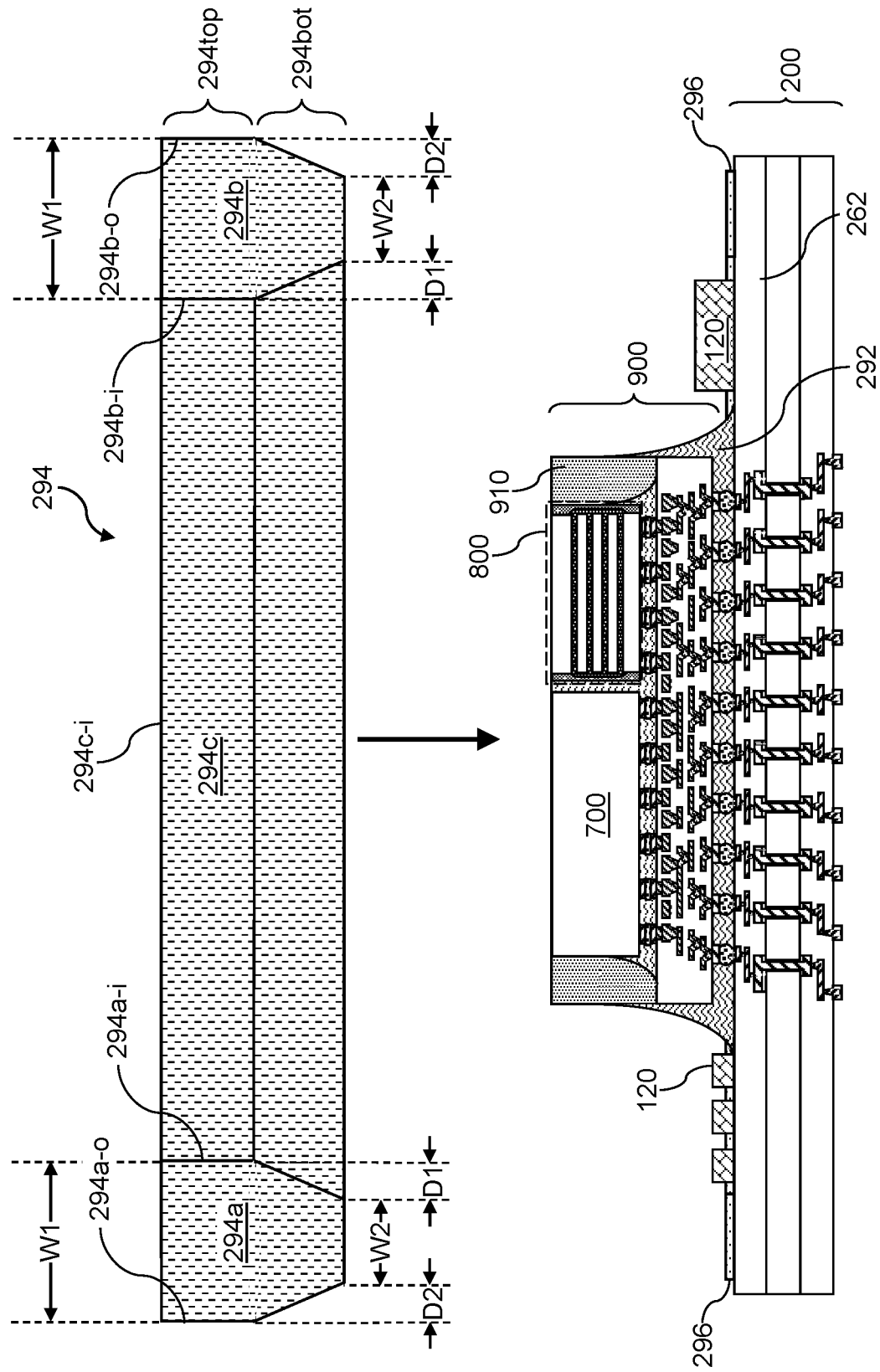
FIG. 29 is a vertical cross-sectional view of the fifth alternative structure during the process of attaching an beveled stiffener structure according to an embodiment of the present disclosure.

FIG. 29 is a vertical cross-sectional view of the structure during the process of attaching a beveled stiffener structure 294 (see also 2500, 2600, 2700) according to an embodiment of the present disclosure. Referring to FIG. 29, the process of aligning and attaching a bottom surface of the beveled stiffener structure 294 (see also 2500, 2600, 2700) with a top surface of the adhesive layer 296 is illustrated.

Figure 30A:
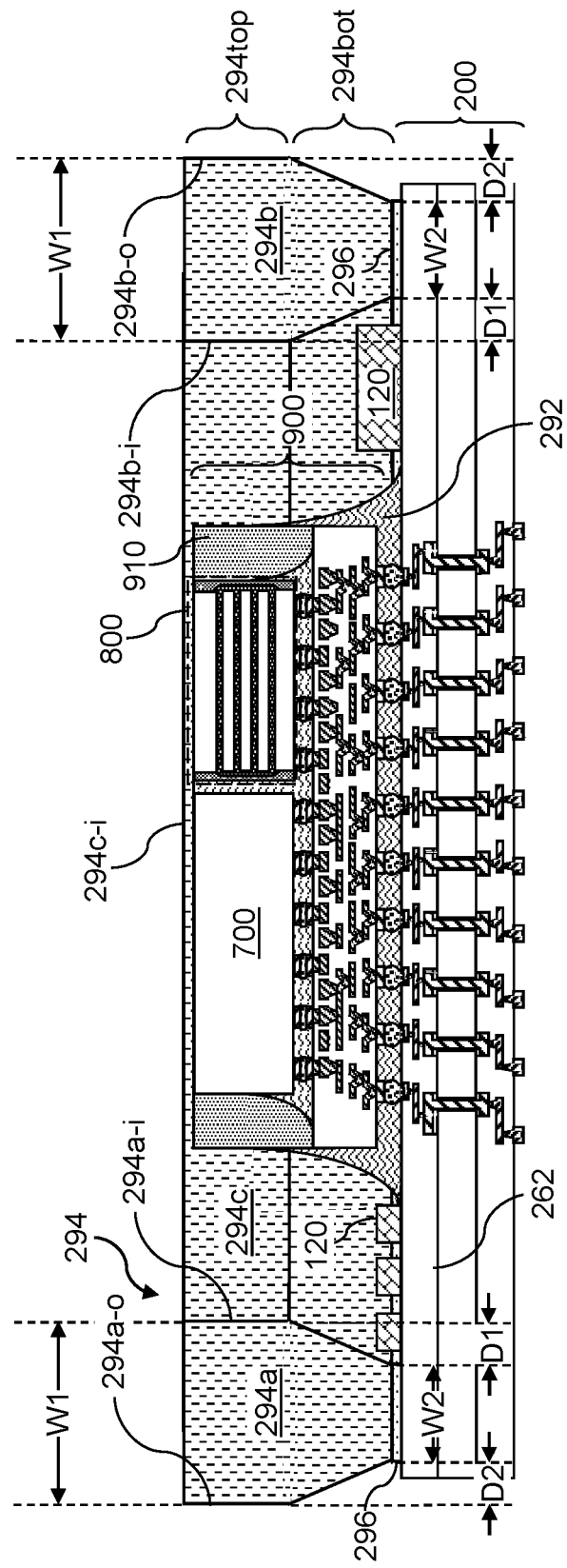
FIGS. 30A and 30B are various views of the fifth alternative structure after attaching beveled stiffener structure according to an embodiment of the present disclosure.
Figure 30B:
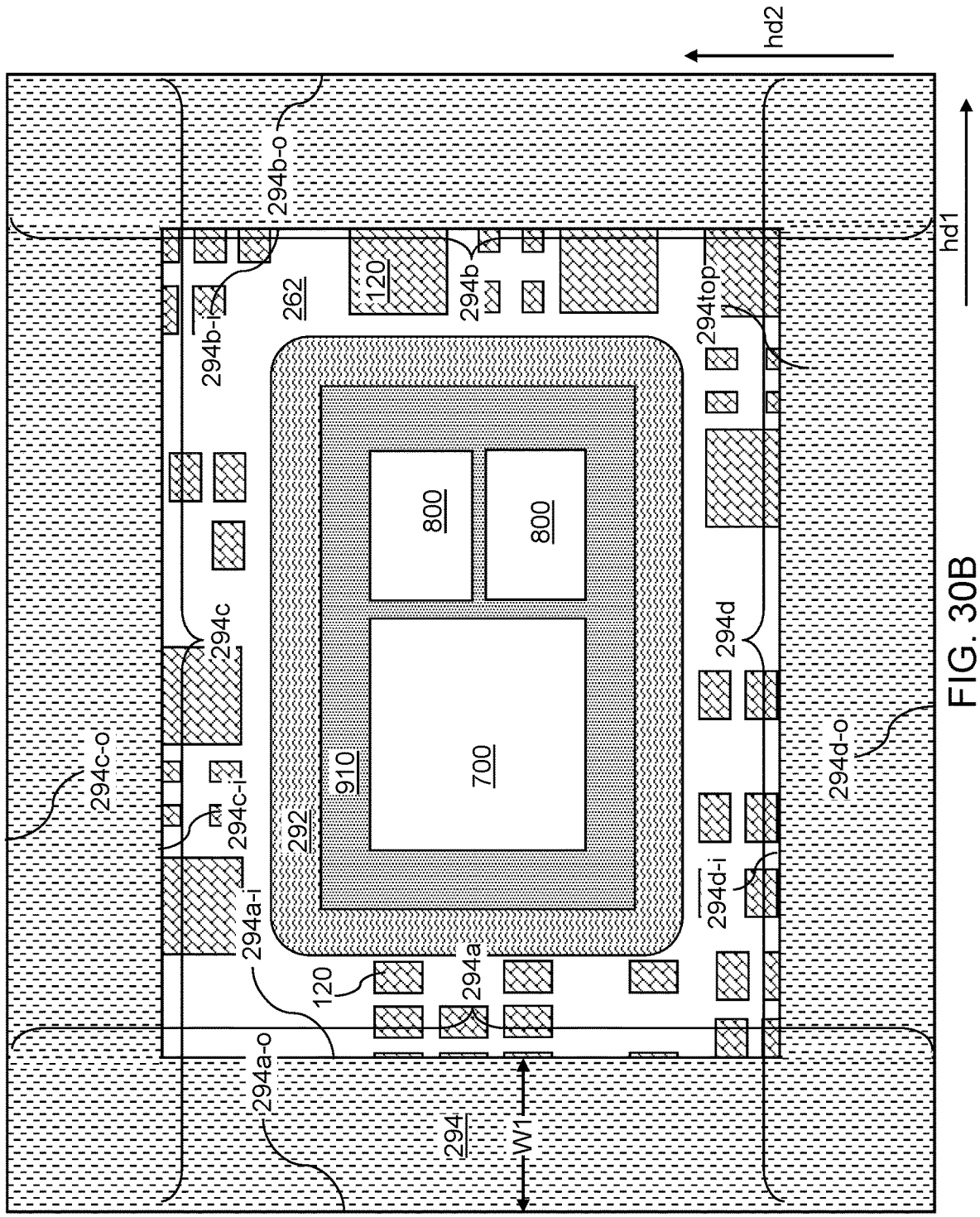

FIGS. 30A and 30B are various views of the structure after attaching beveled stiffener structure according to an embodiment of the present disclosure. FIG. 30A is a vertical cross-sectional view and FIG. 30B is a top-down view of FIG. 30A. Referring to FIGS. 30A and 30B, the beveled stiffener structure 294 is attached to the package substrate via the adhesive layer 296. A portion of the top portion 294*top* may hang over or otherwise be positioned vertically above one or more SMDs 120. An outermost portion of at least one SMD 120 may be positioned vertically below a portion of the top portion 294*top* of the beveled stiffener structure 294. By beveling the bottom portion 294*bot* of the beveled stiffener structure 294 and therefore reducing the overall footprint of the beveled stiffener structure 294, additional surface area above the package substrate 200 may be freed up and used for other purposes, including mounting additional SMDs 120.

Figure 31A:
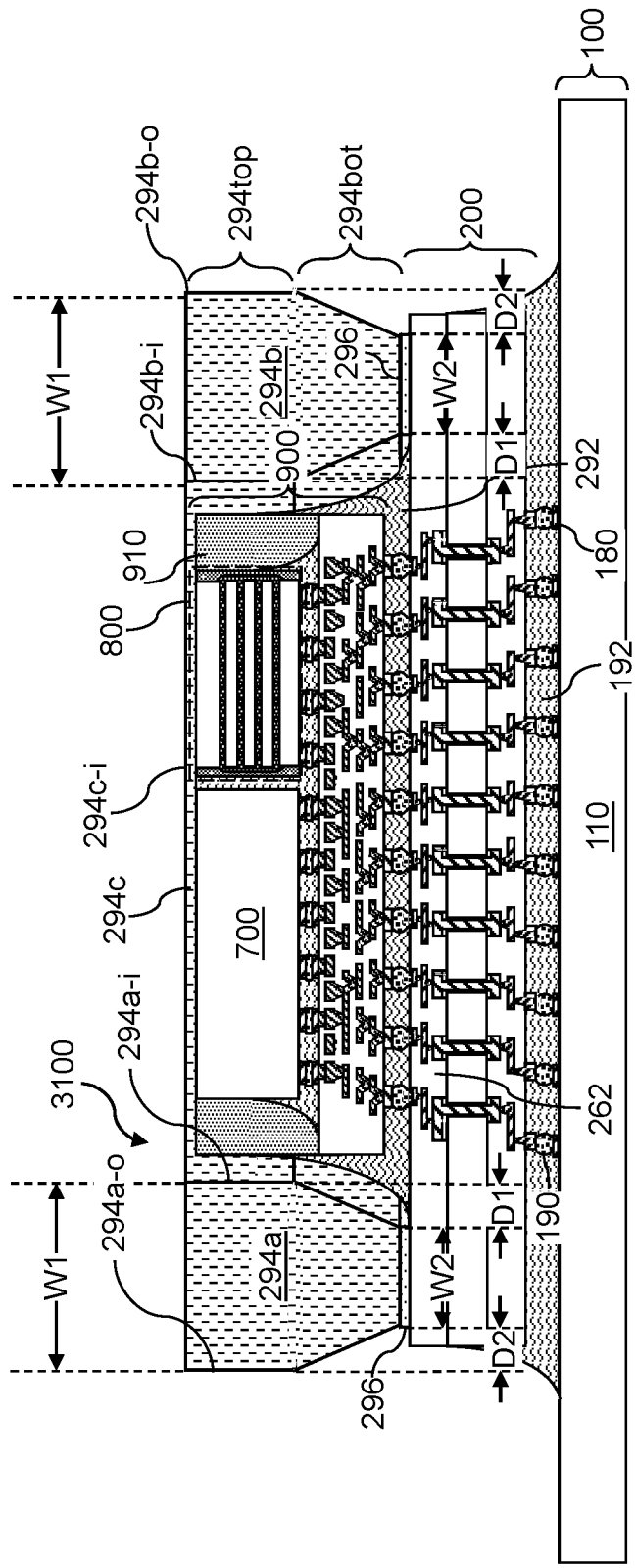
FIGS. 31A and 31B are various views of a sixth alternative structure including a reduced-size beveled stiffener structure according to an embodiment of the present disclosure.
Figure 31B:
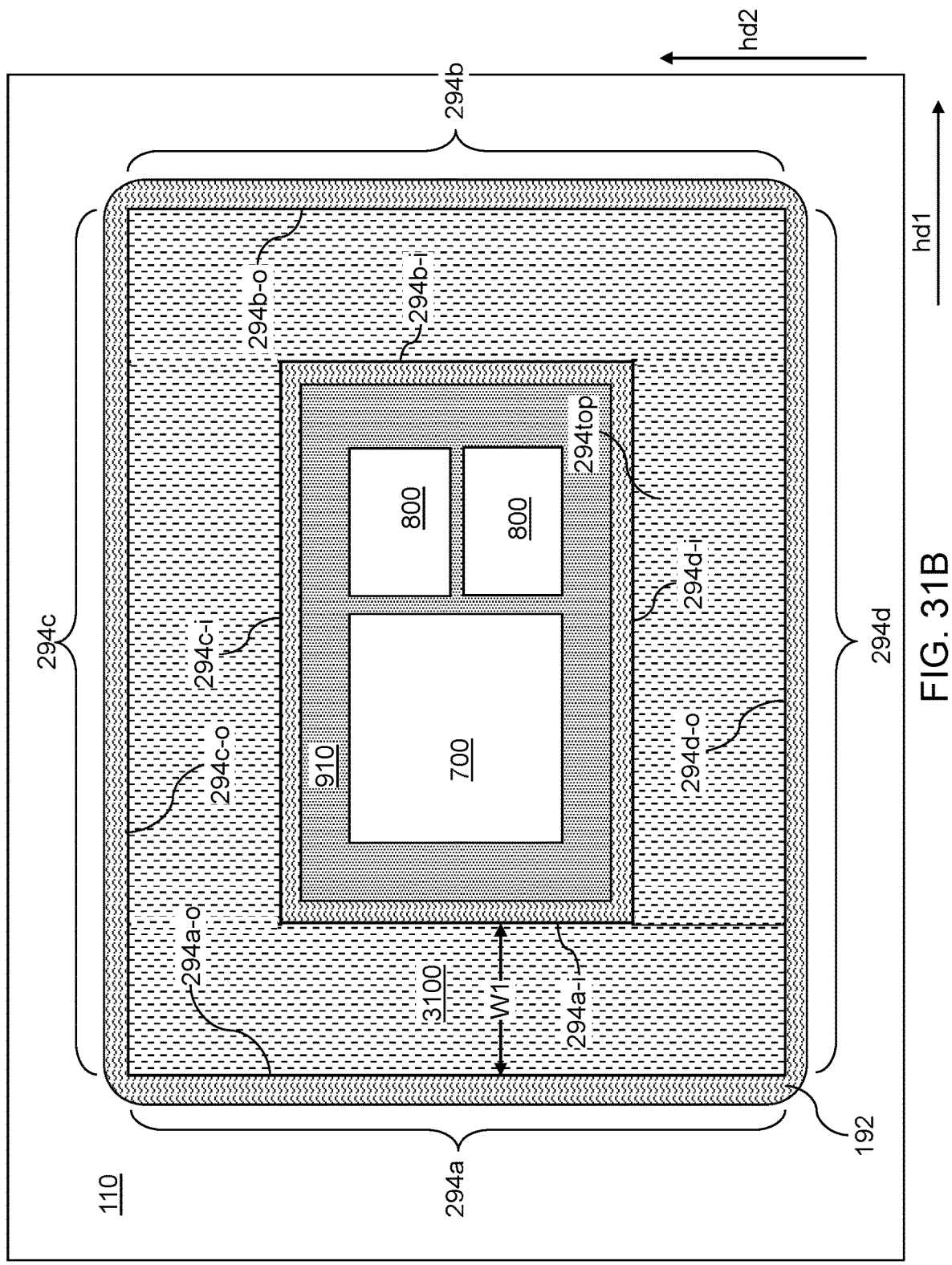

FIGS. 31A and 31B are various views of a structure including a reduced-size beveled stiffener structure according to an embodiment of the present disclosure. FIG. 31A is a vertical cross-sectional view and FIG. 31B is a top-down view of FIG. 31A. Referring to FIGS. 31A and 31B, a reduced-size beveled stiffener structure 3100 is illustrated. By beveling the bottom portion 294*bot* of the reduced-size beveled stiffener structure 3100 and therefore reducing the overall footprint of the beveled stiffener structure 294, the reduced-size beveled stiffener structure 3100 may be designed and formed to be positioned more closely to the fan-out package 900. For example, the reduced-size beveled stiffener structure 3100 may have the wall portions 294*a*-294*d* located proximate to adjacent sidewalls of the fan-out package 900, such that an outermost portion of the second underfill material portion 292 may be positioned vertically below a portion of the top portion 294*top* of the reduced-size beveled stiffener structure 3100. Reducing the footprint of the reduced-size beveled stiffener structure 3100 may free up space to minimize the size of both the reduced-size beveled stiffener structure 3100 and the overall chip package structure (i.e., package substrate 200, fan-out package 900, reduced-size beveled stiffener structure 3100), such that the ultimate footprint of the chip package structure may also be minimized to free up additional space on and/or reduce the size of the PCB 100.

In some embodiments, the reduced-size beveled stiffener structure 3100 may be affixed to the adhesive layer 296 prior to the deposition or formation of the second underfill material portion 292. The second underfill material portion 292 may then be deposited within the well formed by the reduced-size beveled stiffener structure 3100 and around the fan-out package 900, such that the second underfill material portion 292 may contact inner sidewalls 294a-i-294d-i.

Figure 32A:
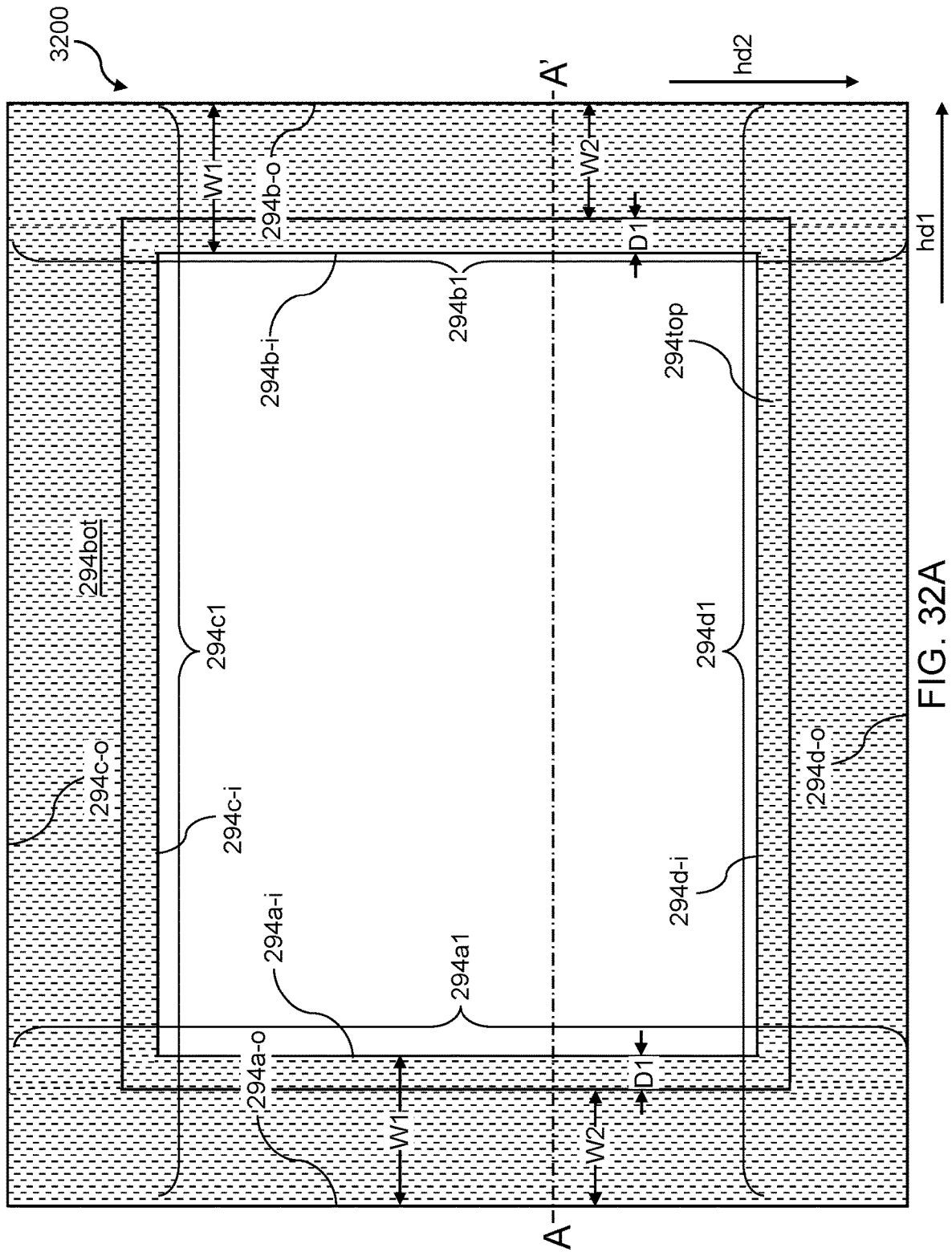
FIGS. 32A and 32B are various views of a seventh alternative structure including a stiffener structure with beveled inner sidewalls according to an embodiment of the present disclosure.
Figure 32B:
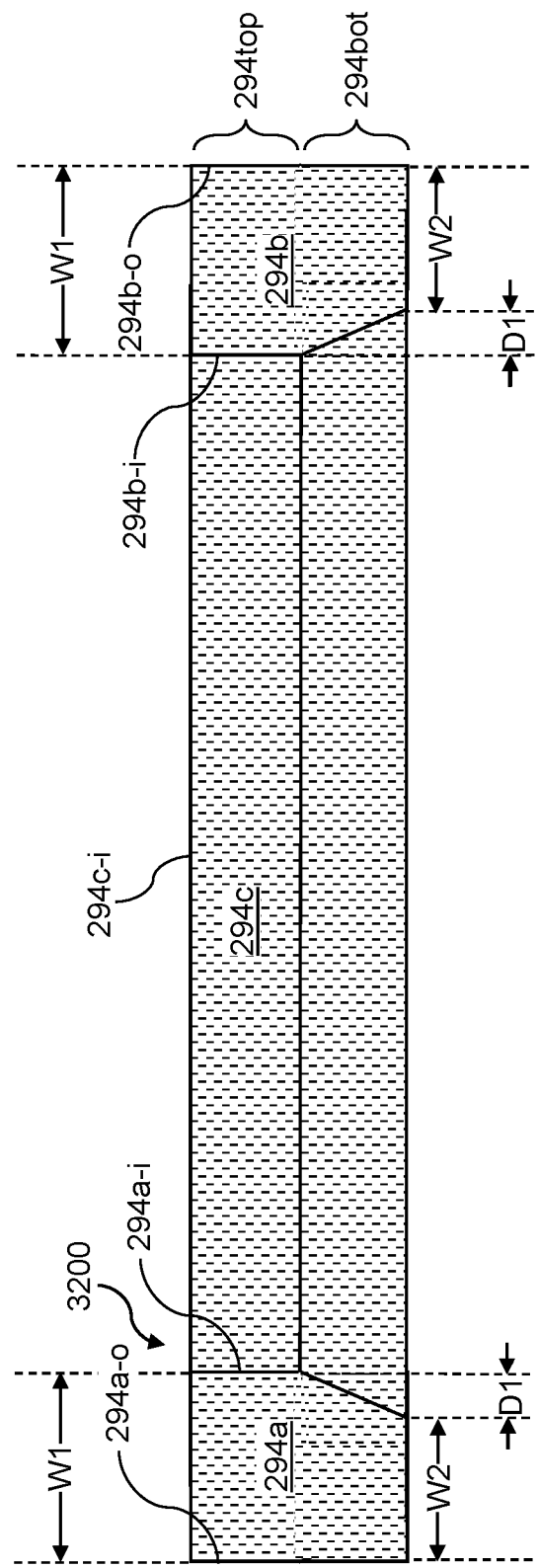

FIGS. 32A and 32B are various views of an alternative structure including a stiffener structure with beveled inner sidewalls according to an embodiment of the present disclosure. FIG. 32A is bottom-up view and FIG. 32B is a vertical cross-sectional view along the horizontal plane A-A' of FIG. 32A. Referring to FIGS. 32A and 32B, a beveled stiffener structure 3200 is illustrated. The beveled stiffener structure 3200 may have inner sidewalls 294a-i-294d-i beveled and tapered, while outer sidewalls 294a-o-294d-o remain unbeveled. Such an embodiment may allow for the reduction of the footprint of the beveled stiffener structure 3200 while providing retaining structural support (i.e., to reduce package warpage).

Figure 33:
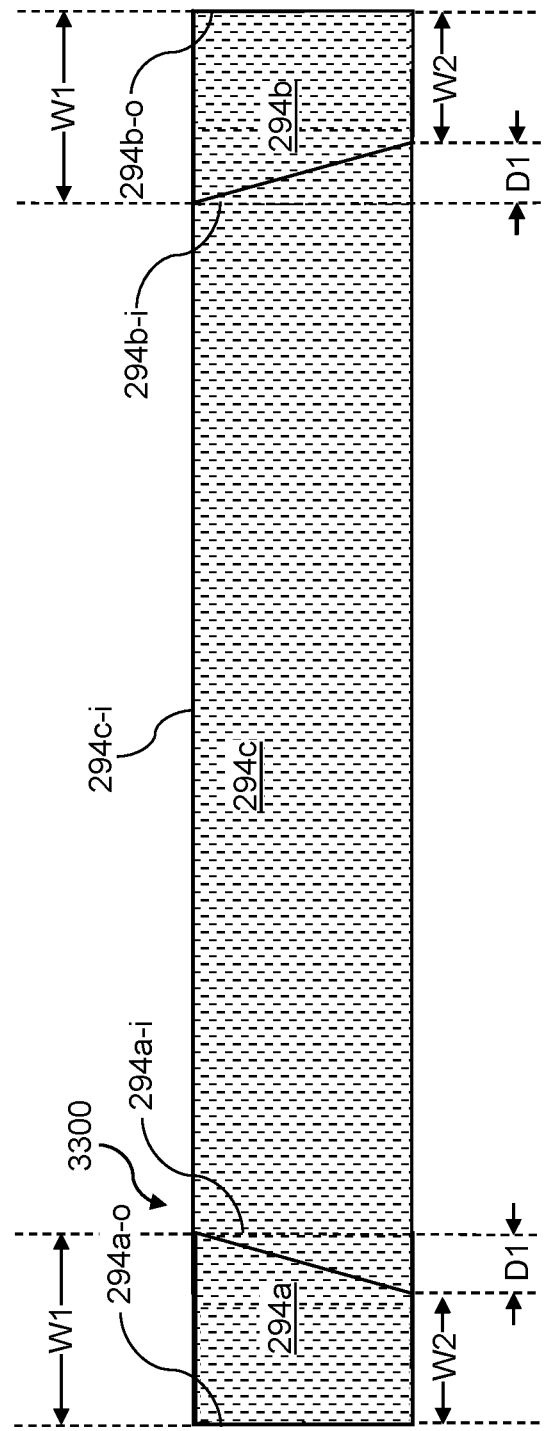
FIG. 33 is a vertical cross-sectional view of an eighth alternative structure including a beveled stiffener structure with tapered inner sidewalls along the height of the beveled stiffener structure according to an embodiment of the present disclosure.

FIG. 33 is a vertical cross-sectional view of another alternative structure including a beveled stiffener structure with tapered sidewalls along the height of the beveled stiffener structure according to an embodiment of the present disclosure. Referring to FIG. 33 a beveled stiffener structure 3300 with tapered sidewalls is illustrated. The beveled stiffener structure 3300 may have the entirety of at least one of the inner sidewalls 294a-i-294d-i beveled and tapered, while outer sidewalls 294a-o-294d-o remain unbeveled. The beveled stiffener structure 3300 may be formed and beveled such that the inner sidewalls 294a-i-294d-i are tapered along the full height of the beveled stiffener structure 3300.

Figure 34:
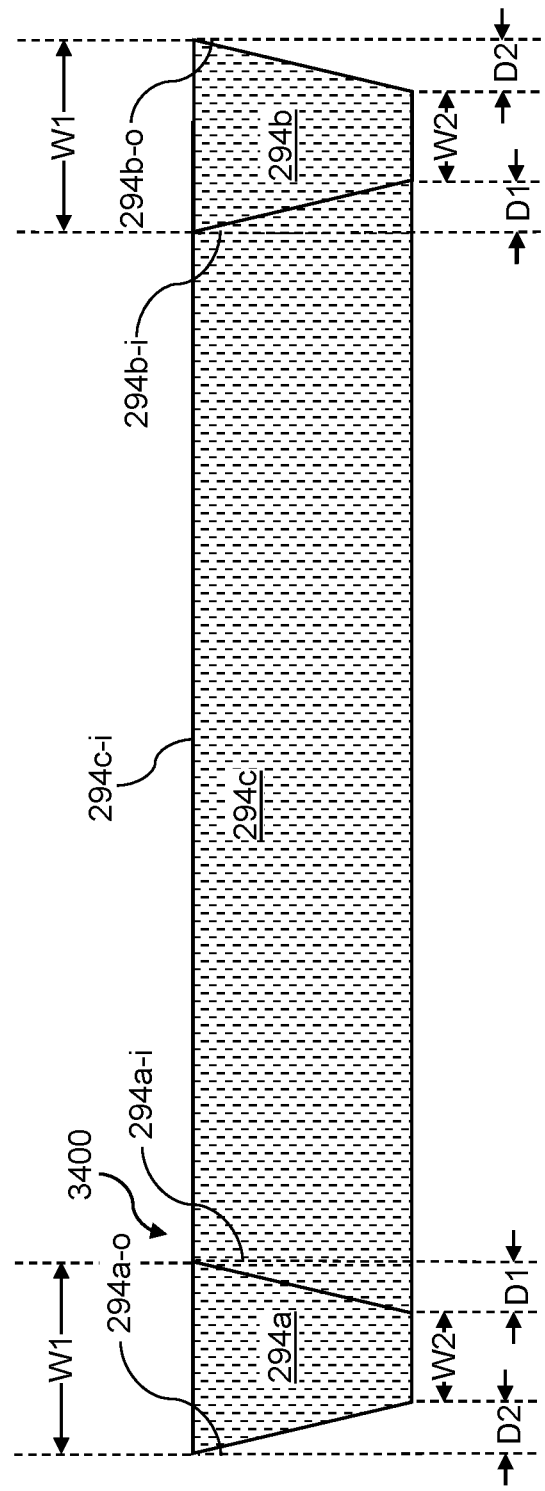
FIG. 34 is a vertical cross-sectional view of a ninth alternative structure including a beveled stiffener structure with tapered inner sidewalls and tapered outer sidewalls along the height of the beveled stiffener structure according to an embodiment of the present disclosure.

FIG. 34 is a vertical cross-sectional view of another alternative structure including a beveled stiffener structure with tapered inner sidewalls and tapered outer sidewalls along the height of the beveled stiffener structure according to an embodiment of the present disclosure. Referring to FIG. 34 a beveled stiffener structure 3400 with tapered sidewalls is illustrated. The beveled stiffener structure 3400 may have the entirety of at least one of the inner sidewalls 294a-i-294d-i beveled and tapered, and the entirety of at least one of the outer sidewalls 294a-o-294d-o beveled and tapered. The beveled stiffener structure 3400 may be formed and beveled such that the inner sidewalls 294a-i-294d-i and outer sidewalls 294a-o-294d-o are tapered along the full height of the beveled stiffener structure 3400.

Figure 35:
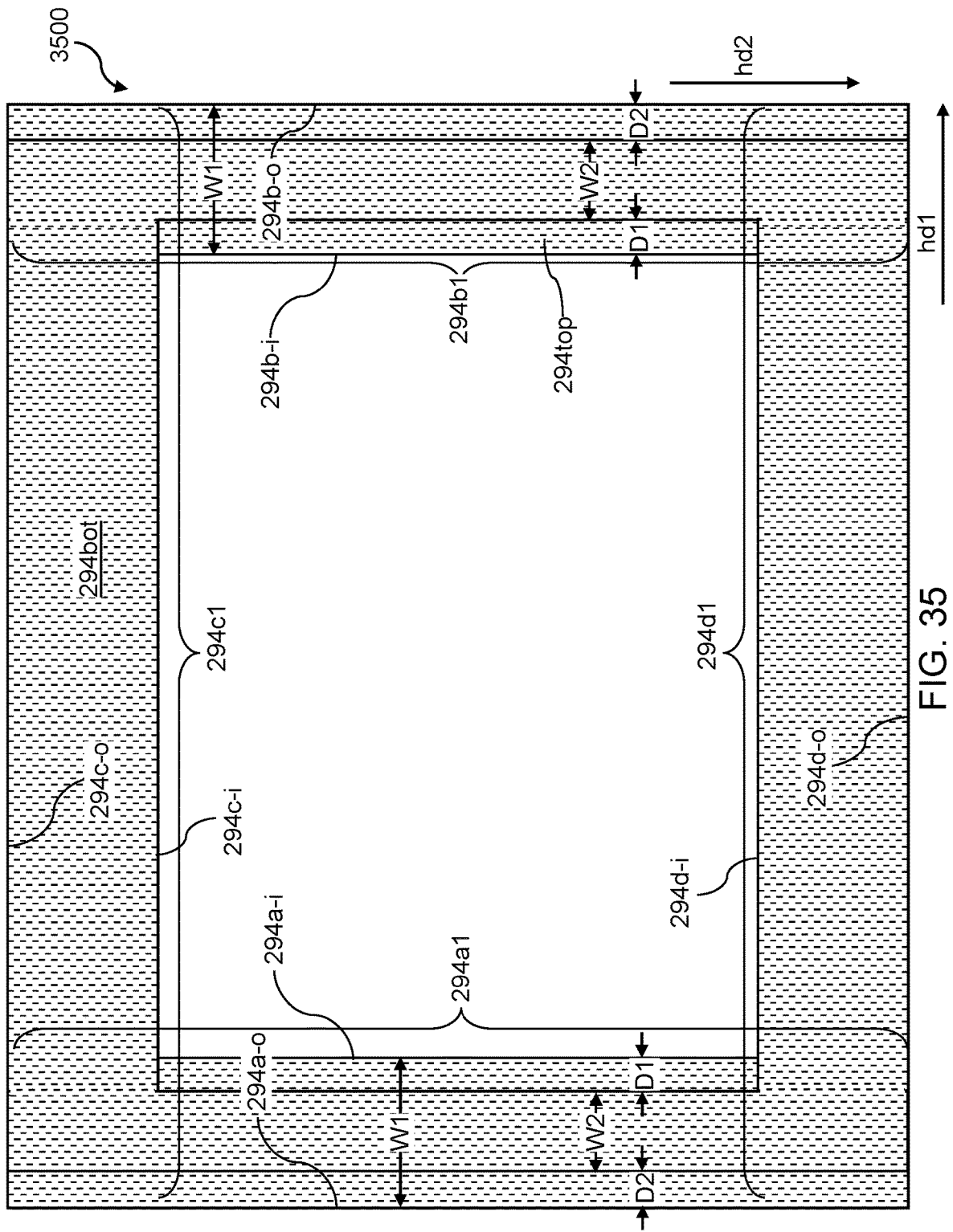
FIG. 35 is a bottom-up view of a tenth alternative structure including a beveled stiffener structure having predetermined sidewalls beveled according to an embodiment of the present disclosure.

FIG. 35 is a bottom-up view of another alternative structure including a beveled stiffener structure having predetermined sidewalls beveled according to an embodiment of the present disclosure. Referring to FIG. 35, a beveled stiffener structure 3500 with two beveled wall portions is illustrated. The first wall portion 294a and the second wall portion 294b may be beveled and tapered, while the third wall portion 294c and the fourth wall portion 294d may remain unbeveled. For example, the first inner sidewall 294a-i, first outer sidewall 294a-o, second inner sidewall 294b-i, and second outer sidewall 294b-o may be beveled to form tapered sidewalls, and the third inner sidewall 294c-i, third outer sidewall 294c-o, fourth inner sidewall 294d-i, and fourth outer sidewall 294d-o may remain unbeveled and vertically straight. As another example, the first inner sidewall 294a-i and the second inner sidewall 294b-i, and may be beveled to form tapered sidewalls, and the first outer sidewall 294a-o, second outer sidewall 294b-o, third inner sidewall 294c-i, third outer sidewall 294c-o, fourth inner sidewall 294d-i, and fourth outer sidewall 294d-o may remain unbeveled and vertically straight. Such example embodiments may be implemented in designs in which only predetermined areas undergoing a reduction in the footprint of the stiffener structure. Beveling only necessary walls per design constraints may also reduce manufacturing time of the overall chip package structure in some embodiments, and not limited thereto.

In some embodiments in which the beveled stiffener structure 3500 is attached to a package substrate 200 and surrounds a fan-out package 900, the beveled stiffener structure 3500 may include a third innermost sidewall (e.g., third inner sidewall 294c-i) connected to a first innermost tapered sidewall (e.g., first inner sidewall 294a-i within bottom portion 294bot) and a second innermost tapered sidewall (e.g., second inner sidewall 294b-i within bottom portion 294bot), in which a top portion of the third innermost sidewall and a bottom portion of the third innermost sidewall may be equidistant to a proximate sidewall of the fan-out package 900. The beveled stiffener structure 3500 may further include a fourth innermost sidewall (e.g., fourth inner sidewall 294d-i) connected to the first innermost tapered sidewall and the second innermost tapered sidewall and positioned distally from the third innermost sidewall, in which a top portion of fourth innermost sidewall and a bottom portion of the fourth innermost sidewall are equidistant to a proximate sidewall of the fan-out package.

Figure 36:
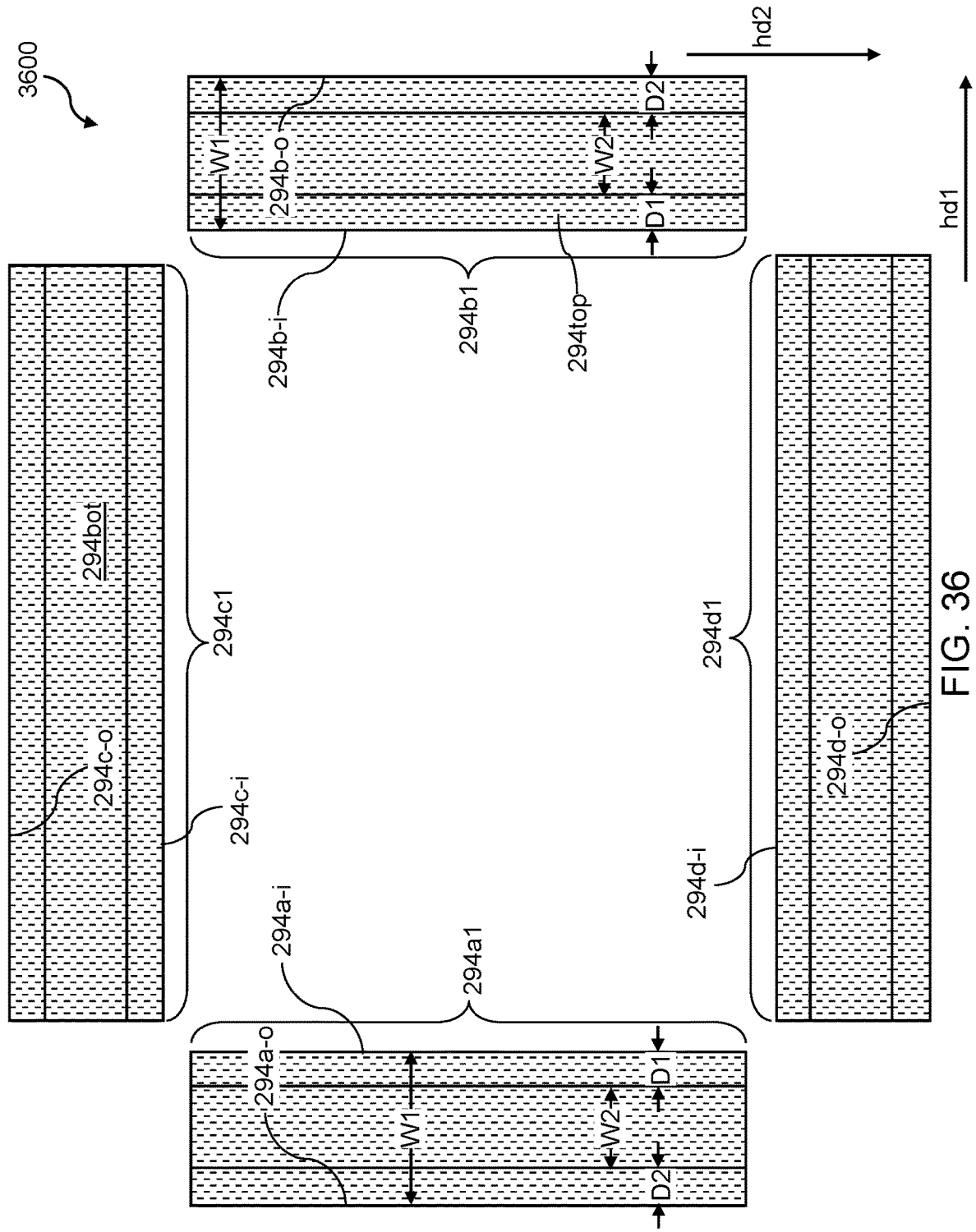
FIG. 36 is a bottom-up view of an eleventh alternative structure including four separate beveled stiffener structure portions according to an embodiment of the present disclosure.

FIG. 36 is a bottom-up view of another alternative structure including four separate beveled stiffener structure portions according to an embodiment of the present disclosure. Referring to FIG. 36, a beveled stiffener structure 3600 including separate disjointed wall portions is illustrated. The beveled stiffener structure 3600 may include a first wall portion 294a, a second wall portion 294b, a third wall portion 294c, and a fourth wall portion 294d that may be attached to a package substrate 200 around a fan-out package 900. The wall portions 294a-294d may be formed as disjointed, non-connecting wall portions that form the overall beveled stiffener structure 3600. In addition to having beveled sidewalls to free up additional space on a top surface of the package substrate 200, additional surface area of the package substrate 200 may be made available through the implementation of a "cornerless" beveled stiffener structure 3600. The beveled stiffener structure 3600 may additionally provide a benefit of increased airflow across a fan-out package 900 for increased operating temperature dissipation.

Figure 37:
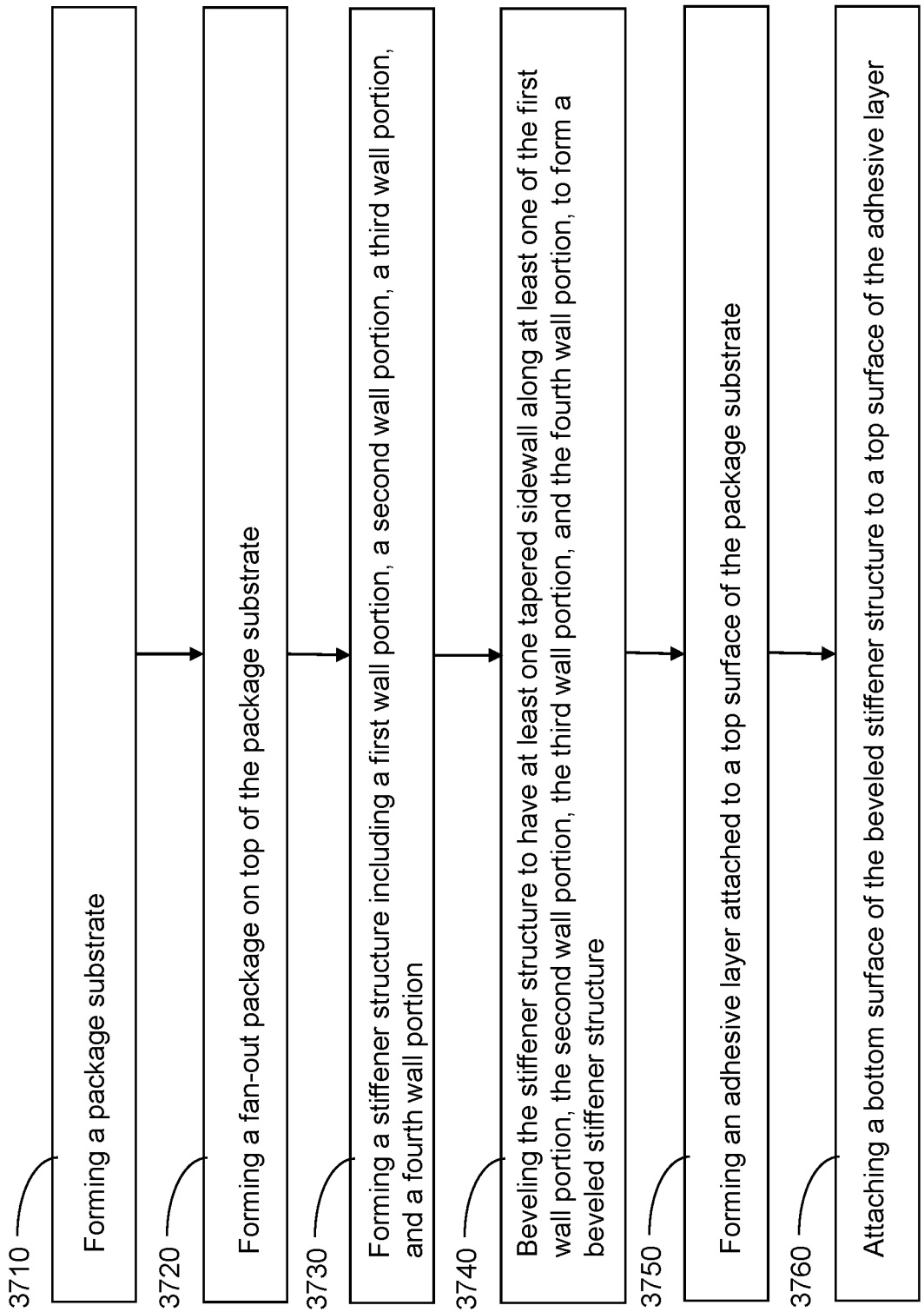
FIG. 37 is a flowchart illustrating steps for forming a structure according to an embodiment of the present disclosure.

Referring to FIG. 37, a flowchart illustrates steps for forming an structure according to an embodiment of the present disclosure.

Referring to step 3710 and FIGS. 1A, 1B, 2A, and 2B, a package substrate 200 may be formed.

Referring to step 3720 and FIGS. 3A-10B, a fan-out package 900 may be formed on top of the package substrate 200.

Referring to step 3730 and FIGS. 13A-14B, 19A, 19B, 22A-25B, 26, 27, 31A-36, a stiffener structure (e.g., 294, 1900, 2500, 2600, 2700, 3100, 3200, 3300, 3400, 3500, 3600) including a first wall portion 294a, a second wall portion 294b, a third wall portion 294c, and a fourth wall portion 294d may be formed.

Referring to step 3740 and FIGS. 14A, 14B, 19A, 19B, 23A, and 23B, the stiffener structure (e.g., 294, 1900, 2500, 2600, 2700, 3100, 3200, 3300, 3400, 3500, 3600) may be beveled to have at least one tapered sidewall (e.g., inner sidewalls 294a-i-294d-i, outer sidewalls 294a-o-294d-o) along at least one of the first wall portion 294a, the second wall portion 294b, the third wall portion 294c, and the fourth wall portion 294d, to form a beveled stiffener structure.

In some embodiments, a first width W1 of a top portion (e.g., top portion 294top) of the beveled stiffener structure (e.g., 294, 1900, 2500, 2600, 2700, 3100, 3200, 3300, 3400, 3500, 3600) along the at least one tapered sidewall (e.g., inner sidewalls 294a-i-294d-i, outer sidewalls 294a-o-294d-o) is greater than a second width W2 of a bottom portion (e.g., bottom portion 294bot) of the beveled stiffener structure along the at least one tapered sidewall.

In some embodiments, beveling the stiffener structure (e.g., 294, 1900, 2500, 2600, 2700, 3100, 3200, 3300, 3400, 3500, 3600) may include beveling the first wall portion 294a to form a first innermost tapered sidewall (e.g., first inner sidewall 294a-i) of the at least one tapered sidewall (e.g., inner sidewalls 294a-i-294d-i, outer sidewalls 294a-o-294d-o). In some embodiments, beveling the stiffener structure may include beveling the first wall portion 294a to form a first outermost tapered sidewall (e.g., first outer sidewall 294a-o) of the at least one tapered sidewall. In some embodiments, beveling the stiffener structure may include beveling the second wall portion 294b to form a second innermost tapered sidewall (e.g., second inner sidewall 294b-i) of the at least one tapered sidewall. In some embodiments, beveling the stiffener structure may include beveling the second wall portion 294b to form a second outermost tapered sidewall (e.g., second outer sidewall 294b-o) of the at least one tapered sidewall.

Referring to step 3750 and FIGS. 15A, 15B, 20A, 20B, 24A, 24B, 27 and 28, an adhesive layer (e.g., adhesive layer 296, first adhesive layer 296-1) may be formed and attached to a top surface of the package substrate 200.

Referring to step 3760 and FIGS. 16-17B, 21A, 21B, 24A, 24B, 27, and 29-31B, a bottom surface of the beveled stiffener structure (e.g., 294, 1900, 2500, 2600, 2700, 3100, 3200, 3300, 3400, 3500, 3600) may be attached to a top surface of the adhesive layer (e.g., adhesive layer 296, first adhesive layer 296-1).

It is to be noted that the order of operations concerning the beveling of the stiffener structure (e.g., 294, 1900, 2500, 2600, 2700, 3100, 3200, 3300, 3400, 3500, 3600) is adjustable to the implementation of the invention, and the stiffener structure may be beveled before or after any of the steps 3710, 3720, 3730, and 3750. For example, the various stiffener structures may be formed and beveled in large manufactured batches prior to the formation of any package substrate 200 in preparation of attaching them to chip package structures including a package substrate 200 and fan-out package 900. As another example, the stiffener structure may be beveled after the formation of the adhesive layer according to step 3750.

Referring to all drawings and according to various embodiments of the present disclosure, a chip package structure is provided, which may include: a package substrate 200; a fan-out package 900 attached to the package substrate 200; a first adhesive layer (e.g., adhesive layer 296, first adhesive layer 296-1) attached to a top surface of the package substrate 200; and a beveled stiffener structure (e.g., 294, 1900, 2500, 2600, 2700, 3100, 3200, 3300, 3400, 3500, 3600) attached to the package substrate 200 and surrounding the fan-out package 900, the beveled stiffener structure comprising at least one tapered sidewall (e.g., inner sidewalls 294a-i-294d-i, outer sidewalls 294a-o-294d-o), in which a first width W1 of a top portion (e.g., top portion 294top) of the beveled stiffener structure along the at least one tapered sidewall may be greater than a second width W2 of a bottom portion (e.g., bottom portion 294bot) of the beveled stiffener structure along the at least one tapered sidewall, in which the bottom portion may be in contact with a top surface of the first adhesive layer.

In some embodiments, the at least one tapered sidewall (e.g., inner sidewalls 294a-i-294d-i, outer sidewalls 294a-o-294d-o) may include a first innermost tapered sidewall (e.g., first inner sidewall 294a-i) proximate to a first outermost sidewall of the fan-out package 900, in which the first innermost tapered sidewall may be tapered outward from the fan-out package 900 in a direction towards the package substrate 200.

In some embodiments, the at least one tapered sidewall (e.g., inner sidewalls 294a-i-294d-i, outer sidewalls 294a-o-294d-o) may include a first outermost tapered sidewall (e.g., first outer sidewall 294a-o) proximate to the first innermost tapered sidewall (e.g., first inner sidewall 294a-i), in which the first outermost tapered sidewall may be tapered inwards towards the fan-out package 900 in a direction towards the package substrate 200.

In some embodiments, the at least one tapered sidewall (e.g., inner sidewalls 294a-i-294d-i, outer sidewalls 294a-o-294d-o) may include a second innermost tapered sidewall (e.g., second inner sidewall 294b-i) proximate to a second outermost sidewall of the fan-out package 900, in which the second innermost tapered sidewall is tapered outward from the fan-out package 900 in a direction towards the package substrate 200, and in which the second innermost tapered sidewall may be a distal sidewall from the first innermost tapered sidewall (e.g., first inner sidewall 294a-i) such that the fan-out package 900 may be positioned between the first innermost tapered sidewall and the second innermost tapered sidewall.

In some embodiments, the at least one tapered sidewall (e.g., inner sidewalls 294a-i-294d-i, outer sidewalls 294a-o-294d-o) may include a second outermost tapered sidewall (e.g., second outer sidewall 294b-o) proximate to the second innermost tapered sidewall (e.g., second inner sidewall 294b-i), in which the second outermost tapered sidewall is tapered inwards towards the fan-out package 900 in a direction towards the package substrate 200.

In some embodiments, the beveled stiffener structure (e.g., 294, 1900, 2500, 2600, 2700, 3100, 3200, 3300, 3400, 3500, 3600) may include a third innermost sidewall (e.g., third inner sidewall 294c-i) connected to the first innermost tapered sidewall (e.g., first inner sidewall 294a-i) and the second innermost tapered sidewall (e.g., 294b-i), in which a top portion (e.g., top portion 294top) of the third innermost sidewall and a bottom portion (e.g., bottom portion 294bot) of the third innermost sidewall may be equidistant to a proximate sidewall of the fan-out package 900. In some embodiments, beveled stiffener structure (e.g., 294, 1900, 2500, 2600, 2700, 3100, 3200, 3300, 3400, 3500, 3600) may include a fourth innermost sidewall (e.g., fourth inner sidewall 294d-i) connected to the first innermost tapered sidewall (e.g., first inner sidewall 294a-i) and the second innermost tapered sidewall (e.g., 294b-i) and distal from the third innermost sidewall (e.g., third inner sidewall 294c-i), in which a top portion (e.g., top portion 294top) of fourth innermost sidewall and a bottom portion (e.g., bottom portion 294bot) of the fourth innermost sidewall may be equidistant to a proximate sidewall of the fan-out package 900.

In some embodiments, the chip package structure may further include a thermal interface material (e.g., TIM 500) deposited on a top surface of the fan-out package 900, in which the top portion (e.g., top portion 294top) of the beveled stiffener structure (e.g., 294, 1900, 2500, 2600, 2700, 3100, 3200, 3300, 3400, 3500, 3600) may include a lid portion 294L positioned above and in contact with the thermal interface material.

In some embodiments, the chip package structure may further include an underfill material portion (e.g., second underfill material portion 292) positioned between the fan-out package 900 and the package substrate 200, in which an outermost portion of the underfill material portion may be positioned vertically below a portion of the top portion (e.g., top portion 294top) of the beveled stiffener structure (e.g., 294, 1900, 2500, 2600, 2700, 3100, 3200, 3300, 3400, 3500, 3600).

In some embodiments, the chip package structure may further include at least one surface-mount device (SMD) 120, in which an outermost portion of the at least one SMD 120 may be positioned vertically below a portion of the top portion (e.g., top portion 294top) of the beveled stiffener structure (e.g., 294, 1900, 2500, 2600, 2700, 3100, 3200, 3300, 3400, 3500, 3600).

In some embodiments, the beveled stiffener structure (e.g., 294, 1900, 2500, 2600, 2700, 3100, 3200, 3300, 3400, 3500) may be a rectangular beveled stiffener ring structure having four connected wall portions including the at least one tapered sidewall (e.g., inner sidewalls 294a-i-294d-i, outer sidewalls 294a-o-294d-o).

In some embodiments, the beveled stiffener structure (e.g., 294, 1900, 2500, 2600, 2700, 3100, 3200, 3300, 3400, 3500, 3600) may further include a second adhesive layer 296-2 attached to a top surface of the bottom portion (e.g., bottom portion 294bot) of the beveled stiffener structure, in which a bottom surface of the top portion (e.g., top portion 294top) of the beveled stiffener structure may be in contact with the second adhesive layer.

In some embodiments, the first width W1 may be in range of 2 to 25 millimeters and the second width W2 may be in a range of 1.5 to 25 millimeters.

According to another aspect of the present disclosure, a stiffener structure (e.g., 294, 1900, 2500, 2600, 2700, 3100, 3400, 3500, 3600) for attaching to a top surface of a package substrate 200 is provided, which may include: a first wall portion (e.g., 294a) comprising a first sidewall (294a-i, 294a-o) including a top edge and a bottom edge, wherein a top edge of the first sidewall (e.g., 294a) is a first horizontal distance D1 away from the bottom edge of the first sidewall.

In one embodiment, the first horizontal distance D1 is less than or equal to 10 millimeters. In one embodiment, the first sidewall (e.g., 294a) is a first inner sidewall (294a-i) and the first horizontal distance D1 is in a range greater than 0 millimeters and less than or equal to 10 millimeters, and the first wall portion (e.g., 294a) further comprises a first outer sidewall (294a-o), wherein a top edge of the first outer sidewall (294a-o) is a second horizontal distance D2 away from a bottom edge of the first outer sidewall (294a-o) and wherein the second horizontal distance D2 is less than or equal to millimeters.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a chip package structure, comprising:
   forming a package substrate;
   forming a fan-out package on top of the package substrate;
   forming a stiffener structure including a first wall portion, a second wall portion, a third wall portion, and a fourth wall portion;
   beveling the stiffener structure to have at least one tapered sidewall along at least one of the first wall portion, the second wall portion, the third wall portion, and the fourth wall portion, to form a beveled stiffener structure, wherein the at least one tapered sidewall has a first taper angle of at least one innermost sidewall of the at least one tapered sidewall and a second taper angle of at least one outermost sidewall of the at least one tapered sidewall with respect to a horizontal plane;
   forming an adhesive layer attached to a top surface of the package substrate; and
   attaching a bottom surface of the beveled stiffener structure to a top surface of the adhesive layer.

2. The method of claim 1, wherein a first width of a top portion of the beveled stiffener structure along the at least one tapered sidewall is greater than a second width of a bottom portion of the beveled stiffener structure along the at least one tapered sidewall.

3. The method of claim 1, wherein beveling the stiffener structure comprises:
   beveling the first wall portion to form a first innermost tapered sidewall of the at least one tapered sidewall.

4. The method claim 3, wherein beveling the stiffener structure further comprises:
   beveling the first wall portion to form a first outermost tapered sidewall of the at least one tapered sidewall.

5. The method of claim 3, wherein beveling the stiffener structure further comprises:
   beveling the second wall portion to form a second innermost tapered sidewall of the at least one tapered sidewall.

6. The method of claim 3, wherein beveling the stiffener structure further comprises:
   beveling the second wall portion to form a second outermost tapered sidewall of the at least one tapered sidewall.

7. A method for forming a stiffener structure for attaching to a top surface of a package structure, comprising:
   forming a stiffener structure including a first wall portion, a second wall portion, a third wall portion, and a fourth wall portion; and
   beveling the stiffener structure to have at least one tapered sidewall along at least one of the first wall portion, the second wall portion, the third wall portion, and the fourth wall portion, to form a beveled stiffener structure, wherein the at least one tapered sidewall has a first taper angle of at least one innermost sidewall of the at least one tapered sidewall and a second taper angle of at least one outermost sidewall of the at least one tapered sidewall with respect to a horizontal plane.

8. The method of claim 7, wherein a first width of a top portion of the beveled stiffener structure along the at least one tapered sidewall is greater than a second width of a bottom portion of the beveled stiffener structure along the at least one tapered sidewall.

9. The method of claim 7, wherein beveling the stiffener structure comprises:
beveling the first wall portion to form a first innermost tapered sidewall of the at least one tapered sidewall.

10. The method claim 9, wherein beveling the stiffener structure further comprises:
beveling the first wall portion to form a first outermost tapered sidewall of the at least one tapered sidewall.

11. The method of claim 9, wherein beveling the stiffener structure further comprises:
beveling the second wall portion to form a second innermost tapered sidewall of the at least one tapered sidewall.

12. The method of claim 9, wherein beveling the stiffener structure further comprises:
beveling the second wall portion to form a second outermost tapered sidewall of the at least one tapered sidewall.

13. A method of forming a package structure, comprising:
forming a beveled stiffener structure with at least one tapered sidewall along at least one of a first wall portion, a second wall portion, a third wall portion, and a fourth wall portion, wherein the at least one tapered sidewall has a first taper angle of at least one innermost sidewall of the at least one tapered sidewall and a second taper angle of at least one outermost sidewall of the at least one tapered sidewall with respect to a horizontal plane; and
attaching a bottom surface of the beveled stiffener structure to a top surface of a package substrate by an adhesive layer.

14. The method of claim 13, wherein a first width of a top portion of the beveled stiffener structure along the at least one tapered sidewall is greater than a second width of a bottom portion of the beveled stiffener structure along the at least one tapered sidewall.

15. The method of claim 13, wherein beveling the stiffener structure comprises:
beveling the first wall portion to form a first innermost tapered sidewall of the at least one tapered sidewall.

16. The method claim 15, wherein beveling the stiffener structure further comprises:
beveling the first wall portion to form a first outermost tapered sidewall of the at least one tapered sidewall.

17. The method of claim 15, wherein beveling the stiffener structure further comprises:
beveling the second wall portion to form a second innermost tapered sidewall of the at least one tapered sidewall.

18. The method of claim 15, wherein beveling the stiffener structure further comprises:
beveling the second wall portion to form a second outermost tapered sidewall of the at least one tapered sidewall.

19. The method of claim 13, further comprising applying the adhesive layer on the top surface of the package substrate.

20. The method of claim 13, further comprising attaching a fan-out package on top of a package substrate.

* * * * *